(12) United States Patent
Arayama et al.

(10) Patent No.: US 11,467,491 B2
(45) Date of Patent: Oct. 11, 2022

(54) NEAR-INFRARED ABSORBING PHOTOSENSITIVE COMPOSITION, CURED FILM, OPTICAL FILTER, METHOD FOR FORMING PATTERN, LAMINATE, SOLID-STATE IMAGING ELEMENT, IMAGE DISPLAY DEVICE, AND INFRARED SENSOR

(71) Applicant: FUJIFILM Corporation, Tokyo (JP)

(72) Inventors: Kyohei Arayama, Haibara-gun (JP); Tokihiko Matsumura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/182,474

(22) Filed: Feb. 23, 2021

(65) Prior Publication Data
US 2021/0173304 A1   Jun. 10, 2021

Related U.S. Application Data

(63) Continuation of application No. PCT/JP2019/035552, filed on Sep. 10, 2019.

(30) Foreign Application Priority Data

Sep. 14, 2018  (JP) .............................. JP2018-172358
Feb. 20, 2019  (JP) .............................. JP2019-027998

(51) Int. Cl.
| | |
|---|---|
| G03F 7/028 | (2006.01) |
| G02B 5/20 | (2006.01) |
| G02B 5/22 | (2006.01) |
| G02B 13/14 | (2006.01) |
| G03F 7/09 | (2006.01) |
| G02B 1/04 | (2006.01) |
| G03F 7/004 | (2006.01) |

(52) U.S. Cl.
CPC ............. *G03F 7/028* (2013.01); *G02B 1/041* (2013.01); *G02B 5/208* (2013.01); *G02B 5/223* (2013.01); *G02B 13/14* (2013.01); *G03F 7/0048* (2013.01); *G03F 7/091* (2013.01)

(58) Field of Classification Search
CPC .......... G02B 5/22; G02B 5/223; G02B 5/208
See application file for complete search history.

(56) References Cited

U.S. PATENT DOCUMENTS

| | | | |
|---|---|---|---|
| 2018/0120485 A1 | 5/2018 | Oota et al. | |
| 2018/0259849 A1* | 9/2018 | Hirai | H01L 27/14623 |
| 2019/0018174 A1 | 1/2019 | Ito et al. | |
| 2019/0196073 A1 | 6/2019 | Samejima et al. | |
| 2021/0102010 A1* | 4/2021 | Matsumura | H01L 27/14627 |

FOREIGN PATENT DOCUMENTS

| | | | |
|---|---|---|---|
| JP | 2016-74649 A | 5/2016 | |
| JP | 2016-166320 A | 9/2016 | |
| JP | 2317-67863 A | 4/2017 | |
| JP | 2017067863 A * | 4/2017 | |
| JP | 2017-149896 A | 8/2017 | |
| JP | 2018-41047 A | 3/2018 | |
| WO | WO 2016/186050 A1 | 11/2016 | |
| WO | WO 2017/104283 A1 | 6/2017 | |
| WO | WO-2017104283 A1 * | 6/2017 | ........... C07D 333/22 |

(Continued)

OTHER PUBLICATIONS

English Machine Translation of JP2017067863A (Year: 2017).*
International Preliminary Report on Patentability and Written Opinion of the International Searching Authority (Forms PCT/IB/326, PCT/IB/373 and PCT/ISA/237) for corresponding International Application No. PCT/JP2019/035552, dated Mar. 25, 2021, with English translation.
International Search Report (Form PCTASA/210) for corresponding International Application No. PCT/JP2019/035552, dated Dec. 17, 2019, with English translation.
Japanese Office Action for corresponding Japanese Application No. 2020-546034, dated Nov. 2, 2021, with English translation.

*Primary Examiner* — Peter L Vajda
*Assistant Examiner* — Nicholas E Brown
(74) *Attorney, Agent, or Firm* — Birch, Stewart, Kolasch & Birch, LLP

(57) ABSTRACT

Provided are a near-infrared absorbing photosensitive composition including at least one oxocarbon compound selected from a compound represented by Formula (SQ1) or a compound represented by Formula (CR1), a polymerizable compound, a photopolymerization initiator, and a solvent; a cured film formed of the near-infrared absorbing photosensitive composition; an optical filter; a method for forming a pattern; a laminate; a solid-state imaging element; an image display device; and an infrared sensor. In Formula (SQ1), $Rs^1$ and $Rs^2$ each independently represent a monovalent organic group. In Formula (CR1), $Rc^1$ and $Rc^2$ each independently represent a monovalent organic group.

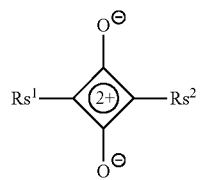

(SQ1)

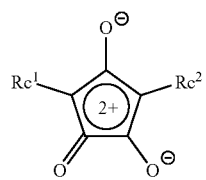

(CR1)

14 Claims, 1 Drawing Sheet

(56) References Cited

FOREIGN PATENT DOCUMENTS

| WO | WO 2017/159479 A1 | 9/2017 |
| WO | WO 2018/043185 A | 3/2018 |

\* cited by examiner

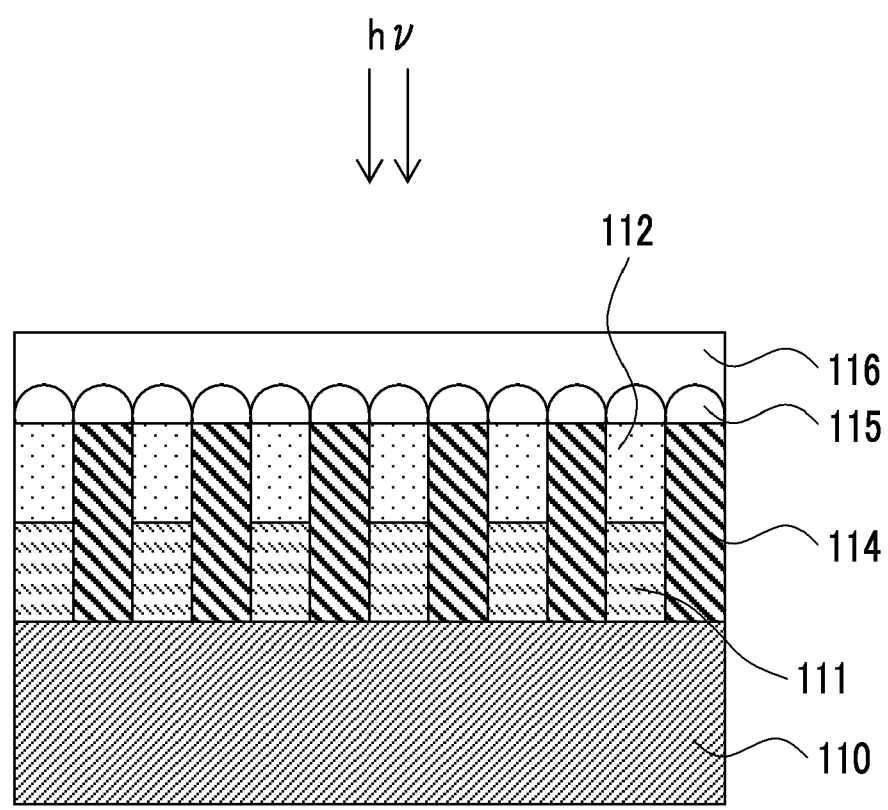

NEAR-INFRARED ABSORBING PHOTOSENSITIVE COMPOSITION, CURED FILM, OPTICAL FILTER, METHOD FOR FORMING PATTERN, LAMINATE, SOLID-STATE IMAGING ELEMENT, IMAGE DISPLAY DEVICE, AND INFRARED SENSOR

CROSS-REFERENCE TO RELATED APPLICATIONS

This application is a Continuation of PCT International Application No. PCT/JP2019/035552 filed on Sep. 10, 2019, which claims priority under 35 U.S.C § 119(a) to Japanese Patent Application No. 2018-172358 filed on Sep. 14, 2018 and Japanese Patent Application No. 2019-027998 filed on Feb. 20, 2019. Each of the above application(s) is hereby expressly incorporated by reference, in its entirety, into the present application.

BACKGROUND OF THE INVENTION

1. Field of the Invention

The present invention relates to a near-infrared absorbing photosensitive composition including an oxocarbon compound. The present invention also relates to a cured film formed of the near-infrared absorbing photosensitive composition including an oxocarbon compound, an optical filter, a method for forming a pattern, a laminate, a solid-state imaging element, an image display device, and an infrared sensor.

2. Description of the Related Art

A charge coupled device (CCD) or a complementary metal-oxide semiconductor (CMOS), which are solid-state imaging elements of color images, has been used in video cameras, digital still cameras, mobile phones with camera function, and the like. Since silicon photodiodes having sensitivity to infrared light are used in a light receiving portion of these solid-state imaging elements, it is necessary to correct visual sensitivity and a near-infrared cut filter is often used for that purpose.

For example, WO2016/186050A, JP2016-074649A, and JP2018-041047A disclose manufacturing a near-infrared cut filter and the like using a near-infrared absorbing composition including a squarylium compound or a croconium compound.

SUMMARY OF THE INVENTION

In recent years, it has been studied to form a pattern by a photolithography method using a near-infrared absorbing composition. As described above, in recent years, development of a near-infrared absorbing composition suitable for the photolithography method has been desired.

Therefore, an object of the present invention is to provide a novel near-infrared absorbing photosensitive composition capable of forming a pattern by a photolithography method. Another object of the present invention is to provide a cured film, an optical filter, a method for forming a pattern, a laminate, a solid-state imaging element, an image display device, and an infrared sensor.

The present invention provides the following.

<1> A near-infrared absorbing photosensitive composition comprising:

at least one oxocarbon compound selected from a compound represented by Formula (SQ1) or a compound represented by Formula (CR1);

a polymerizable compound;

a photopolymerization initiator; and a solvent,

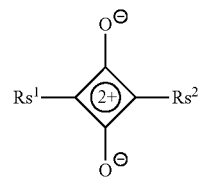
(SQ1)

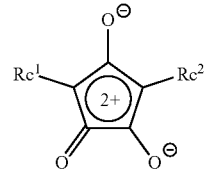
(CR1)

in Formula (SQ1), $Rs^1$ and $Rs^2$ each independently represent a monovalent organic group, and in Formula (CR1), $Rc^1$ and $Rc^2$ each independently represent a monovalent organic group.

<2> The near-infrared absorbing photosensitive composition according to <1>, in which at least one of $Rs^1$ or $Rs^2$ in Formula (SQ1) is a group represented by Formula (1), and at least one of $Rc^1$ or $Rc^2$ in Formula (CR1) is a group represented by Formula (1),

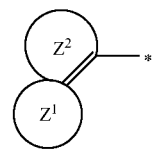
(1)

in Formula (1), a ring $Z^1$ represents an aromatic heterocyclic ring or a fused ring including an aromatic heterocyclic ring, which may have one or a plurality of substituents, a ring $Z^2$ represents a 4-membered to 9-membered hydrocarbon ring or heterocyclic ring, which may have one or a plurality of substituents, in a case where the ring $Z^1$ and the ring $Z^2$ have a plurality of substituents, the plurality of substituents may be the same or different from each other, and

* represents a bonding hand.

<3> The near-infrared absorbing photosensitive composition according to <1>, in which the compound represented by Formula (SQ1) is a compound represented by Formula (SQ2) or Formula (SQ3),

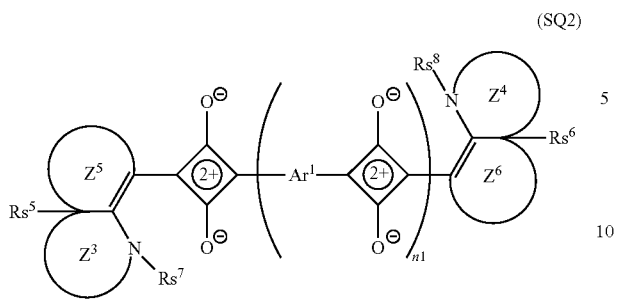

(SQ2)

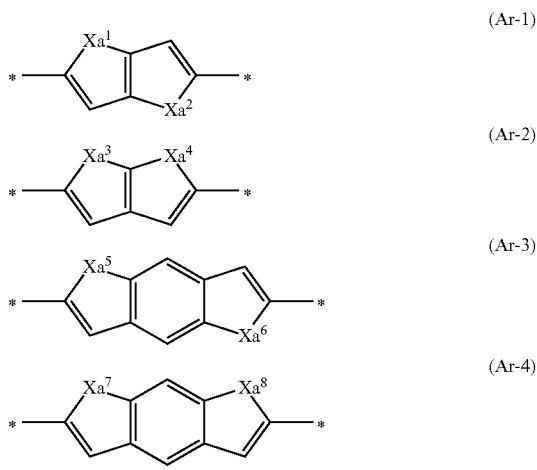

(Ar-1)

(Ar-2)

(Ar-3)

(Ar-4)

in Formula (SQ2), a ring $Z^3$ and a ring $Z^4$ each independently represent a polycyclic aromatic ring having a 5-membered or 6-membered nitrogen-containing heterocyclic ring, which may have one or a plurality of substituents, a ring $Z^5$ and a ring $Z^6$ each independently represent a 4-membered to 9-membered hydrocarbon ring or heterocyclic ring, which may have one or a plurality of substituents, in a case where the ring $Z^3$ to the ring $Z^6$ have a plurality of substituents, the plurality of substituents may be the same or different from each other, in the formulae, $Xa^1$ to $Xa^8$ each independently represent a sulfur atom, an oxygen atom, or $NRx^a$, in which $Rx^a$ represents a hydrogen atom or a substituent, and * represents a bonding hand.

<4> The near-infrared absorbing photosensitive composition according to <1>, in which the compound represented by Formula (SQ1) is a compound represented by Formula (SQ4),

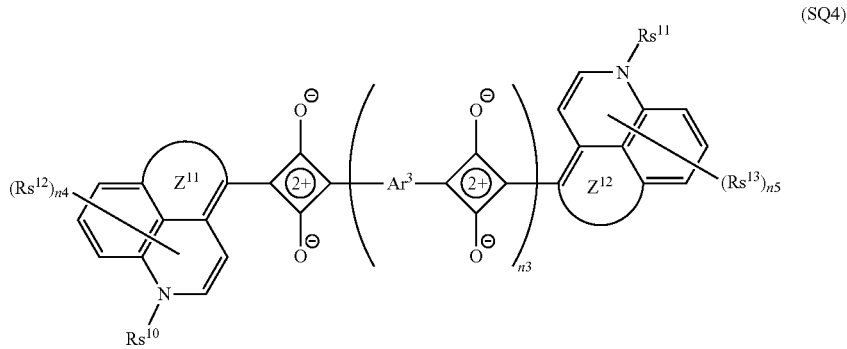

$Rs^5$ to $Rs^8$ each independently represent a hydrogen atom or a substituent, $Ar^1$ represents a group represented by any one of Formulae (Ar-1) to (Ar-4), and n1 represents an integer of 0 to 2; and in Formula (SQ3), a ring $Z^7$ and a ring $Z^8$ each independently represent a polycyclic aromatic ring having a 5-membered or 6-membered nitrogen-containing heterocyclic ring, which may have one or a plurality of substituents, a ring $Z^9$ and a ring $Z^{10}$ each independently represent a 4-membered to 9-membered nitrogen-containing heterocyclic ring, which may have one or a plurality of substituents, in a case where the ring $Z^7$ to the ring $Z^{10}$ have a plurality of substituents, the plurality of substituents may be the same or different from each other, $Ar^2$ represents a group represented by any one of Formulae (Ar-1) to (Ar-4), and n2 represents an integer of 0 to 2, in Formula (SQ4), a ring $Z^{11}$ and a ring $Z^{12}$ each independently represent a 4-membered to 9-membered hydrocarbon ring or heterocyclic ring, which may have one or a plurality of substituents, in a case where the ring $Z^{11}$ and the ring $Z^{12}$ have a plurality of substituents, the plurality of substituents may be the same or different from each other, $Rs^{10}$ and $Rs^{11}$ each independently represent a hydrogen atom or a substituent, $Rs^{12}$ and $Rs^{13}$ each independently represent a substituent, $Rs^{10}$ and $Rs^{12}$, or $Rs^{11}$ and $Rs^{13}$ may be bonded to each other to form a 5-membered ring or a 6-membered ring, n3 represents an integer of 0 to 2, n4 and n5 each independently represent an integer of 0 to 5, in a case where n4 is 2 or more, a plurality of $Rs^{12}$'s may be the same or different from each other, and two $Rs^{12}$'s of the plurality of $Rs^{12}$'s may be bonded to each other to form a ring, in a case where n5 is 2 or more, a plurality of $Rs^{13}$'s may be the same or different from each other, and two $Rs^{13}$'s of the plurality of $Rs^{13}$'s may be bonded to each other to form a ring, and $Ar^3$ represents a group represented by any one of Formulae (Ar-1) to (Ar-4),

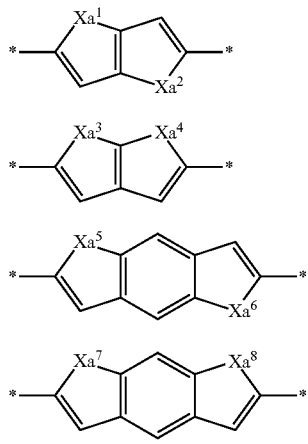

in the formulae, $Xa^1$ to $Xa^8$ each independently represent a sulfur atom, an oxygen atom, or $NRx^a$, in which $Rx^a$ represents a hydrogen atom or a substituent, and * represents a bonding hand.

<5> The near-infrared absorbing photosensitive composition according to <1>, in which at least one of $Rs^1$ or $Rs^2$ in Formula (SQ1) is a group represented by Formula (10), and at least one of $Rc^1$ or $Rc^2$ in Formula (CR1) is a group represented by Formula (10),

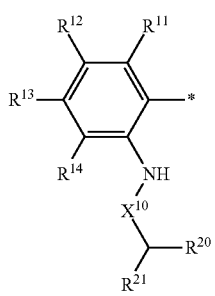

in the formula, $R^{11}$ to $R^{14}$ each independently represent a hydrogen atom or a substituent, and two adjacent groups of $R^{11}$ to $R^{14}$ may be bonded to each other to form a ring, $R^{20}$ represents an aryl group or a heteroaryl group, $R^{21}$ represents a substituent, and $X^{10}$ represents CO or $SO_2$.

<6> The near-infrared absorbing photosensitive composition according to <1>, in which the compound represented by Formula (SQ1) is a compound represented by Formula (SQ5),

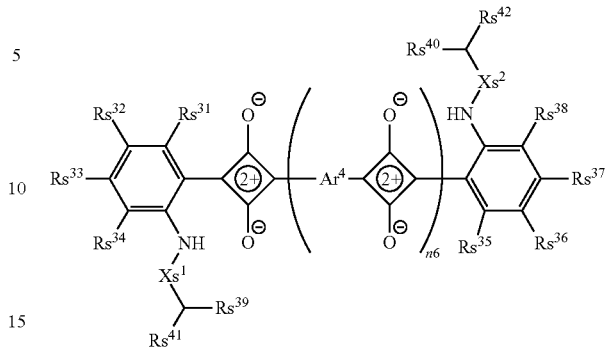

in Formula (SQ5), $Rs^{31}$ to $Rs^{38}$ each independently represent a hydrogen atom or a substituent, and two adjacent groups of $Rs^{31}$ to $Rs^{38}$ may be bonded to each other to form a ring, $Rs^{39}$ and $Rs^{40}$ each independently represent an aryl group or a heteroaryl group, $Rs^{41}$ and $Rs^{42}$ each independently represent a substituent, and $Rs^{41}$ and $Rs^{42}$ may be linked to each other through a single bond or a linking group, $Xs^1$ and $Xs^2$ each independently represent CO or $SO_2$, $Ar^4$ represents a group represented by any one of Formulae (Ar-1) to (Ar-4), and n6 represents an integer of 0 to 2,

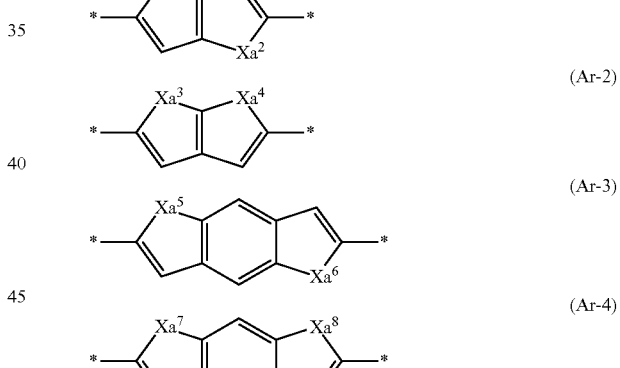

in the formulae, $Xa^1$ to $Xa^8$ each independently represent a sulfur atom, an oxygen atom, or $NRx^a$, in which $Rx^a$ represents a hydrogen atom or a substituent, and * represents a bonding hand.

<7> The near-infrared absorbing photosensitive composition according to any one of <1> to <6>, further comprising:

a resin.

<8> The near-infrared absorbing photosensitive composition according to <7>, in which the resin includes a resin having an acid group.

<9> The near-infrared absorbing photosensitive composition according to <8>, in which the near-infrared absorbing composition includes 10 to 1000 parts by mass of the resin having an acid group with respect to 100 parts by mass of the polymerizable compound.

<10> The near-infrared absorbing photosensitive composition according to any one of <1> to <9>, further comprising:
a pigment derivative.
<11> A cured film obtained from the near-infrared absorbing photosensitive composition according to any one of <1> to <10>.
<12> An optical filter comprising:
the cured film according to <11>.
<13> The optical filter according to <12>,
in which the optical filter is a near-infrared cut filter or a near-infrared transmitting filter.
<14> A method for forming a pattern, comprising:
a step of forming a composition layer on a support using the near-infrared absorbing photosensitive composition according to any one of <1> to <10>;
a step of patternwise exposing the composition layer; and
a step of removing an unexposed area of the composition layer by development.
<15> A laminate comprising:
the cured film according to <11>; and
a color filter including a chromatic colorant.
<16> A solid-state imaging element comprising:
the cured film according to <11>.
<17> An image display device comprising:
the cured film according to <11>.
<18> An infrared sensor comprising:
the cured film according to <11>.

According to the present invention, it is possible to provide a novel near-infrared absorbing photosensitive composition capable of forming a pattern by a photolithography method. In addition, it is possible to provide a cured film, an optical filter, a method for forming a pattern, a laminate, a solid-state imaging element, an image display device, and an infrared sensor.

BRIEF DESCRIPTION OF THE DRAWINGS

FIG. 1 is a schematic diagram indicating an embodiment of an infrared sensor.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, a weight-average molecular weight and a number-average molecular weight are defined as values in terms of polystyrene measured by gel permeation chromatography (GPC).

In the present specification, the weight-average molecular weight (Mw) and the number-average molecular weight (Mn) can be obtained, for example, by using HLC-8220 GPC (manufactured by Tosoh Corporation), using, as a column, a column connecting TOSOH TSKgel Super HZM-H, TOSOH TSKgel Super HZ4000, and TOSOH TSKgel Super HZ2000, and using tetrahydrofuran as a developing solvent.

In the present specification, in a chemical formula, Me represents a methyl group, Et represents an ethyl group, Bu represents a butyl group, and Ph represents a phenyl group.

In the present specification, near infrared light denotes light (electromagnetic wave) having a wavelength in a range of 700 to 2500 nm.

In the present specification, a total solid content denotes the total mass of all the components of the composition excluding a solvent.

In the present specification, the term "step" denotes not only an individual step but also a step which is not clearly distinguishable from another step as long as an effect expected from the step can be achieved.

<Near-Infrared Absorbing Photosensitive Composition (Photosensitive Composition)>

A near-infrared absorbing photosensitive composition according to an embodiment of the present invention includes at least one oxocarbon compound selected from a compound represented by Formula (SQ1) described later or a compound represented by Formula (CR1) described later, a polymerizable compound, a photopolymerization initiator, and a solvent. Hereinafter, the "compound represented by Formula (SQ1)" is also referred to as a "compound (SQ1)". In addition, the "compound represented by Formula (CR1)" is also referred to as a "compound (CR1)". In addition, the compound (SQ1) and the compound (CR1) are collectively referred to as an oxocarbon compound A. In addition, the "near-infrared absorbing photosensitive composition" also referred to as a "photosensitive composition".

The photosensitive composition according to the embodiment of the present invention has excellent pattern formability in a photolithography method. By using the photosensitive composition according to the embodiment of the present invention, it is possible to form a pattern of a cured film, which can selectively transmit or shield light having a predetermined wavelength, (for example, a pattern of a cured film, which selectively shields near infrared rays having a predetermined wavelength, or a pattern of a cured film, which selectively transmits infrared rays having a predetermined wavelength).

Examples of preferred aspects of the photosensitive composition according to the embodiment of the present invention include the following first aspect and second aspect.

(First Aspect)

An aspect in which at least one of $Rs^1$ or $Rs^2$ in Formula (SQ1) described later is a group represented by Formula (1) described later, and at least one of $Rc^1$ or $Rc^2$ in Formula (CR1) described later is a group represented by Formula (1) described later.

(Second Aspect)

An aspect in which at least one of $Rs^1$ or $Rs^2$ in Formula (SQ1) described later is a group represented by Formula (10)

described later, and at least one of $Rc^1$ or $Rc^2$ in Formula (CR1) described later is a group represented by Formula (10).

According to the first aspect, moisture resistance of the obtained cured film can also be further improved. The mechanism for obtaining such an effect is assumed as follows. Since the compound (SQ1) or the compound (CR1) has a group represented by Formula (1) described later, it is assumed that steric hindrance increases at a vicinity of a partial structure represented by Formula (SQ-a) in the compound (SQ1), or at a vicinity of a partial structure represented by Formula (CR-a) in the compound (CR1). Furthermore, it is assumed that the vicinity of these partial structures are hydrophobic. As a result, it is assumed that these compounds are less likely to be hydrolyzed and excellent moisture resistance is obtained.

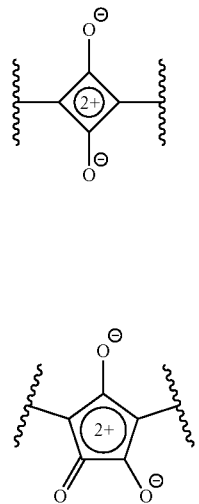

(SQ-a)

(CR-a)

In addition, according to the second aspect, light resistance of the obtained cured film can also be further improved. The mechanism for obtaining such an effect is assumed as follows. Since the compound (SQ1) or the compound (CR1) has a group represented by Formula (10) described later, it is assumed that the compound (SQ1) or the compound (CR1) has a structure in which the group represented by Formula (10) is projected to a plane of coloring agent (a site of Formula (SQ-a) in the compound (SQ1) or a site of Formula (CR-a) in the compound (CR1)). Therefore, in a case of film formation, it is assumed that these compounds tend to be displaced and overlapped with each other so as to avoid steric hindrance and the J-association of these in the film is easily formed. Furthermore, it is assumed that the J-association sequence thereof is stabilized. As a result, it is assumed that excellent light resistance is obtained.

Hereinafter, respective components of the photosensitive composition according to the embodiment of the present invention will be described.

<<Oxocarbon Compound A>>

The photosensitive composition according to the embodiment of the present invention include at least one oxocarbon compound (oxocarbon compound A) selected from a compound (compound (SQ1)) represented by Formula (SQ1) or a compound (compound (CR1)) represented by Formula (CR1). This oxocarbon compound A is preferably used as a near-infrared absorber.

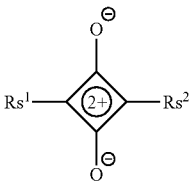

(SQ1)

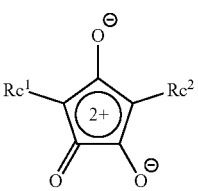

(CR1)

In Formula (SQ1), $Rs^1$ and $Rs^2$ each independently represent a monovalent organic group; and in Formula (CR1), $Rc^1$ and $Rc^2$ each independently represent a monovalent organic group.

The oxocarbon compound A is preferably a compound having a maximum absorption wavelength in a wavelength range of 600 to 1300 nm in a chloroform solution, more preferably a compound having the maximum absorption wavelength in a wavelength range of 650 to 1200 nm, and still more preferably a compound having the maximum absorption wavelength in a wavelength range of 700 to 1100 nm. The maximum absorption wavelength of the oxocarbon compound A in a chloroform solution can be obtained by preparing a chloroform solution of the oxocarbon compound A and measuring the absorbance of this chloroform solution.

As shown below, cations in Formula (SQ1) are present without being localized.

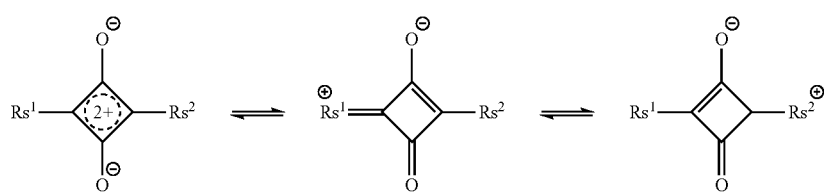

In addition, cations in Formula (CR1) are present without being localized as shown below.

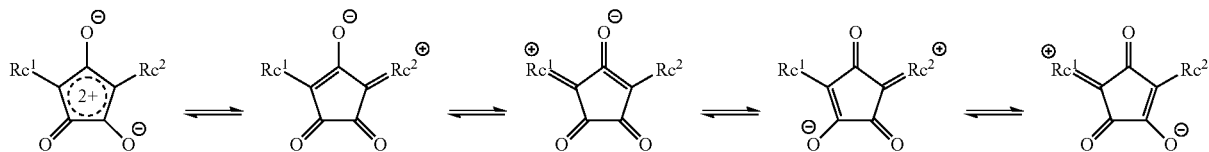

(Compound (SQ1))

First, the compound (SQ1) (compound represented by Formula (SQ1)) will be described.

In Formula (SQ1), $Rs^1$ and $Rs^2$ each independently represent a monovalent organic group. Examples of the monovalent organic group represented by $Rs^1$ and $Rs^2$ include an aryl group, a heteroaryl group, a group represented by Formula (R1), a group represented by Formula (1), and a group represented by Formula (10).

In Formula (SQ1), it is preferable that at least one of $Rs^1$ or $Rs^2$ is a group represented by Formula (1), or at least one of $Rs^1$ or $Rs^2$ is a group represented by Formula (10).

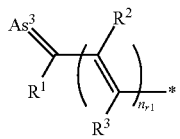
(R1)

In Formula (R1), $R^1$ to $R^3$ each independently represent a hydrogen atom or a substituent, $As^3$ represents a heteroaryl group, $n_{r1}$ represents an integer of 0 or more, $R^1$ and $R^2$ may be bonded to each other to form a ring, $R^1$ and $As^3$ may be bonded to each other to form a ring, $R^2$ and $R^3$ may be bonded to each other to form a ring, in which in a case where $n_{r1}$ is 2 or more, a plurality of $R^2$'s and $R^3$'s each may be the same or different from each other, and * represents a bonding hand.

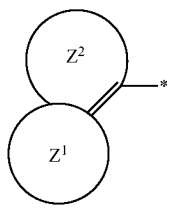
(1)

In Formula (1), a ring $Z^1$ represents an aromatic heterocyclic ring or a fused ring including an aromatic heterocyclic ring, which may have one or a plurality of substituents, a ring $Z^2$ represents a 4-membered to 9-membered hydrocarbon ring or heterocyclic ring, which may have one or a plurality of substituents, in a case where the ring $Z^1$ and the ring $Z^2$ have a plurality of substituents, the plurality of substituents may be the same or different from each other, and * represents a linking hand.

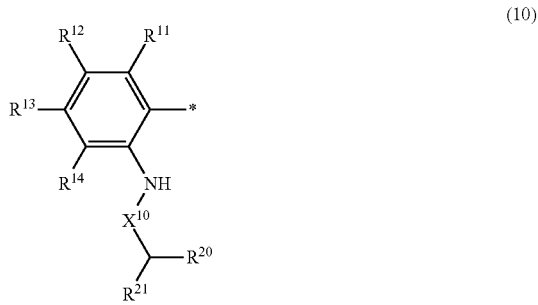
(10)

In Formula (10), $R^{11}$ to $R^{14}$ each independently represent a hydrogen atom or a substituent, and two adjacent groups of $R^{11}$ to $R^{14}$ may be bonded to each other to form a ring; $R^{20}$ represents an aryl group or a heteroaryl group; $R^{21}$ represents a substituent; and $X^{10}$ represents CO or $SO_2$.

The number of carbon atoms in the aryl group represented by $Rs^1$ and $Rs^2$ is preferably 6 to 48, more preferably 6 to 22, and particularly preferably 6 to 12. The number of carbon atoms constituting a ring of the heteroaryl group represented by $Rs^1$ and $Rs^2$ is preferably 1 to 30 and more preferably 1 to 12. Examples of the type of the heteroatom constituting the ring of the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocyclic ring or a fused ring, more preferably a monocyclic ring or a fused ring composed of 2 to 8 rings, and still more preferably a monocyclic ring or a fused ring composed of 2 to 4 rings. Specific examples of the heteroaryl group include an imidazole ring group, an oxazole ring group, a thiazole ring group, an indolenine ring group, a pyridine ring group, a pyrazine ring group, a pyrrole ring group, a furan ring group, a thiophene ring group, a pyrazole ring group, an isoxazole ring group, an isothiazole ring group, a pyridazine ring group, a pyrimidine ring group, a pyrylium ring group, a thiopyrylium ring group, a lepidinium ring group, and a fused ring group including these rings. The aryl group and heteroaryl group represented by $Rs^1$ and $Rs^2$ may have a substituent. Examples of the substituent include the substituent T described later, a solubilizing group described later, an electron-withdrawing group described later, and a group represented by Formula (R-SQ). In Formula (R-SQ), $Rs_{sq}^1$ represents a monovalent organic group. Examples of the monovalent organic group represented by $R_{sq}^1$ include an aryl group, a heteroaryl group, a group represented by Formula (R1), a group represented by Formula (1), and a group represented by Formula (10).

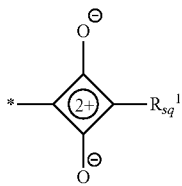

(R-SQ)

[Regarding Group represented by Formula (R1)]

Next, a group represented by Formula (R1) will be described. In Formula (R1), $R^1$ to $R^3$ each independently represent a hydrogen atom or a substituent. Examples of the substituent include the substituent T described later, the solubilizing group described later, and the electron-withdrawing group described later. The substituent represented by $R^1$ to $R^3$ is preferably an alkyl group. The number of carbon atoms in the alkyl group is preferably 1 to 20, more preferably 1 to 15, and still more preferably 1 to 8. The alkyl group may be linear, branched, or cyclic, and is preferably linear or branched. $R^1$ to $R^3$ are preferably hydrogen atoms. In Formula (R1), $As^3$ represents a heteroaryl group. Examples of the heteroaryl group represented by $As^3$ include the heteroaryl groups described in the section of $Rs^1$ and $Rs^2$, and the preferred range is also the same.

In Formula (R1), $R^1$ and $R^2$ may be bonded to each other to form a ring, $R^1$ and $As^3$ may be bonded to each other to form a ring, and $R^2$ and $R^3$ may be bonded to each other to form a ring. As a linking group in a case of forming the above-described ring, —CO—, —O—, —NH—, —CH$_2$—, or a divalent linking group selected from a group consisting of a combination thereof is preferable.

In Formula (R1), $n_{r1}$ represents an integer of 0 or more. $n_{r1}$ is preferably an integer of 0 to 2, more preferably 0 or 1, and still more preferably 0. In Formula (R1), in a case where $n_{r1}$ is 2 or more, a plurality of $R^2$'s and $R^3$'s each may be the same or different from each other.

[Regarding Group represented by Formula (1)]

Next, a group represented by Formula (1) will be described. In Formula (1), the ring $Z^1$ represents an aromatic heterocyclic ring or a fused ring including an aromatic heterocyclic ring, which may have one or a plurality of substituents. Examples of the aromatic heterocyclic ring include an imidazole ring, an oxazole ring, a thiazole ring, an indolenine ring, a pyridine ring, a pyrazine ring, a pyrrole ring, a furan ring, a thiophene ring, a pyrazole ring, an isoxazole ring, an isothiazole ring, a pyridazine ring, a pyrimidine ring, a pyrylium ring, a thiopyrylium ring, and a lepidinium ring. Among these, an imidazole ring, an oxazole ring, a thiazole ring, a pyridine ring, a pyrazine ring, a pyrrole ring, a pyrylium ring, a thiopyrylium ring, or a lepidinium ring is preferable, and an imidazole ring, an oxazole ring, a thiazole ring, a pyridine ring, a pyrazine ring, or a pyrrole ring is more preferable. Examples of the fused ring including an aromatic heterocyclic ring include a fused ring of one or more rings (in a case of two or more rings, the two or more rings may be the same or different from each other) selected from an imidazole ring, an oxazole ring, a thiazole ring, an indolenine ring, a pyridine ring, a pyrazine ring, a pyrrole ring, a furan ring, a thiophene ring, a pyrazole ring, an isoxazole ring, an isothiazole ring, a pyridazine ring, a pyrimidine ring, a pyrylium ring, a thiopyrylium ring, and a lepidinium ring and a ring (preferably a benzene ring or a naphthalene ring) selected from a benzene ring, a naphthalene ring, an anthracene ring, a tetracene ring, a phenanthrene ring, a triphenylene ring, a tetraphene ring, and a pyrene ring; and a fused ring of two or more rings (in a case of two or more rings, the two or more rings may be the same or different from each other) selected from an imidazole ring, an oxazole ring, a thiazole ring, an indolenine ring, a pyridine ring, a pyrazine ring, a pyrrole ring, a furan ring, a thiophene ring, a pyrazole ring, an isoxazole ring, an isothiazole ring, a pyridazine ring, a pyrimidine ring, a pyrylium ring, a thiopyrylium ring, and a lepidinium ring. From the reason that more excellent spectral characteristics are easily obtained, the fused number of the fused ring is preferably 2 to 6 and more preferably 2 to 4.

In Formula (1), the ring $Z^2$ represents a 4-membered to 9-membered hydrocarbon ring or heterocyclic ring, which may have one or a plurality of substituents. The hydrocarbon ring and the heterocyclic ring represented by the ring $Z^2$ is preferably a 5-membered to 7-membered ring and more preferably a 5-membered or 6-membered ring. Specific examples of the hydrocarbon ring includes cycloalkene rings such as a cyclobutene ring, a cyclopentene ring, a cyclopentadiene ring, a cyclohexene ring, a cyclohexadiene ring, a cycloheptene ring, a cycloheptadiene ring, a cycloheptatriene ring, a cyclooctene ring, a cyclooctadiene ring, a cyclooctatriene ring, a cyclononene ring, a cyclononadiene ring, a cyclononatriene ring, and a cyclononatetraene ring. Among these, a cyclopentene ring, a cyclohexene ring, a cycloheptene ring, or a cyclooctene ring is preferable and a cyclopentene ring or a cyclohexene ring is more preferable. The heterocyclic ring represented by the ring $Z^2$ is preferably a nitrogen-containing heterocyclic ring.

Examples of the substituent which may be included in the ring $Z^1$ and the ring $Z^2$ include the substituent T described later and the solubilizing group described later. In addition, it is also preferable that the substituent which may be included in the ring $Z^1$ is an electron-withdrawing group. According to this aspect, more excellent spectral characteristics are easily obtained. A substituent having a positive Hammett's substituent constant σ value (sigma value) acts as an electron-withdrawing group. Here, the substituent constant obtained by Hammett's rule includes a σp value and a σm value. These values can be found in many common books. In the present invention, a substituent having the Hammett's substituent constant σ value of 0.1 or more can be exemplified as the electron-withdrawing group. σ value is preferably 0.15 or more, more preferably 0.2 or more, and still more preferably 0.3 or more. The upper limit is not particularly limited, but is preferably 1.0 or less. Specific examples of the electron-withdrawing group include a halogen atom, an alkyl group in which at least a part of hydrogen atoms is replaced by a halogen atom, an aryl group in which at least a part of hydrogen atoms is replaced by a fluorine atom, a nitro group, a cyano group, a cyanomethyl group, —CH=C(CN)$_2$, —C(CN)=C(CN)$_2$, —P(CN)$_2$, —N=NCN, —CORz, —COORz, —OCORz, —NHCORz, —CONHRz, —SORz, —SO$_2$Rz, —SO$_2$ORz, —NHSO$_2$Rz, and —SO$_2$NHRz. Rz represents an alkyl group in which at least a part of hydrogen atoms is replaced by a fluorine atom, an aryl group in which at least a part of hydrogen atoms is replaced by a fluorine atom, an amino group, a halogen atom, a cyano group, or a cyanomethyl group. Here, the cyanomethyl group includes a monocyanomethyl group (—CH$_2$CN), a dicyanomethyl group (—CH(CN)$_2$), and a tricyanomethyl group (—C(CN)$_3$). The alkyl group in which at least a part of hydrogen atom is replaced by a fluorine atom preferably has 1 to 6 carbon atoms, more preferably has 1 to 5 carbon atoms, and still more preferably has 1 to 4 carbon atoms. The aryl group in which at least a part of hydrogen atoms is replaced by a fluorine atom preferably has 6 to 14 carbon atoms and more preferably has 6 to 10 carbon atoms. In these alkyl groups and aryl groups, all of the hydrogen atoms may be replaced by fluorine atoms, a part of hydrogen atoms may be replaced by a fluorine atom, or these alkyl groups and aryl groups may not be substituted with a fluorine atom.

The group represented by Formula (1) is preferably a group represented by Formula (1-1) or Formula (1-2).

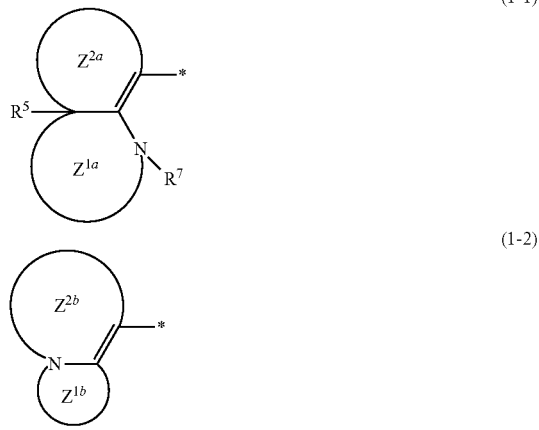

In Formula (1-1), a ring $Z^{1a}$ is a polycyclic aromatic ring having a 5-membered or 6-membered nitrogen-containing heterocyclic ring, which may have one or a plurality of substituents, and a ring $Z^{2a}$ is a 4-membered to 9-membered hydrocarbon ring or heterocyclic ring, which may have one or a plurality of substituents. In a case where the ring $Z^{1a}$ and the ring $Z^{2a}$ have a plurality of substituents, the plurality of substituents may be the same or different from each other. $R^5$ and $R^7$ each independently represent a hydrogen atom or a substituent.

In Formula (1-1), examples of the polycyclic aromatic ring represented by the ring $Z^{1a}$ include a fused ring including a 5-membered or 6-membered nitrogen-containing heterocyclic ring selected from an imidazole ring, an oxazole ring, a thiazole ring, a pyridine ring, a pyrazine ring, a pyrrole ring, a furan ring, a thiophene ring, a pyrazole ring, an isoxazole ring, an isothiazole ring, a pyridazine ring, and a pyrimidine ring. In addition, examples of the polycyclic aromatic ring include a fused ring of one or more rings (in a case of two or more nitrogen-containing heterocyclic rings, the two or more nitrogen-containing heterocyclic rings may be the same or different from each other) selected from the above-described nitrogen-containing heterocyclic ring, and a benzene ring or a naphthalene ring; and a fused ring of two or more rings (in a case of two or more nitrogen-containing heterocyclic rings, the two or more nitrogen-containing heterocyclic rings may be the same or different from each other) selected from the above-described nitrogen-containing heterocyclic ring. From the reason that more excellent spectral characteristics are easily obtained, the number of rings included in the polycyclic aromatic ring (fused number of the fused ring) is preferably 2 to 6 and more preferably 2 to 4.

In Formula (1-1), examples of the 4-membered to 9-membered hydrocarbon ring and heterocyclic ring represented by the ring $Z^{2a}$ include those described in the section of the ring $Z^2$ in Formula (1).

In Formula (1-1), examples of the substituent which may be included in the ring $Z^{1a}$ and the ring $Z^{2a}$, and the substituent represented by $R^5$ and $R^7$ include the substituent T described later and the solubilizing group described later. In addition, it is also preferable that the substituent which may be included in the ring $Z^{1a}$ is an electron-withdrawing group. Examples of the electron-withdrawing group include the above-described groups.

In Formula (1-2), a ring $Z^{1b}$ represents a polycyclic aromatic ring having a 5-membered or 6-membered nitrogen-containing heterocyclic ring, which may have one or a plurality of substituents, a ring $Z^{2b}$ represents a 4-membered to 9-membered nitrogen-containing heterocyclic ring, which may have one or a plurality of substituents, and in a case where the ring $Z^{1a}$ and the ring $Z^{2a}$ have a plurality of substituents, the plurality of substituents may be the same or different from each other.

In Formula (1-2), examples of the polycyclic aromatic ring represented by the ring $Z^{1b}$ include a fused ring including a 5-membered or 6-membered nitrogen-containing heterocyclic ring selected from an imidazole ring, an oxazole ring, a thiazole ring, a pyridine ring, a pyrazine ring, a pyrrole ring, a furan ring, a thiophene ring, a pyrazole ring, an isoxazole ring, an isothiazole ring, a pyridazine ring, and a pyrimidine ring. In addition, examples of the polycyclic aromatic ring include a fused ring of one or more rings (in a case of two or more nitrogen-containing heterocyclic rings, the two or more nitrogen-containing heterocyclic rings may be the same or different from each other) selected from the above-described nitrogen-containing heterocyclic ring, and a benzene ring or a naphthalene ring; and a fused ring of two or more rings (in a case of two or more nitrogen-containing heterocyclic rings, the two or more nitrogen-containing heterocyclic rings may be the same or different from each other) selected from the above-described nitrogen-containing heterocyclic ring. From the reason that more excellent spectral characteristics are easily obtained, the number of rings included in the polycyclic aromatic ring (fused number of the fused ring) is preferably 2 to 6 and more preferably 2 to 4.

In Formula (1-2), the nitrogen-containing heterocyclic ring represented the ring $Z^{2b}$ is preferably a 5-membered to 7-membered ring and more preferably a 5-membered or 6-membered ring.

In Formula (1-2), examples of the substituent which may be included in the ring $Z^{1b}$ and the ring $Z^{2b}$ include the substituent T described later and the solubilizing group described later. In addition, it is also preferable that the substituent which may be included in the ring $Z^{1b}$ is an electron-withdrawing group. Examples of the electron-withdrawing group include the above-described groups.

The group represented by Formula (1) is also preferably a group represented by Formula (1-3). According to this aspect, a cured film having more excellent moisture resistance is easily obtained.

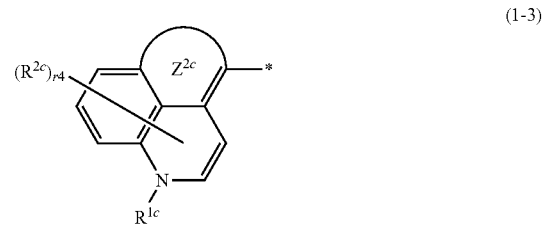

In Formula (1-3), a ring $Z^{2c}$ represents a 4-membered to 9-membered hydrocarbon ring or heterocyclic ring, which may have one or a plurality of substituents, in a case where the ring $Z^{2c}$ has a plurality of substituents, the plurality of substituents may be the same or different from each other, $R^{1c}$ represents a hydrogen atom or a substituent, $R^{2c}$ represents a substituent, $R^{1c}$ and $R^{2c}$ may be bonded to each other to form a 5-membered ring or a 6-membered ring, in a case where r4 is 2 or more, a plurality of $R^{2c}$'s may be the same or different from each other, and two $R^{2c}$'s of the plurality of $R^{2c}$'s may be bonded to each other to form a ring, and r4 represents an integer of 0 to 5.

The ring $Z^{2c}$ in Formula (1-3) is the same as the ring $Z^2$ in Formula (1), and the preferred range is also the same. Examples of the substituent which may be included in the ring $Z^{2c}$ and the substituent represented by $R^{1c}$ include the substituent T described later and the solubilizing group described later. $R^{1c}$ is preferably an alkyl group. Examples of the substituent represented by $R^{2c}$ include the substituent T described later, the solubilizing group described later, and the above-described electron-withdrawing group, and an electron-withdrawing group is preferable. In addition, $R^{2c}$ is preferably an alkyl group, a halogenated alkyl group, an aryl group, or a halogen atom, more preferably an alkyl group, a halogenated alkyl group, or a halogen atom, and still more preferably an alkyl group or a halogenated alkyl group. In Formula (1-3), $R^{1c}$ and $R^{2c}$ may be bonded to each other to form a 5-membered ring or a 6-membered ring. The ring formed by bonding these groups to each other may be a hydrocarbon ring or a heterocyclic ring. In addition, the ring formed by bonding these groups to each other may be a monocyclic ring or a fused ring. In Formula (1-3), r4 represents an integer of 0 to 5, and is preferably 0 to 4, more preferably 0 to 3, still more preferably 0 to 2, and particularly preferably 1 or 2. In addition, in a case where r4 is 2 or more, a plurality of $R^{2c}$'s may be the same or different from each other, and two $R^{2c}$'s of the plurality of $R^{2c}$'s may be bonded to each other to form a ring. The ring formed by bonding $R^{2c}$'s to each other may be a hydrocarbon ring or a heterocyclic ring. In addition, the ring formed by bonding these groups to each other may be a monocyclic ring or a fused ring.

The group represented by Formula (1) is also preferably a group represented by Formula (1-4) or a group represented by Formula (1-5). According to this aspect, a cured film having more excellent moisture resistance is easily obtained.

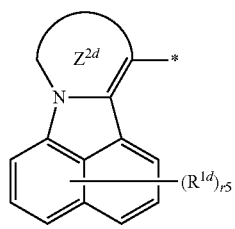

(1-4)

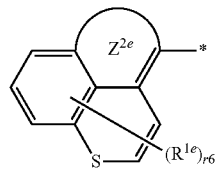

(1-5)

In Formula (1-4), a ring $Z^{2d}$ represents a 4-membered to 9-membered hydrocarbon ring or heterocyclic ring, which may have one or a plurality of substituents, in a case where the ring $Z^{2d}$ has a plurality of substituents, the plurality of substituents may be the same or different from each other, $R^{1d}$ represents a substituent, in a case where r5 is 2 or more, a plurality of $R^{1d}$'s may be the same or different from each other, and two $R^{1d}$'s of the plurality of $R^{1d}$'s may be bonded to each other to form a ring, and r5 represents an integer of 0 to 6.

In Formula (1-5), a ring $Z^{2e}$ represents a 4-membered to 9-membered hydrocarbon ring or heterocyclic ring, which may have one or a plurality of substituents, in a case where the ring $Z^{2e}$ has a plurality of substituents, the plurality of substituents may be the same or different from each other, $R^{1e}$ represents a substituent, in a case where r6 is 2 or more, a plurality of $R^{1e}$'s may be the same or different from each other, and two $R^{1e}$'s of the plurality of $R^{1e}$'s may be bonded to each other to form a ring, and r6 represents an integer of 0 to 5.

The ring $Z^{2d}$ in Formula (1-4) and the ring $Z^{2e}$ in Formula (1-5) are the same as the ring $Z^2$ in Formula (1), and the preferred ranges are also the same.

Examples of the substituent which may be included in the ring $Z^{2d}$, the substituent which may be included in the ring $Z^{2e}$, the substituent represented by $R^{1d}$, and the substituent represented by $R^{1e}$ include the substituent T described later, the solubilizing group described later, and the above-described electron-withdrawing group. In a case where r5 is 1 or more, it is preferable that at least one of the substituents represented by $R^{1d}$ is an electron-withdrawing group. In a case where r6 is 1 or more, it is preferable that at least one of the substituents represented by $R^{1e}$ is an electron-withdrawing group.

In Formula (1-4), r5 represents an integer of 0 to 6, and is preferably 0 to 4, more preferably 0 to 3, still more preferably 0 to 2, and particularly preferably 1 or 2. In addition, in a case where r5 is 2 or more, a plurality of $R^{1d}$'s may be the same or different from each other, and two $R^{1d}$'s of the plurality of $R^{1d}$'s may be bonded to each other to form a ring. The ring formed by bonding $R^{1d}$'s to each other may be a hydrocarbon ring or a heterocyclic ring. In addition, the ring formed by bonding these groups to each other may be a monocyclic ring or a fused ring.

In Formula (1-5), r6 represents an integer of 0 to 5, and is preferably 0 to 4, more preferably 0 to 3, still more preferably 0 to 2, and particularly preferably 1 or 2. In addition, in a case where r6 is 2 or more, a plurality of $R^{1e}$'s may be the same or different from each other, and two $R_{1e}$'s of the plurality of $R^{1e}$'s may be bonded to each other to form a ring. The ring formed by bonding $R^{1e}$'s to each other may be a hydrocarbon ring or a heterocyclic ring. In addition, the ring formed by bonding these groups to each other may be a monocyclic ring or a fused ring.

[Regarding Group Represented by Formula (10)]

Next, a group represented by Formula (10) will be described. In Formula (10), $R^{11}$ to $R^{14}$ each independently represent a hydrogen atom or a substituent, and two adjacent groups of $R^{11}$ to $R^{14}$ may be bonded to each other to form a ring. Examples of the substituent represented by $R^{11}$ to $R^{14}$ include the substituent T and the solubilizing group described later.

In Formula (10), $R^{20}$ represents an aryl group or a heteroaryl group, and an aryl group is preferable. The number of carbon atoms in the aryl group is preferably 6 to 48, more preferably 6 to 22, and particularly preferably 6 to 12. The number of carbon atoms constituting a ring of the heteroaryl group is preferably 1 to 30 and more preferably 1 to 12. Examples of the type of the heteroatom constituting the ring of the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocyclic ring or a fused ring, more preferably a monocyclic ring or a fused ring composed of 2 to 8 rings, and still more preferably a monocyclic ring or a fused ring composed of 2 to 4 rings. The aryl group and heteroaryl group may have a substituent. Examples of the substituent include the substituent T described later and the solubilizing group described later. From the reason that the J-association is easily formed so that light resistance is improved, it is preferable that the aryl group and the heteroaryl group do not have a substituent.

In Formula (10), $R^{21}$ represents a substituent. Examples of the substituent represented by $R^{21}$ include the substituent T described later and the solubilizing group, and an alkyl group, an aryl group, a heteroaryl group, —OCORt$^1$, or —NHCORt$^1$ is preferable. Rt$^1$ is preferably an alkyl group, an aryl group, or a heteroaryl group and more preferably an alkyl group.

In Formula (10), $X^{10}$ represents CO or $SO_2$. In a case where $X^{10}$ is CO, an effect of improving heat resistance can be expected. In a case where $X^{10}$ is $SO_2$, an effect of improving visible transparency can be expected.

(Substituent T)

Examples of a substituent T include a halogen atom, a cyano group, a nitro group, an alkyl group, an alkenyl group, an alkynyl group, an aryl group, a heteroaryl group, —ORt$^1$, —CORt$^1$, —COORt$^1$, —OCORt$^1$, —NRt$^1$Rt$^2$, —NHCORt$^1$, —CONRt$^1$Rt$^2$, —NHCONRt$^1$Rt$^2$, —NHCOORt$^1$, —SRt$^1$, —SORt$^1$, —SO$_2$Rt$^1$, —SO$_2$ORt$^1$, —NHSO$_2$Rt$^1$, and —SO$_2$NRt$^1$Rt$^2$. Rt$^1$ and Rt$^2$ each independently represent a hydrogen atom, an alkyl group, an alkenyl group, an alkynyl group, an aryl group, or a heteroaryl group. Rt$^1$ and Rt$^2$ may be bonded to each other to form a ring.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic, and is preferably linear or branched.

The number of carbon atoms in the alkenyl group is preferably 2 to 20, more preferably 2 to 12, and particularly preferably 2 to 8. The alkenyl group may be linear, branched, or cyclic, and is preferably linear or branched.

The number of carbon atoms in the alkynyl group is preferably 2 to 40, more preferably 2 to 30, and particularly preferably 2 to 25. The alkynyl group may be linear, branched, or cyclic, and is preferably linear or branched.

The number of carbon atoms in the aryl group is preferably 6 to 30, more preferably 6 to 20, and still more preferably 6 to 12.

As the heteroaryl group, a heteroaryl group of a monocyclic ring or a fused ring composed of 2 to 8 rings is preferable, and a heteroaryl group of a monocyclic ring or a fused ring composed of 2 to 4 rings is more preferable. The number of heteroatoms constituting a ring of the heteroaryl group is preferably 1 to 3. As the heteroatom constituting the ring of the heteroaryl group, a nitrogen atom, an oxygen atom, or a sulfur atom is preferable. It is preferable that the heteroaryl group is a 5-membered or 6-membered ring. The number of carbon atoms constituting the ring of the heteroaryl group is preferably 3 to 30, more preferably 3 to 18, and still more preferably 3 to 12.

The alkyl group, the alkenyl group, the alkynyl group, the aryl group, and the heteroaryl group may have a substituent or may be unsubstituted. Examples of the substituent include the substituents described in the substituent T.

(Solubilizing Group)

Examples of a solubilizing group include a group represented Formula (W).

$$-S^{100}-L^{100}-T^{100} \quad (W)$$

In Formula (W), $S^{100}$ represents a single bond, an arylene group, or a heteroarylene group, and a single bond is preferable. The arylene group may be monocyclic or polycyclic, but is preferably monocyclic. The number of carbon atoms in the arylene group is preferably 6 to 20 and more preferably 6 to 12. The heteroarylene group may be monocyclic or polycyclic, but is preferably monocyclic. The number of heteroatoms constituting a ring of the heteroarylene group is preferably 1 to 3. As the heteroatom constituting the ring of the heteroarylene group, a nitrogen atom, an oxygen atom, a sulfur atom, or a selenium atom is preferable. The number of carbon atoms constituting the ring of the heteroarylene group is preferably 3 to 30, more preferably 3 to 18, and still more preferably 3 to 12.

In Formula (W), $L^{100}$ represents an alkylene group, an alkenylene group, an alkynylene group, —O—, —S—, —NR$^{L1}$—, —CO—, —COO—, —OCO—, —CONRL$^{11}$, —NR$^{L1}$CO—, —SO$_2$—, —OR$^{L2}$—, and a group of a combination of these groups, in which $R^{L1}$ represents a hydrogen atom or an alkyl group and $R^{L2}$ represents an alkylene group. $L^{100}$ is preferably an alkylene group, an alkenylene group, an alkynylene group, —O—, —S—, —COO—, —OCO—, —SO$_2$—, —OR$^{L2}$—, or a group of a combination of these groups, and from the viewpoint of flexibility and solvent solubility, more preferably an alkylene group, an alkenylene group, —O—, —OR$^{L2}$—, or a group of a combination of these groups, still more preferably an alkylene group, an alkenylene group, —O—, or —OR$^{L2}$—, and particularly preferably an alkylene group, —O—, or —OR$^{L2}$—.

The number of carbon atoms in the alkylene group represented by $L^{100}$ is preferably 1 to 40. The lower limit is more preferably 3 or more, still more preferably 5 or more, even more preferably 10 or more, and particularly preferably 13 or more. The upper limit is more preferably 35 or less and still more preferably 30 or less. The alkylene group may be linear, branched, or cyclic, but is preferably a linear or branched alkylene group and particularly preferably a branched alkylene group. The number of branches in the alkylene group is, for example, preferably 2 to 10 and more preferably 2 to 8. In a case where the number of branches is within the above-described range, solvent solubility is good. The number of carbon atoms in the alkenylene group and alkynylene group represented by $L^{100}$ is preferably 2 to 40. The lower limit is, for example, more preferably 3 or more, still more preferably 5 or more, even more preferably 8 or more, and particularly preferably 10 or more. The upper limit is more preferably 35 or less and still more preferably 30 or less. The alkenylene group and alkynylene group may be linear or branched, but is preferably linear or branched and particularly preferably branched. The number of branches is preferably 2 to 10 and more preferably 2 to 8. In a case where the number of branches is within the above-described range, solvent solubility is good.

$R^{L1}$ represents a hydrogen atom or an alkyl group, and a hydrogen atom is preferable. The number of carbon atoms in the alkyl group is preferably 1 to 20, more preferably 1 to 10, still more preferably 1 to 4, and particularly preferably 1 or 2. The alkyl group may be linear or branched.

$R^{L2}$ represents an alkylene group. The alkylene group represented by $R^{L2}$ has the same meaning as the alkylene group described in $L^{100}$, and the preferred range is also the same.

In Formula (W), $T^{100}$ represents an alkyl group, a cyano group, a hydroxy group, a formyl group, a carboxyl group, an amino group, a thiol group, a sulfo group, a phosphoryl group, a boryl group, a vinyl group, an ethynyl group, an aryl group, a heteroaryl group, a trialkylsilyl group, or a trialkoxysilyl group. The number of carbon atoms in the alkyl group, an alkyl group of the trialkylsilyl group, and an alkyl group of the trialkoxysilyl group is preferably 1 to 40. The lower limit is more preferably 3 or more, still more preferably 5 or more, even more preferably 10 or more, and particularly preferably 13 or more. The upper limit is more preferably 35 or less and still more preferably 30 or less. The alkyl group may be linear, branched, or cyclic, and is preferably linear or branched.

In Formula (W), in a case where $S^{100}$ is a single bond, $L^{100}$ is an alkylene group, and $T^{100}$ is an alkyl group, the sum total of the number of carbon atoms included in $L^{100}$ and $T^{100}$ is preferably 3 or more, from the viewpoint of solvent solubility, more preferably 6 or more, and still more preferably 8 or more. The upper limit is, for example, preferably 40 or less and more preferably 35 or less. In addition, in a case where $S^{100}$ is an arylene group or a heteroarylene group, the sum total of the number of carbon atoms included in $L^{100}$ and $T^{100}$ is preferably 3 or more, from the viewpoint of solvent solubility, more preferably 6 or more, and still more preferably 8 or more. The upper limit is, for example, preferably 40 or less and more preferably 35 or less.

Examples of a preferred aspect of Formula (W) include a combination in which $S^{100}$ is a single bond, $L^{100}$ is an alkylene group, an alkenylene group, an alkynylene group, —O—, —S—, —$NR^{L1}$—, —COO—, —OCO—, —$CONR^{L1}$—, —$SO_2$—, —$OR^{L2}$—, or a group of a combination of these groups, and $T^{100}$ is an alkyl group or a trialkylsilyl group. $L^{100}$ is more preferably an alkylene group, an alkenylene group, —O—, —$OR^{L2}$—, or a group of a combination of these groups, still more preferably an alkylene group, an alkenylene group, —O—, or —$OR^{L2}$—, and particularly preferably an alkylene group, —O—, or —$OR^{L2}$—. $T^{100}$ is more preferably an alkyl group.

In Formula (W), the -$L^{100}$-$T^{100}$ portion preferably includes a branched alkyl structure. Specifically, the -$L^{100}$-$T^{100}$ portion is particularly preferably a branched alkyl group or a branched alkoxy group. The number of branches in the -$L^{100}$-$T^{100}$ portion is preferably 2 to 10 and more preferably 2 to 8. The number of carbon atoms in the -$L^{100}$-$T^{100}$ portion is preferably 3 or more, more preferably 6 or more, and still more preferably 8 or more. The upper limit is, for example, preferably 40 or less and more preferably 35 or less.

In Formula (W), the -$L^{100}$-$T^{100}$ portion also preferably includes an asymmetric carbon atom. According to this aspect, the oxocarbon compound A can include a plurality of optical isomers, and as a result, solvent solubility of the oxocarbon compound A can be further improved. The number of asymmetric carbon atoms is preferably 1 to 4.

The compound (SQ1) is preferably a compound represented by Formula (SQ2) or Formula (SQ3). According to this aspect, moisture resistance of the obtained cured film can also be further improved.

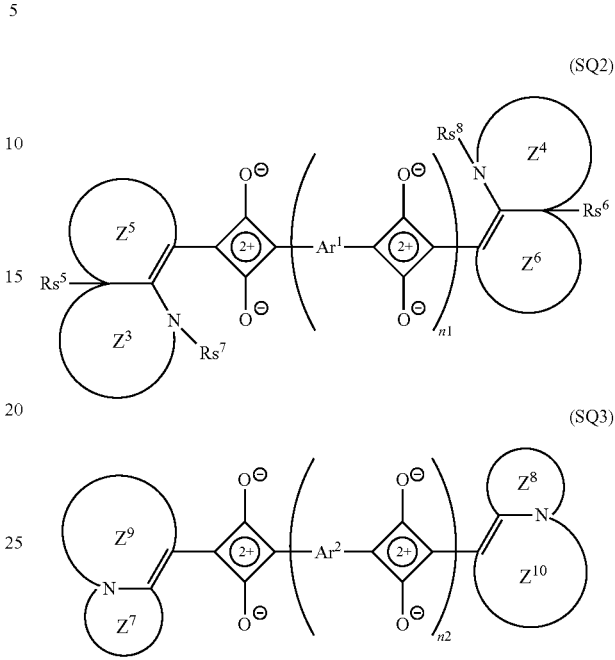

In Formula (SQ2), a ring $Z^3$ and a ring $Z^4$ each independently represent a polycyclic aromatic ring having a 5-membered or 6-membered nitrogen-containing heterocyclic ring, which may have one or a plurality of substituents, a ring $Z^5$ and a ring $Z^6$ each independently represent a 4-membered to 9-membered hydrocarbon ring or heterocyclic ring, which may have one or a plurality of substituents, in a case where the ring $Z^3$ to the ring $Z^6$ have a plurality of substituents, the plurality of substituents may be the same or different from each other, $Rs^1$ to $Rs^8$ each independently represent a hydrogen atom or a substituent, $Ar^1$ represents a group represented by any one of Formulae (Ar-1) to (Ar-4), and n1 represents an integer of 0 to 2.

In Formula (SQ3), a ring $Z^7$ and a ring $Z^8$ each independently represent a polycyclic aromatic ring having a 5-membered or 6-membered nitrogen-containing heterocyclic ring, which may have one or a plurality of substituents, a ring $Z^9$ and a ring $Z^{10}$ each independently represent a 4-membered to 9-membered nitrogen-containing heterocyclic ring, which may have one or a plurality of substituents, in a case where the ring $Z^7$ to the ring $Z^{19}$ have a plurality of substituents, the plurality of substituents may be the same or different from each other, $Ar^2$ represents a group represented by any one of Formulae (Ar-1) to (Ar-4), and n2 represents an integer of 0 to 2.

The ring $Z^3$ and ring $Z^4$ in Formula (SQ2) are the same as the ring $Z^{1a}$ in Formula (1-1), and the preferred ranges are also the same. The ring $Z^5$ and ring $Z^6$ in Formula (SQ2) are the same as the ring $Z^{2a}$ in Formula (1-1), and the preferred ranges are also the same. Examples of the substituent which may be included in the ring $Z^3$ to ring $Z^6$ and the substituent represented by $Rs^5$ to $Rs^8$ include the above-described substituent T, the above-described solubilizing group, and the above-described electron-withdrawing group. In Formula (SQ2), from the reason that it is easy to shift the maximum absorption wavelength of a compound to a longer wavelength side and to improve visible transparency and near infrared shielding properties, $Ar^1$ is preferably a group represented by any one of Formulae (Ar-2) to (Ar-4). In Formula (SQ2), n1 represents an integer of 0 to 2, and is preferably 0 or 1.

The ring $Z^7$ and ring $Z^8$ in Formula (SQ3) are the same as the ring $Z^{1b}$ in Formula (1-2), and the preferred ranges are also the same. The ring $Z^9$ and ring $Z^{10}$ in Formula (SQ3) are the same as the ring $Z^{1b}$ in Formula (1-2), and the preferred ranges are also the same. Examples of the substituent which may be included in the ring $Z^7$ to ring $Z^{10}$ include the above-described substituent T, the above-described solubilizing group, and the above-described electron-withdrawing group. In Formula (SQ3), from the reason that it is easy to shift the maximum absorption wavelength of a compound to a longer wavelength side and to improve visible transparency and near infrared shielding properties, $Ar^e$ is preferably a group represented by any one of Formulae (Ar-2) to (Ar-4). In Formula (SQ3), n2 represents an integer of 0 to 2, and is preferably 0 or 1.

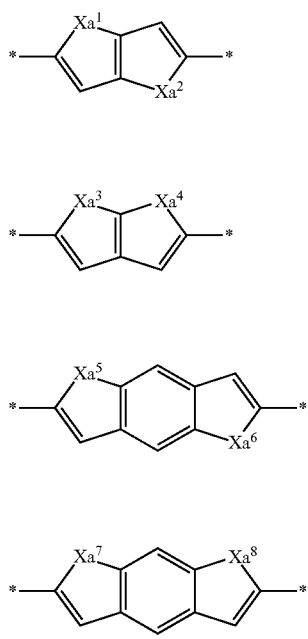

In the formulae, $Xa^1$ to $Xa^8$ each independently represent a sulfur atom, an oxygen atom, or $NRx^a$, in which $Rx^a$ represents a hydrogen atom or a substituent, and * represents a bonding hand. Examples of the substituent represented by $Rx^a$ include the above-described substituent T, and an alkyl group is preferable. It is preferable that at least one of $Xa^1$ or $Xa^2$, at least one of $Xa^a$ or $Xa^4$, at least one of $Xa^5$ or $Xa^6$, and at least one of $Xa^7$ or $Xa^8$ each independently represent an oxygen atom or $NRx^a$.

The compound (SQ1) is also preferably a compound represented by Formula (SQ4). According to this aspect, moisture resistance of the obtained cured film can also be improved more remarkably.

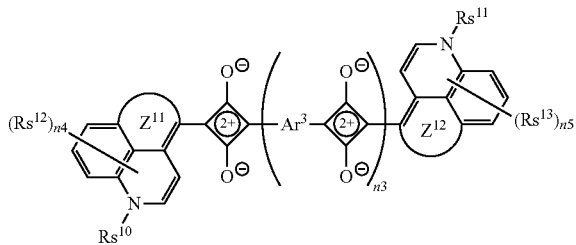

In Formula (SQ4), a ring $Z^{11}$ and a ring $Z^{12}$ each independently represent a 4-membered to 9-membered hydrocarbon ring or heterocyclic ring, which may have one or a plurality of substituents, in a case where the ring $Z^{11}$ and the ring $Z^{12}$ have a plurality of substituents, the plurality of substituents may be the same or different from each other, $Rs^{10}$ and $Rs^{11}$ each independently represent a hydrogen atom or a substituent, $Rs^{12}$ and $Rs^{13}$ each independently represent a substituent, $Rs^{10}$ and $Rs^{12}$, or $Rs^{11}$ and $Rs^{13}$ may be bonded to each other to form a 5-membered ring or a 6-membered ring, n3 represents an integer of 0 to 2, n4 and n5 each independently represent an integer of 0 to 5, in a case where n4 is 2 or more, a plurality of $Rs^{12}$'s may be the same or different from each other, and two $Rs^{12}$'s of the plurality of $Rs^{12}$'s may be bonded to each other to form a ring, in a case where n5 is 2 or more, a plurality of $Rs^{13}$'s may be the same or different from each other, and two $Rs^{13}$'s of the plurality of $Rs^{13}$'s may be bonded to each other to form a ring, and $Ar^3$ represents a group represented by any one of Formulae (Ar-1) to (Ar-4).

The ring $Z^{11}$ and ring $Z^{12}$ in Formula (SQ4) are the same as the ring $Z^2$ in Formula (1), and the preferred ranges are also the same. Examples of the substituent which may be included in the ring $Z^{11}$ and ring $Z^{12}$ and the substituent represented by $Rs^{10}$ to $Rs^{13}$ include the above-described substituent T, the above-described solubilizing group, and the above-described electron-withdrawing group. In Formula (SQ4), $Rs^{10}$ and Rs', or $Rs^{11}$ and $Rs^{13}$ may be bonded to each other to form a 5-membered ring or a 6-membered ring. The ring formed by bonding these groups to each other may be a hydrocarbon ring or a heterocyclic ring. In Formula (SQ4), n3 represents an integer of 0 to 2, and is preferably 0 or 1. In Formula (SQ4), n4 and n5 each independently represent an integer of 1 to 5, and are preferably 1 to 3, more preferably 1 or 2, and still more preferably 1. In Formula (SQ4), in a case where n4 is 2 or more, a plurality of $Rs^{12}$'s may be the same or different from each other, and two $Rs^{12}$'s of the plurality of $Rs^{12}$'s may be bonded to each other to form a ring. In addition, in a case where n5 is 2 or more, a plurality of $Rs^{13}$'s may be the same or different from each other, and two $Rs^{13}$'s of the plurality of $Rs^{13}$'s may be bonded to each other to form a ring. The ring formed by bonding $Rs^{12}$'s to each other and the ring formed by bonding $Rs^{13}$'s to each other are preferably a 4-membered to 9-membered hydrocarbon ring or heterocyclic ring, more preferably a 5-membered to 7-membered hydrocarbon ring or heterocyclic ring, and still more preferably a 5-membered or 6-membered hydrocarbon ring or heterocyclic ring. In Formula (SQ4), Ar$^a$ is preferably a group represented by any one of Formulae (Ar-2) to (Ar-4).

The compound (SQ1) is also preferably a compound represented by Formula (SQ5). According to this aspect, light resistance of the obtained cured film can also be further improved.

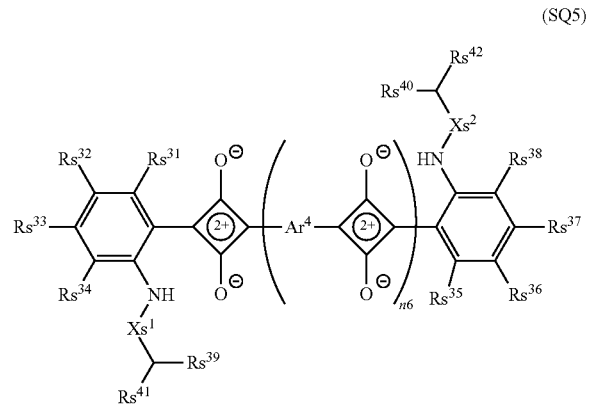

(SQ5)

In Formula (SQ5), $Rs^{31}$ to $Rs^{38}$ each independently represent a hydrogen atom or a substituent, and two adjacent groups of $Rs^{31}$ to $Rs^{38}$ may be bonded to each other to form a ring, $Rs^{39}$ and $Rs^1$ each independently represent an aryl group or a heteroaryl group, $Rs^{41}$ and $Rs^{42}$ each independently represent a substituent, and $Rs^{41}$ and $Rs^{42}$ may be linked to each other through a single bond or a linking group, $Xs^1$ and $Xs^2$ each independently represent CO or $SO_2$, $Ar^4$ represents a group represented by any one of Formulae (Ar-1) to (Ar-4), and n6 represents an integer of 0 to 2.

In Formula (SQ5), $Rs^{31}$ to $Rs^{38}$ each independently represent a hydrogen atom or a substituent. Examples of the substituent represented by $Rs^{31}$ to $Rs^{38}$ include the above-described substituent T, the above-described solubilizing group, and the above-described electron-withdrawing group. In addition, two adjacent groups of $Rs^{31}$ to $Rs^{38}$ may be bonded to each other to form a ring. The ring formed by bonding these groups to each other is preferably a 4-membered to 9-membered hydrocarbon ring or heterocyclic ring, more preferably a 5-membered to 7-membered hydrocarbon ring or heterocyclic ring, still more preferably a 5-membered or 6-membered hydrocarbon ring or heterocyclic ring, and even more preferably a 5-membered or 6-membered hydrocarbon ring.

In Formula (SQ5), $Rs^{39}$ and $Rs^{40}$ each independently represent an aryl group or a heteroaryl group, and an aryl group is preferable. The number of carbon atoms in the aryl group is preferably 6 to 30, more preferably 6 to 20, and still more preferably 6 to 12. As the heteroaryl group, a heteroaryl group of a monocyclic ring or a fused ring composed of 2 to 8 rings is preferable, and a heteroaryl group of a monocyclic ring or a fused ring composed of 2 to 4 rings is more preferable. The number of heteroatoms constituting a ring of the heteroaryl group is preferably 1 to 3. As the heteroatom constituting the ring of the heteroaryl group, a nitrogen atom, an oxygen atom, or a sulfur atom is preferable. It is preferable that the heteroaryl group is a 5-membered or 6-membered ring. The number of carbon atoms constituting the ring of the heteroaryl group is preferably 3 to 30, more preferably 3 to 18, and still more preferably 3 to 12. The aryl group and heteroaryl group may have a substituent, but from the reason that a film having excellent light resistance is easily formed, it is preferable to be unsubstituted.

$Rs^{41}$ and $Rs^{42}$ each independently represent a substituent. Examples of the substituent represented by $Rs^{41}$ and $Rs^{42}$ include the above-described substituent T, and an alkyl group, an aryl group, a heteroaryl group, —OCORt$^1$, or —NHCORt$^1$ is preferable. Rt$^1$ is preferably an alkyl group, an aryl group, or a heteroaryl group and more preferably an alkyl group. $Rs^{41}$ and $Rs^{42}$ may be linked through a single bond or a linking group, and from the reason that more excellent light resistance is easily obtained, it is preferable to be linked. Examples of the linking group include —CH$_2$—, —CO—, —O—, —NH—, and a group selected from the group consisting of a combination thereof.

In Formula (SQ5), Xs$^1$ and Xs$^2$ each independently represent CO or SO$_2$. In Formula (SQ5), Ar$^4$ is preferably a group represented by any one of Formulae (Ar-2) to (Ar-4). In Formula (SQ5), n6 represents an integer of 0 to 2, and is preferably 0 or 1 and still more preferably 0.

The compound (SQ1) is also preferably a compound represented by Formula (SQ6) or Formula (SQ7). According to this aspect, moisture resistance of the obtained cured film can also be improved more remarkably.

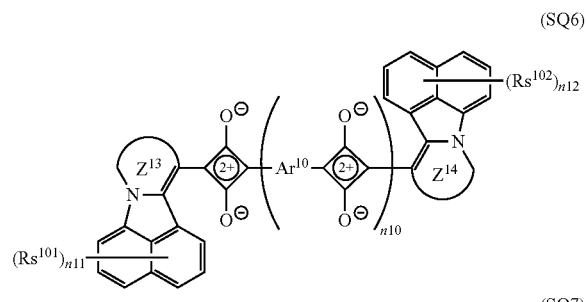

(SQ6)

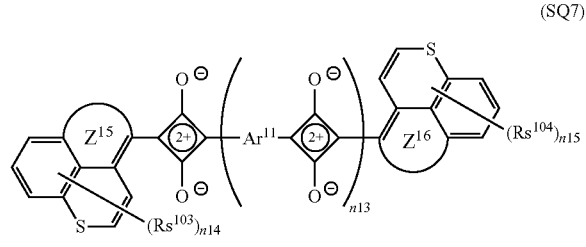

(SQ7)

In Formula (SQ6), a ring $Z^{13}$ and a ring $Z^{14}$ each independently represent a 4-membered to 9-membered hydrocarbon ring or heterocyclic ring, which may have one or a plurality of substituents, in a case where the ring $Z^{13}$ and the ring $Z^{14}$ have a plurality of substituents, the plurality of substituents may be the same or different from each other, $Rs^{101}$ and $Rs^{102}$ each independently represent a substituent, n10 represents an integer of 0 to 2, n11 and n12 each independently represent an integer of 0 to 6, in a case where n11 is 2 or more, a plurality of $Rs^{101}$'s may be the same or different from each other, and two $Rs^{101}$'s of the plurality of $Rs^{101}$'s may be bonded to each other to form a ring, in a case where n12 is 2 or more, a plurality of $Rs^{102}$'s may be the same or different from each other, and two $Rs^{102}$'s of the plurality of $Rs^{102}$'s may be bonded to each other to form a ring, and $Ar^{10}$ represents a group represented by any one of Formulae (Ar-1) to (Ar-4).

In Formula (SQ7), a ring $Z^{15}$ and a ring $Z^{16}$ each independently represent a 4-membered to 9-membered hydrocarbon ring or heterocyclic ring, which may have one or a plurality of substituents, in a case where the ring $Z^{15}$ and the ring $Z^{16}$ have a plurality of substituents, the plurality of substituents may be the same or different from each other, $Rs^{103}$ and $Rs^{104}$ each independently represent a substituent, n13 represents an integer of 0 to 2, n14 and n15 each independently represent an integer of 0 to 5, in a case where n14 is 2 or more, a plurality of $Rs^{103}$'s may be the same or different from each other, and two $Rs^{103}$'s of the plurality of $Rs^{103}$'s may be bonded to each other to form a ring, in a case where n15 is 2 or more, a plurality of $Rs^{104}$'s may be the same or different from each other, and two $Rs^{104}$'s of the plurality of $Rs^{104}$'s may be bonded to each other to form a ring, and $Ar^{11}$ represents a group represented by any one of Formulae (Ar-1) to (Ar-4).

The ring $Z^{13}$ and ring $Z^{14}$ in Formula (SQ6) and the ring $Z^{15}$ and ring $Z^{16}$ in Formula (SQ7) are the same as the ring $Z^2$ in Formula (1), and the preferred ranges are also the same. Examples of the substituent which may be included in the ring $Z^{13}$ to ring $Z^{18}$ and the substituent represented by $Rs^{101}$ to $Rs^{104}$ include the above-described substituent T, the above-described solubilizing group, and the above-described electron-withdrawing group. $Ar^{10}$ and $Ar^{11}$ are preferably a group represented by any one of Formulae (Ar-2) to (Ar-4).

In Formula (SQ6), n10 represents an integer of 0 to 2, and is preferably 0 or 1. In Formula (SQ6), n11 and n12 each independently represent an integer of 0 to 6, and is preferably 0 to 4, more preferably 0 to 3, still more preferably 0 to 2, and particularly preferably 1 or 2.

In Formula (SQ7), n13 represents an integer of 0 to 2, and is preferably 0 or 1. In Formula (SQ7), n14 and n15 each independently represent an integer of 0 to 5, and is preferably 0 to 4, more preferably 0 to 3, still more preferably 0 to 2, and particularly preferably 1 or 2.

(Compound (CR1))

Next, the compound (CR1) (compound represented by Formula (CR1)) will be described.

In Formula (CR1), $Rc^1$ and $Rc^2$ each independently represent a monovalent organic group. Examples of the monovalent organic group represented by $Rc^1$ and $Rc^2$ include an aryl group, a heteroaryl group, a group represented by Formula (R1) described above, a group represented by Formula (1) described above, and a group represented by Formula (10) described above.

In Formula (CR1), it is preferable that at least one of $Rc^1$ or $Rc^2$ is a group represented by Formula (1) described above, or at least one of $Rc^1$ or $Rc^2$ is a group represented by Formula (10) described above.

The aryl group, heteroaryl group, group represented by Formula (R1), group represented by Formula (1), and group represented by Formula (10) represented by $Rc^1$ and $Rc^2$ are the same range as described in the section of $Rs^1$ and $Rs^2$ in Formula (SQ1), and the preferred ranges are also the same.

Examples of a preferred aspect of $Rc^1$ and $Rc^2$ include an aspect in which $Rc^1$ and $Rc^2$ are each independently Formula (1-1) described above, an aspect in which $Rc^1$ and $Rc^2$ are each independently Formula (1-2) described above, an aspect in which $Rc^1$ and $Rc^2$ are each independently Formula (1-3) described above, an aspect in which $Rc^1$ and $Rc^2$ are each independently Formula (1-4) described above, an aspect in which $Rc^1$ and $Rc^2$ are each independently Formula (1-5) described above, and an aspect in which $Rc^1$ and $Rc^2$ are each independently Formula (10) described above.

In addition, in Formula (CR1), at least one of $Rc^1$ or $Rc^2$ is preferably an aryl group or heteroaryl group of a fused ring, more preferably a group represented by Formula (100) or a group represented by Formula (101), and still more preferably a group represented by Formula (101).

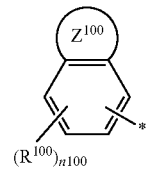
(100)

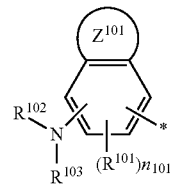
(101)

In Formula (100), a ring $Z^{100}$ represents a 4-membered to 9-membered hydrocarbon ring or heterocyclic ring, which may have one or a plurality of substituents, in a case where the ring $Z^{100}$ has a plurality of substituents, the plurality of substituents may be the same or different from each other, $R^{100}$ represents a hydrogen atom or a substituent, in a case where n100 is 2 or more, a plurality of $R^{100}$'s may be the same or different from each other, and two $R^{100}$'s of the plurality of $R^{100}$'s may be bonded to each other to form a ring, and n100 represents an integer of 0 to 3.

In Formula (101), a ring $Z^{101}$ represents a 4-membered to 9-membered hydrocarbon ring or heterocyclic ring, which may have one or a plurality of substituents, in a case where the ring $Z^{101}$ has a plurality of substituents, the plurality of substituents may be the same or different from each other, $R^{101}$ to $R^{103}$ each independently represent a hydrogen atom or a substituent, $R^{101}$ and $R^{102}$ may be bonded to each other to form a ring, $R^{102}$ and $R^{103}$ may be bonded to each other to form a ring, in a case where n101 is 2 or more, a plurality of $R^{101}$'s may be the same or different from each other, and two $R^{101}$'s of the plurality of $R^{101}$'s may be bonded to each other to form a ring, and n101 represents an integer of 0 to 2.

The hydrocarbon ring and heterocyclic ring represented by the ring $Z^{100}$ in Formula (100) and the ring $Z^{101}$ in Formula (101) may be an aromatic ring or a non-aromatic ring, but are preferably an aromatic ring. The hydrocarbon ring and heterocyclic ring represented by the ring $Z^{100}$ in Formula (100) and the ring $Z^{101}$ in Formula (101) are preferably a 5-membered to 7-membered ring and more preferably a 5-membered or 6-membered ring. Among these, the ring $Z^{100}$ in Formula (100) and the ring $Z^{101}$ in Formula (101) are preferably a 5-membered or 6-membered hydrocarbon ring or a 5-membered hetero ring having 1 to 3 heteroatoms, and still more preferably a 5-membered hetero ring having 1 to 3 heteroatoms. The heteroatom may be any of a nitrogen atom, a sulfur atom, and an oxygen atom, but from the viewpoint of increasing visible light transmittance, a nitrogen atom or a sulfur atom is preferable.

Specific examples of the ring $Z^{100}$ and the ring $Z^{101}$ include a pyrrolidine ring, a pyrrole ring, a thiophene ring, an imidazole ring, a pyrazole ring, a triazole ring, an isothiazole ring, an oxazole ring, an isoxazole ring, and a triazole ring. Among these, a pyrrole ring, an imidazole ring, a pyrazole ring, or a triazole ring is preferable. In addition, in the pyrrole ring, the imidazole ring, the pyrazole ring, or the triazole ring, it is more preferable to be a configuration in which, in —NH— included as a part of the ring, the hydrogen atom is not replaced and the nitrogen atom is bonded to a carbon atom at the 2-position of the benzene ring bonded to a croconium skeleton.

Examples of the substituent which may be included in the ring $Z^{100}$ and ring $Z^{101}$ and the substituent represented by $R^{100}$ to $R^{103}$ include the above-described substituent T, the above-described solubilizing group, and the above-described electron-withdrawing group.

Specific examples of the oxocarbon compound A include compounds having the following structures.

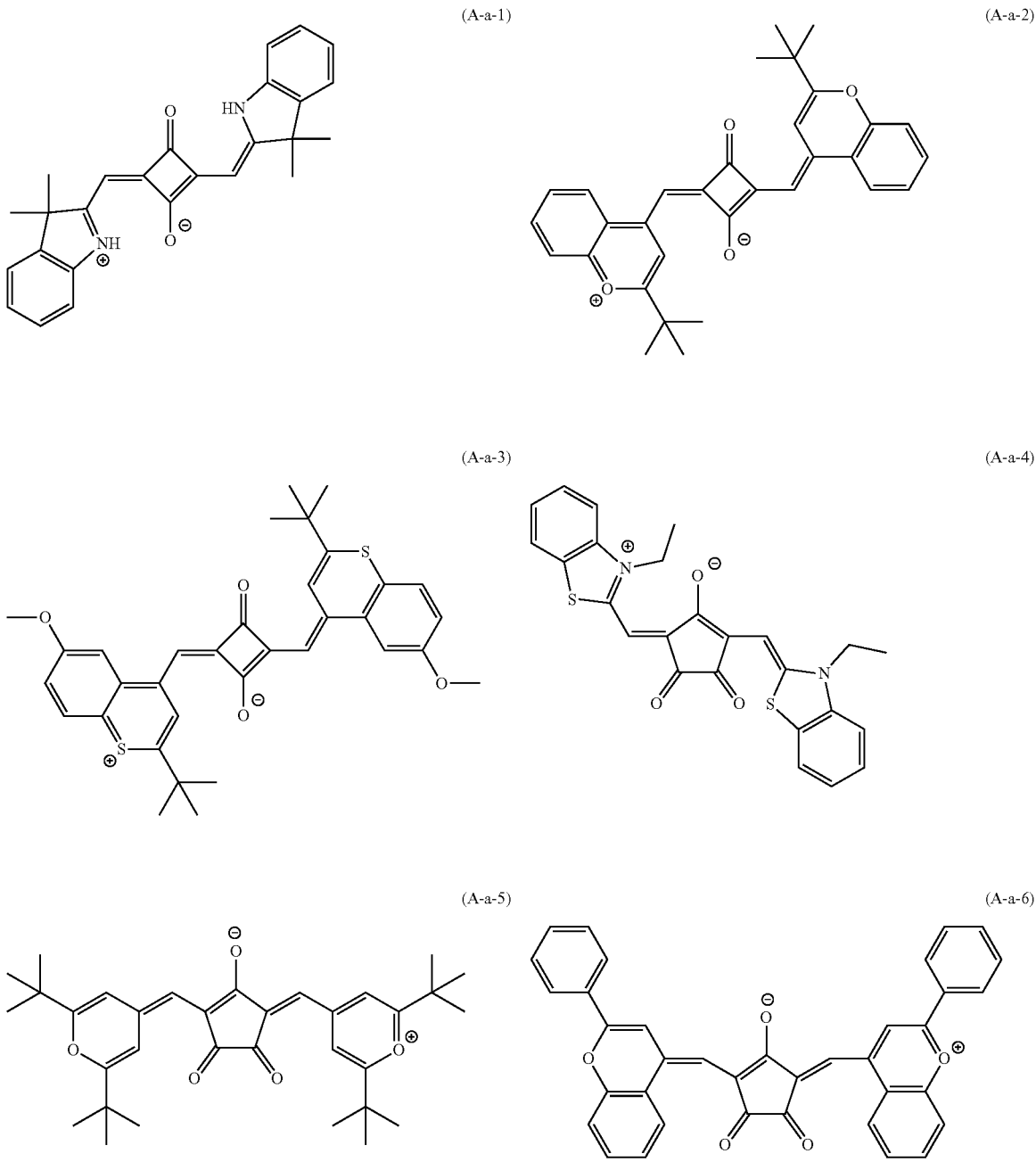

-continued
(A-a-7)
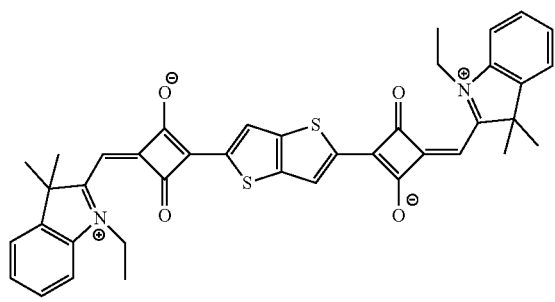
(A-a-8)
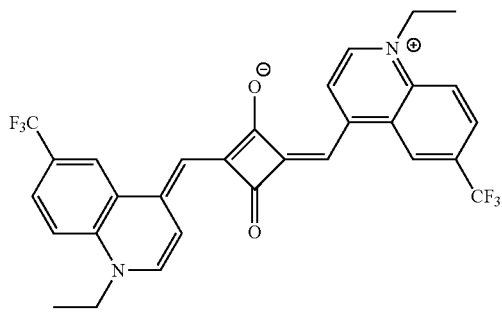
(A-a-9)
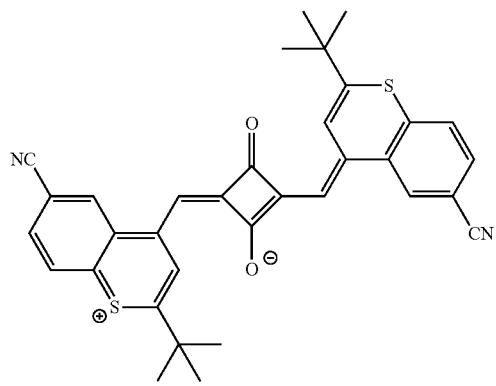
(A-a-10)
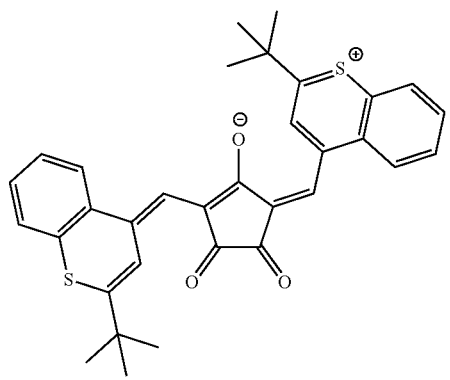
(A-a-11)
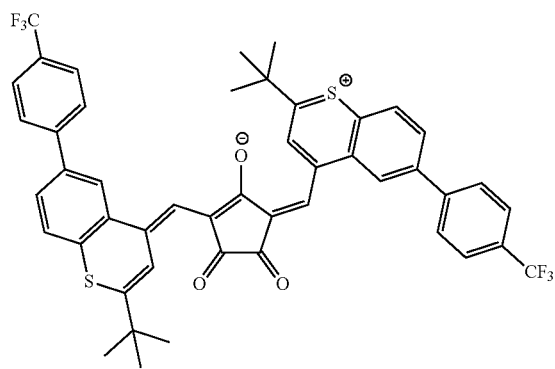
(A-a-12)
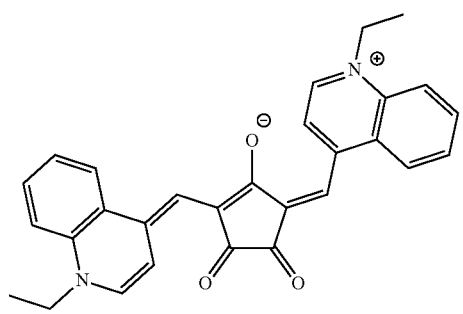
(A-a-13)
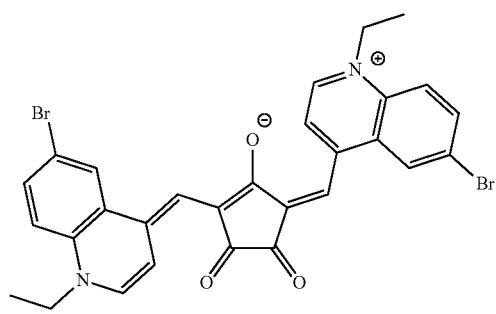
(A-a-14)
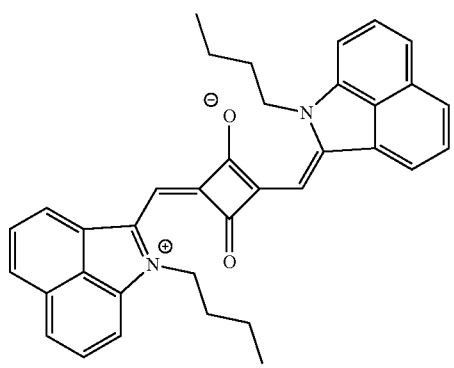

-continued
(A-a-15)
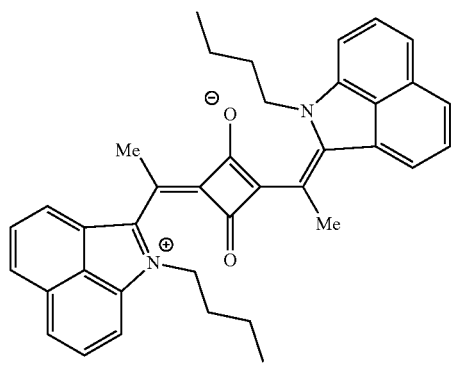
(A-a-16)
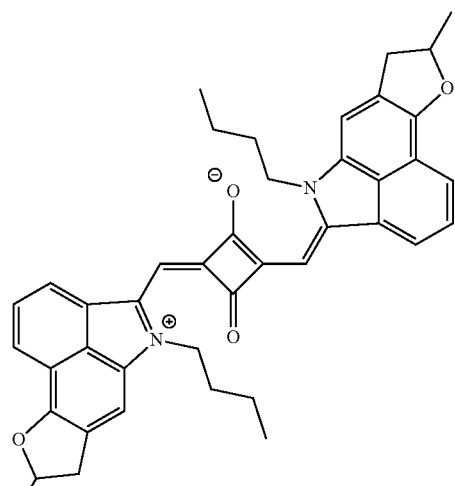
(A-a-17)
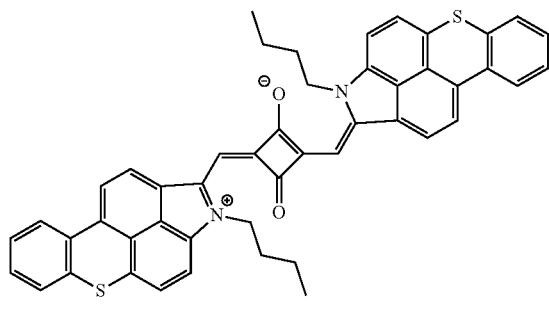
(A-a-18)
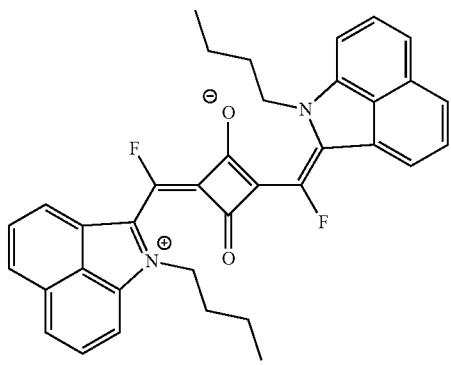
(A-a-19)
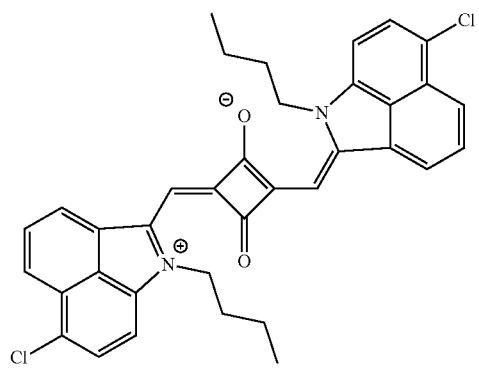
(A-a-20)
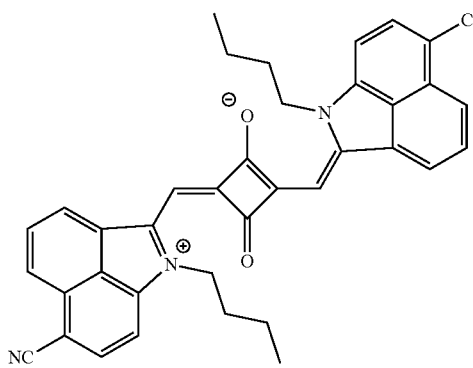
(A-a-21)
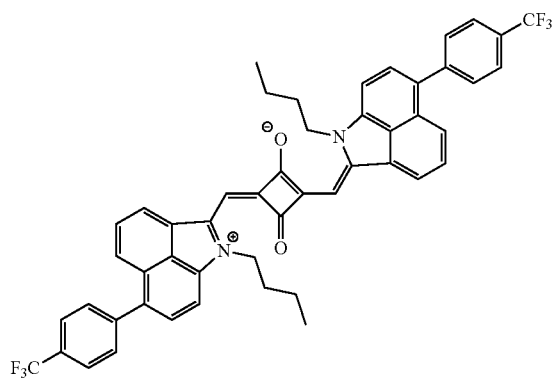
(A-b-1)
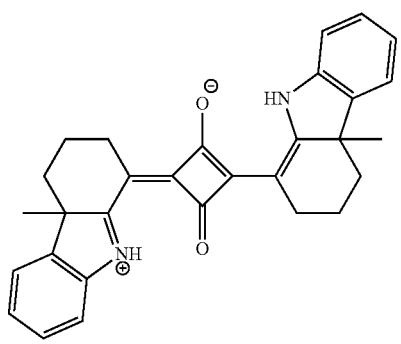

-continued
(A-b-2)
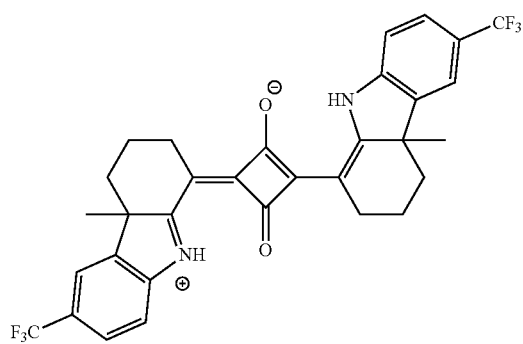
(A-b-3)
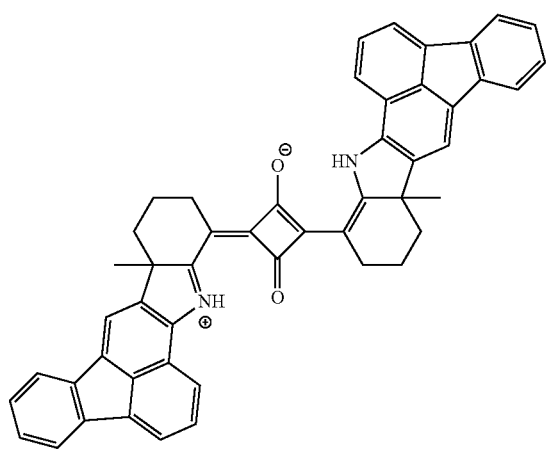
(A-b-4)
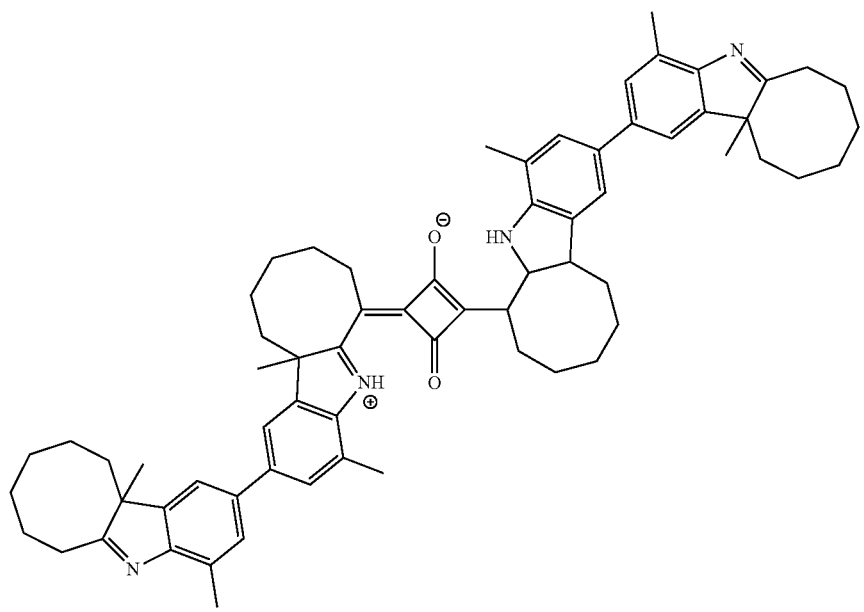
(A-b-5)
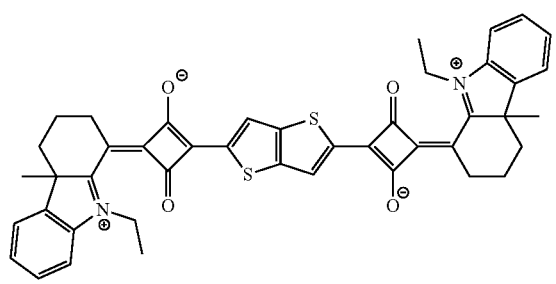
(A-b-6)
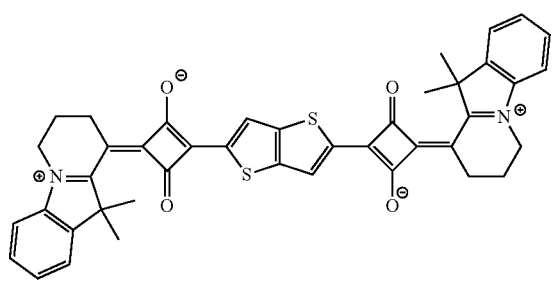

-continued
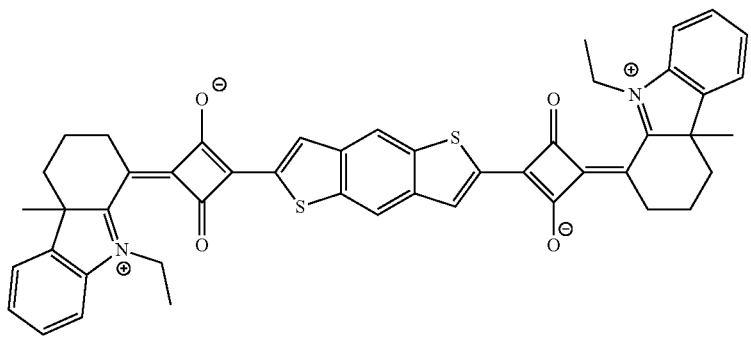
(A-b-7)
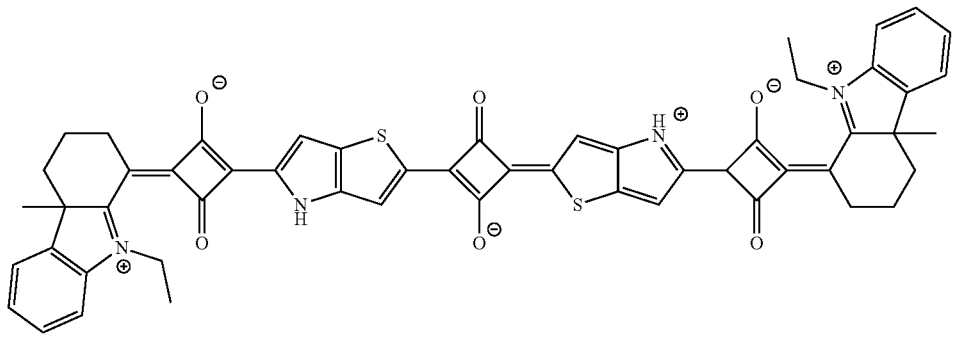
(A-b-8)
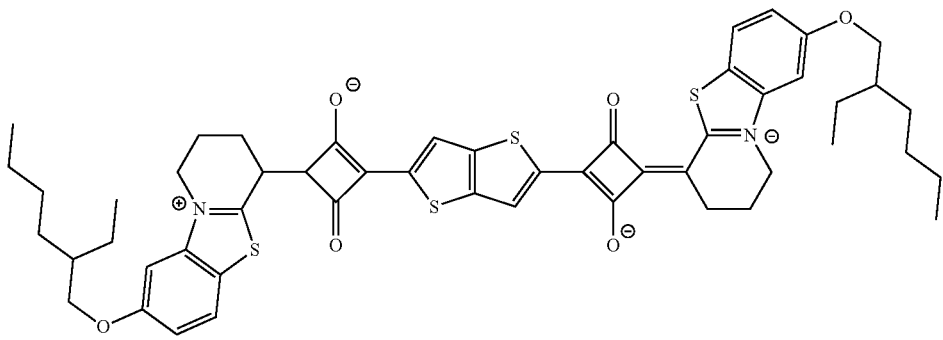
(A-b-9)
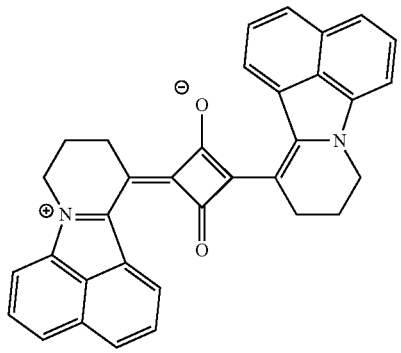
(A-b-10)
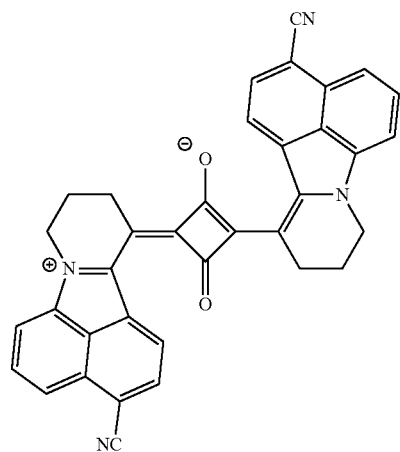
(A-b-11)

-continued
(A-c-1)
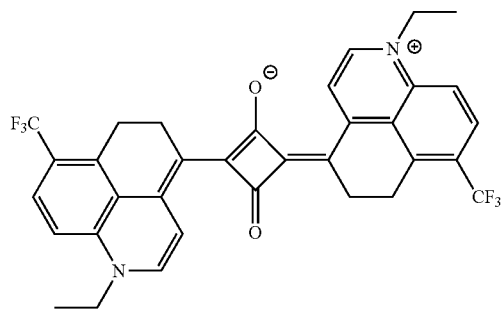
(A-c-2)
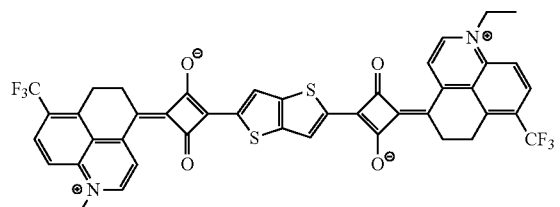
(A-c-3)
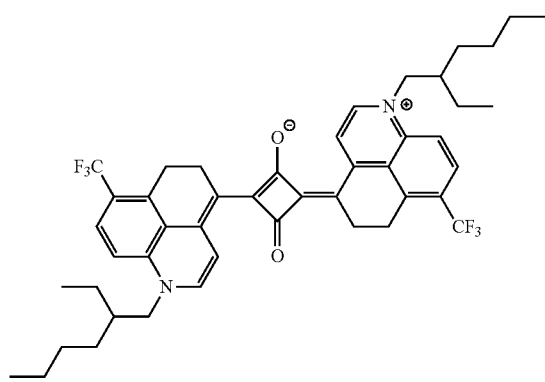
(A-c-4)
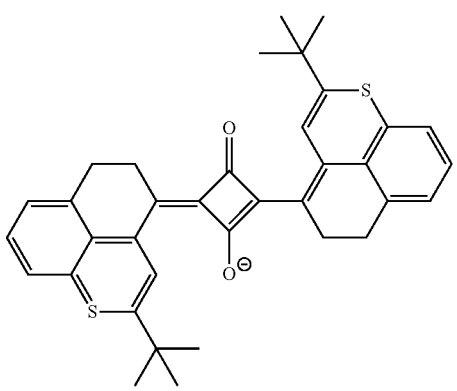
(A-c-5)
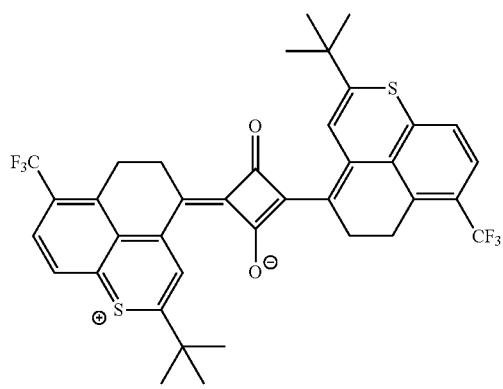
(A-c-6)
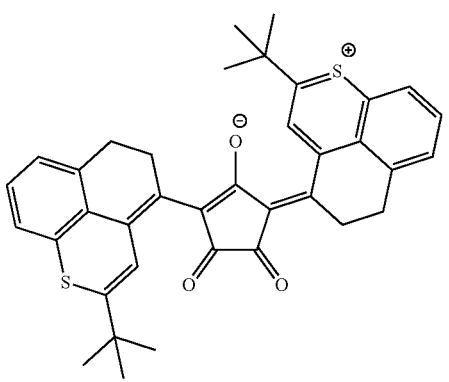
(A-c-7)
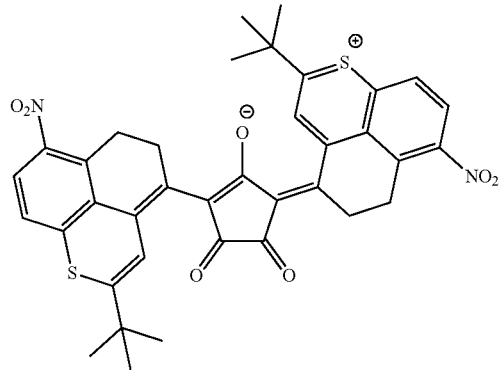
(A-c-8)
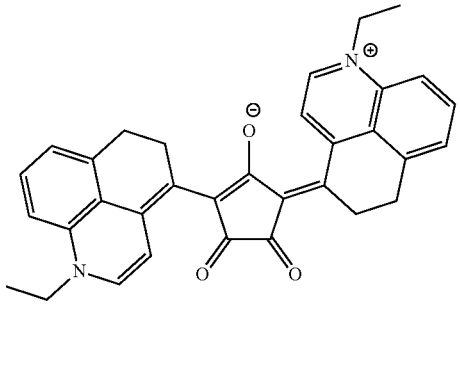

-continued
(A-c-9)
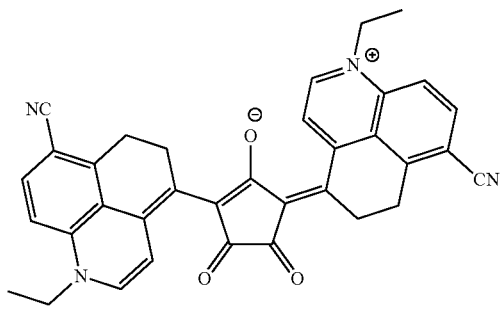
(A-d-1)
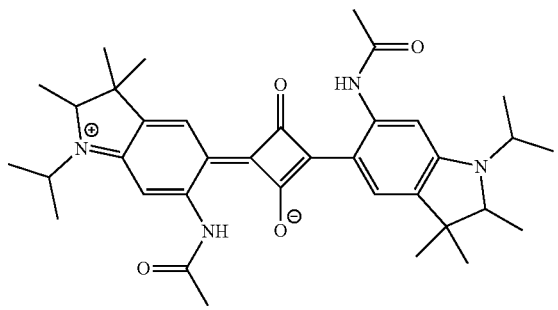
(A-d-2)
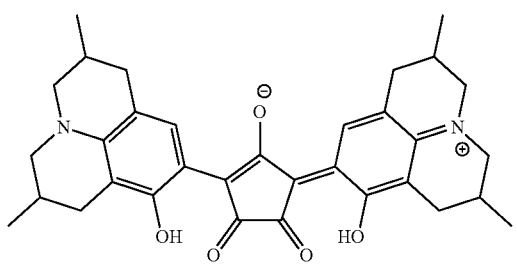
(A-d-3)
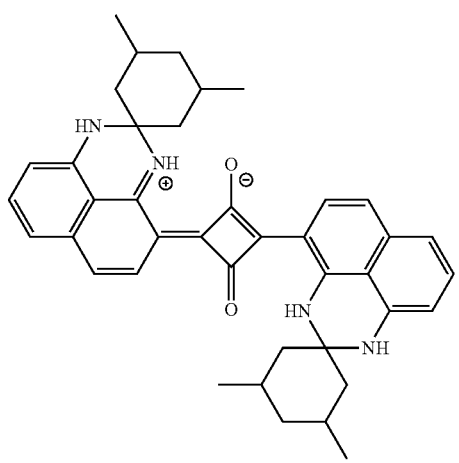
(A-d-4)
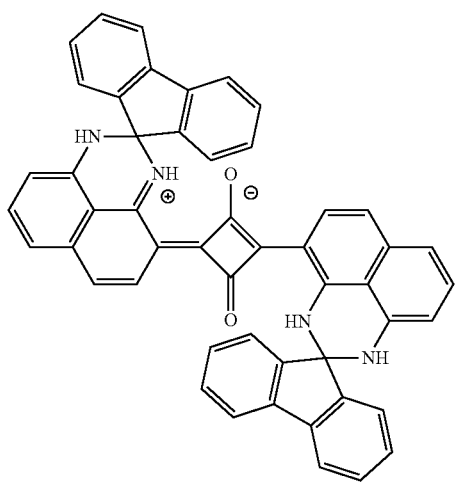
(A-d-5)
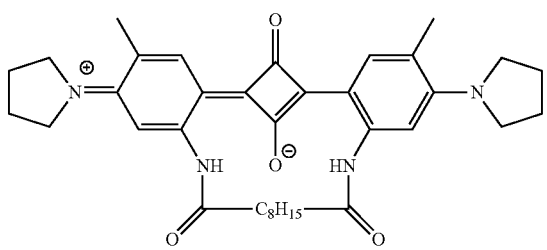

-continued
(A-d-6)
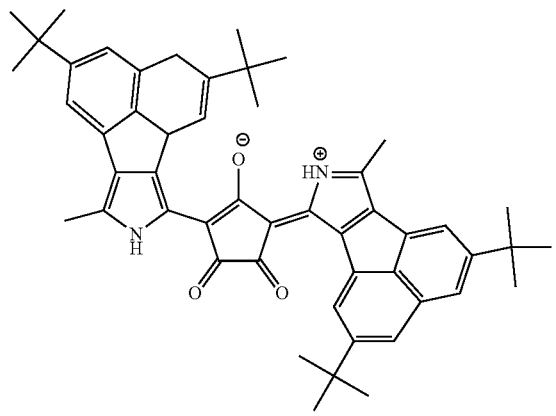
(A-d-7)
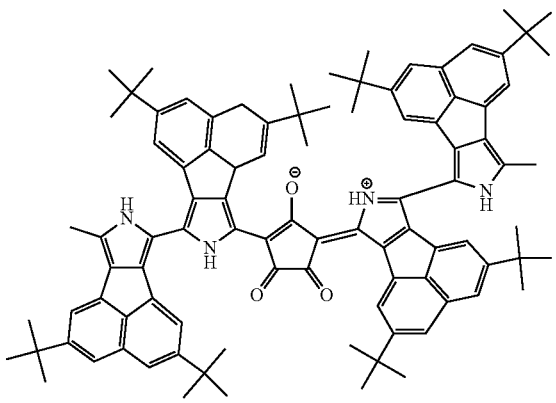
(A-d-8)
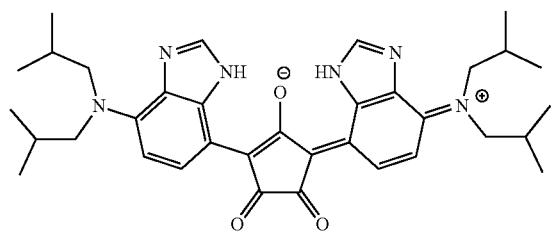
(A-d-9)
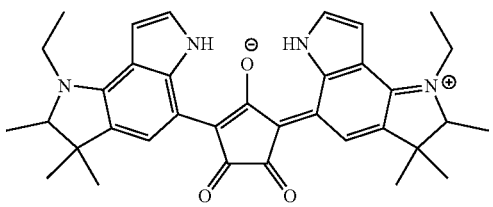
(A-d-10)
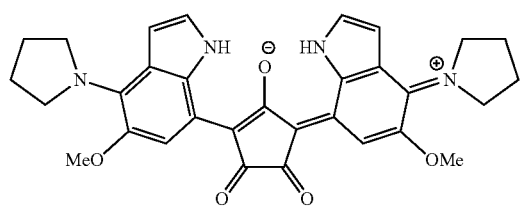
(A-d-11)
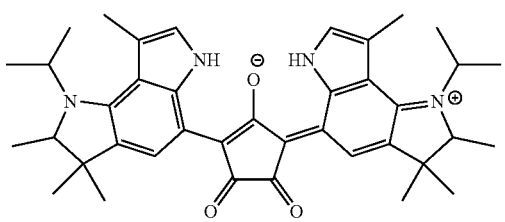
(A-e-1)
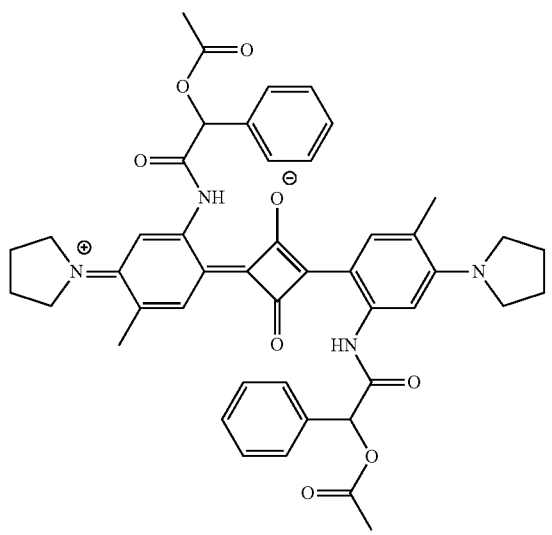
(A-e-2)
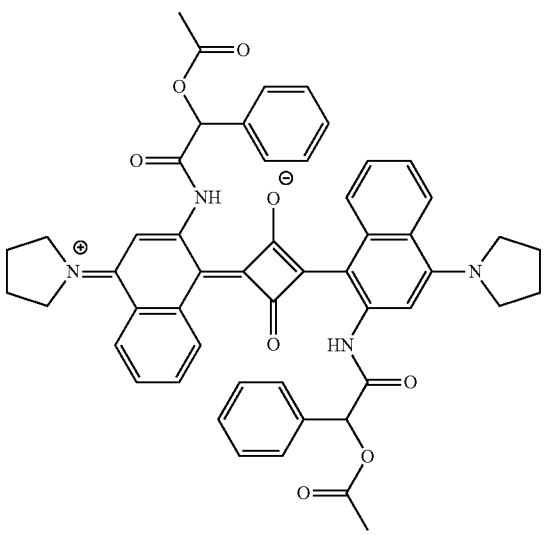

-continued

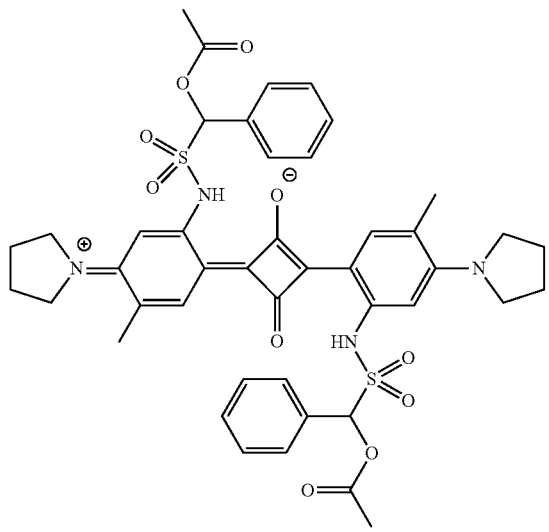
(A-e-3)

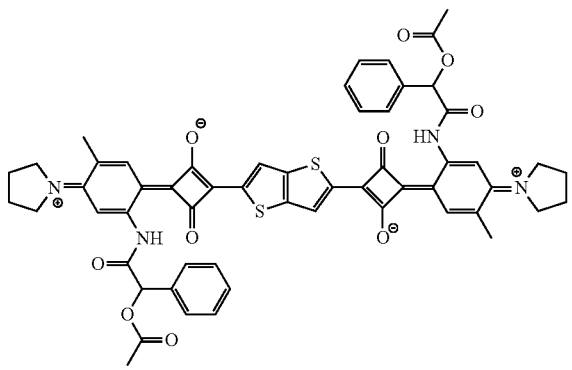
(A-e-4)

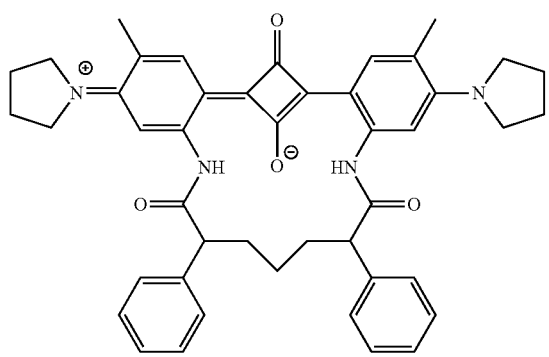
(A-3-5)

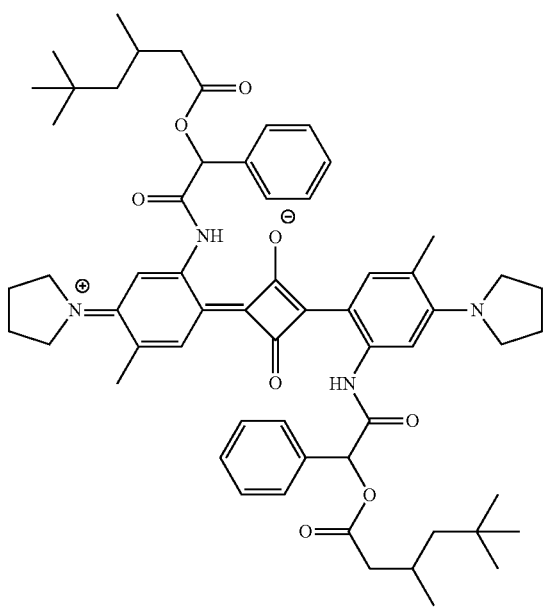
(A-e-6)

The content of the oxocarbon compound A in the total solid content of the photosensitive composition according to the embodiment of the present invention is preferably 0.1 to 70 mass %. The lower limit is preferably 0.5 mass % or more and more preferably 1.0 mass % or more. The upper limit is preferably 60 mass % or less and more preferably 50 mass % or less. In a case where the photosensitive composition according to the embodiment of the present invention includes two or more kinds of oxocarbon compounds A, it is preferable that the total content thereof is within the above-described range.

<<Near-Infrared Absorber>>

The photosensitive composition according to the embodiment of the present invention may contain a near-infrared absorber (other near-infrared absorbers) other than the above-described oxocarbon compound A. Examples of the other near-infrared absorbers include a pyrrolopyrrole compound, a cyanine compound, a phthalocyanine compound, a naphthalocyanine compound, a quaterrylene compound, a merocyanine compound, an oxonol compound, an iminium compound, a dithiol compound, a triarylmethane compound, a pyrromethene compound, an azomethine compound, an anthraquinone compound, a dibenzofuranone compound, a metal oxide, and a metal boride. Examples of the pyrrolopyrrole compound include compounds described in paragraphs "0016" to "0058" of JP2009-263614A, compounds described in paragraphs "0037" to "0052" of JP2011-068731A, and compounds described in paragraphs "0010" to "0033" of WO2015/166873A. Examples of the squarylium compound include compounds described in paragraphs "0044" to "0049" of JP2011-208101A, compounds described in paragraphs "0060" and "0061" of JP6065169B, compounds described in paragraph "0040" of WO2016/181987A, compounds described in JP2015-176046A, compounds described in paragraph "0072" of WO2016/190162A, compounds described in paragraphs "0196" to "0228" of JP2016-074649A, compounds described in paragraph "0124" of JP2017-067963A, compounds described in WO2017/135359A, compounds described in JP2017-114956A, compounds described in JP6197940B, and compounds described in WO2016/120166A. Examples of the cyanine compound include compounds described in paragraphs "0044" and "0045" of JP2009-108267A, compounds described in paragraphs "0026" to "0030" of JP2002-194040A, compounds described in JP2015-172004A, compounds described in JP2015-172102A, compounds described in JP2008-088426A, and compounds described in paragraph "0090" of WO2016/190162A. Examples of the iminium compound include compounds described in JP2008-528706A, compounds described in JP2012-012399A, compounds described in JP2007-092060A, and compounds described in paragraphs "0048" to "0063" of WO2018/043564A. Examples of the phthalocyanine compound include compounds described in paragraph "0093" of JP2012-077153A, oxytitanium phthalocyanine described in JP2006-343631A, and compounds described in paragraphs "0013" to "0029" of JP2013-195480A. Examples of the naphthalocyanine compound include compounds described in paragraph "0093" of JP2012-077153A. Examples of the metal oxide include indium tin oxide, antimony tin oxide, zinc oxide, Al-doped zinc oxide, fluorine-doped tin dioxide, niobium-doped titanium dioxide, and tungsten oxide. The details of tungsten oxide can be found in paragraph "0080" of JP2016-006476A, the content of which is incorporated herein by reference. Examples of the metal boride include lanthanum boride. Examples of a commercially available product of lanthanum boride include $LaB_6$—F (manufactured by JAPAN NEW METALS CO., LTD.). In addition, as the metal boride, compounds described in WO2017/119394A can also be used. Examples of a commercially available product of indium tin oxide include F-ITO (manufactured by DOWA HIGHTECH CO., LTD.).

In a case where the photosensitive composition according to the embodiment of the present invention contains other near-infrared absorbers, the content of the other near-infrared absorbers is preferably 0.1 to 70 mass % with respect to the total solid content of the photosensitive composition according to the embodiment of the present invention. The lower limit is preferably 0.5 mass % or more and more preferably 1.0 mass % or more. The upper limit is preferably 60 mass % or less and more preferably 50 mass % or less.

In addition, the total content of the other near-infrared absorbers and the above-described oxocarbon compound A is preferably 0.1 to 70 mass % with respect to the total solid content of the photosensitive composition according to the embodiment of the present invention. The lower limit is preferably 0.5 mass % or more and more preferably 1.0 mass % or more. The upper limit is preferably 60 mass % or less and more preferably 50 mass % or less. In a case where the photosensitive composition according to the embodiment of the present invention includes two or more kinds of other near-infrared absorbers, it is preferable that the total content thereof is within the above-described range.

In addition, the photosensitive composition according to the embodiment of the present invention may be in an aspect in which the photosensitive composition according to the embodiment of the present invention does not substantially contain other near-infrared absorbers. The aspect in which the photosensitive composition according to the embodiment of the present invention does not substantially contain other near-infrared absorbers is preferably an aspect in which the content of the other near-infrared absorbers is 0.05 mass % or less with respect to the total solid content of the photosensitive composition, more preferably an aspect in which the content of the other near-infrared absorbers is 0.01 mass % or less with respect to the total solid content of the photosensitive composition, and still more preferably an aspect in which the other near-infrared absorbers are not contained.

<<Chromatic Colorant>>

The photosensitive composition according to the embodiment of the present invention may contain a chromatic colorant. In the present invention, "chromatic colorant" denotes a colorant other than a white colorant and a black colorant. Examples of the chromatic colorant include yellow colorants, orange colorants, red colorants, green colorants, violet colorants, and blue colorants. The chromatic colorant may be a pigment or a dye. The coloring material may be used in combination of the pigment and the dye. In addition, the pigment may be either an inorganic pigment or an organic pigment. In addition, as the pigment, a material in which a part of an inorganic pigment or an organic-inorganic pigment is replaced with an organic chromophore can also be used. By replacing a part of an inorganic pigment or an organic-inorganic pigment with an organic chromophore, color tone design can be easily performed. Examples of the pigment include the following pigments:

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 231, and 232 (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and 294 (all of which are red pigments);

C. I. Pigment Green 7, 10, 36, 37, 58, 59, 62, and 63 (all of which are green pigments);

C. I. Pigment Violet 1, 19, 23, 27, 32, 37, 42, 60, and 61 (all of which are violet pigments); and C. I. Pigment Blue 1, 2, 15, 15:1, 15:2, 15:3, 15:4, 15:6, 16, 22, 29, 60, 64, 66, 79, 80, 87, and 88 (all of which are blue pigments).

In addition, as the green pigment, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used. Specific examples thereof include compounds described in WO2015/118720A. In addition, as the green pigment, compounds described in CN2010-6909027A, a phthalocyanine compound having a phosphoric acid ester as a ligand, or the like can also be used.

In addition, as the blue pigment, an aluminum phthalocyanine compound having a phosphorus atom can also be used. Specific examples thereof include compounds described in paragraphs "0022" to "0030" of JP2012-247591A and paragraph "0047" of JP2011-157478A.

In addition, as the yellow pigment, pigments described in JP2017-201003A and pigments described in JP2017-197719A can be used. In addition, as the yellow pigment, a metal azo pigment which includes at least one kind of an anion selected from an azo compound represented by Formula (I) or an azo compound having a tautomeric structure of the azo compound represented by Formula (I), two or more kinds of metal ions, and a melamine compound can also be used.

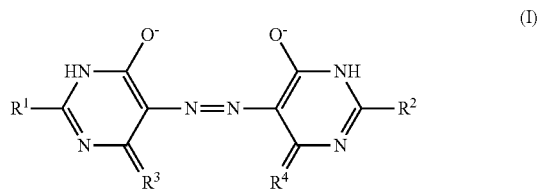

In the formula, $R^1$ and $R^2$ each independently represent —OH or —$NR^5R^6$, and $R^3$ and $R^4$ each independently represent =O or =$NR^7$, in which $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic, and is preferably linear or branched and more preferably linear. The alkyl group may have a substituent. The substituent is preferably a halogen atom, a hydroxy group, an alkoxy group, a cyano group, or an amino group.

With regard to the metal azo pigment, reference can be made to the description in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

In addition, as the yellow pigment, compounds described in JP2018-062644A can also be used. These compounds can also be used as a pigment derivative.

As the red pigment, diketopyrrolopyrrole-based pigments described in JP2017-201384A, in which the structure has at least one substituted bromine atom, diketopyrrolopyrrole-based pigments described in paragraphs "0016" to "0022" of JP6248838B, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used.

As the dye, a known dye can be used without any particular limitation. Examples thereof include a pyrazoleazo-based dye, an anilinoazo-based dye, a triarylmethane-based dye, an anthraquinone-based dye, an anthrapyridone-based dye, a benzylidene-based dye, an oxonol-based dye, a pyrazolotriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, an indigo-based dye, and a pyrromethane-based dye. In addition, thiazole compounds described in JP2012-158649A, azo compounds described in JP2011-184493A, or azo compounds described in JP2011-145540A can also be preferably used. In addition, as yellow dyes, quinophthalone compounds described in paragraphs "0011" to "0034" of JP2013-054339A, quinophthalone compounds described in paragraphs "0013" to "0058" of JP2014-026228A, or the like can also be used.

In a case where the photosensitive composition according to the embodiment of the present invention contains a chromatic colorant, the content of the chromatic colorant is preferably 0.1 to 70 mass % with respect to the total solid content of the photosensitive composition according to the embodiment of the present invention. The lower limit is preferably 0.5 mass % or more and more preferably 1.0 mass % or more. The upper limit is preferably 60 mass % or less and more preferably 50 mass % or less.

The content of the chromatic colorant is preferably 10 to 1000 parts by mass and more preferably 50 to 800 parts by mass with respect to 100 parts by mass of the above-described oxocarbon compound A.

In addition, the total content of the chromatic colorant, the above-described oxocarbon compound A, and the above-described other near-infrared absorbers is preferably 1 to 80 mass % with respect to the total solid content of the photosensitive composition according to the embodiment of the present invention. The lower limit is preferably 5 mass % or more and more preferably 10 mass % or more. The upper limit is preferably 70 mass % or less and more preferably 60 mass % or less. In a case where the photosensitive composition according to the embodiment of the present invention includes two or more kinds of chromatic colorants, it is preferable that the total content thereof is within the above-described range.

In addition, it is also preferable that the photosensitive composition according to the embodiment of the present invention does not substantially contain the chromatic colorant. A case where the photosensitive composition according to the embodiment of the present invention does not substantially contain the chromatic colorant represents that the content of the chromatic colorant is preferably 0.05 mass % or less, more preferably 0.01 mass % or less, and still more preferably 0 mass % with respect to the total solid content of the photosensitive composition.

<<Coloring Material which Allows Transmission of Infrared Light and Shields Visible Light>>

The photosensitive composition according to the embodiment of the present invention can also contain a coloring material which allows transmission of infrared light and shields visible light (hereinafter, also referred to as a "coloring material which shields visible light").

In the present invention, it is preferable that the coloring material which shields visible light is a coloring material which absorbs light in a wavelength range of violet to red. In addition, in the present invention, it is preferable that the coloring material which shields visible light is a coloring material which shields light in a wavelength range of 450 to 650 nm. In addition, it is preferable that the coloring material which shields visible light is a coloring material which allows transmission of light in a wavelength range of 900 to 1300 nm.

In the present invention, it is preferable that the coloring material which shields visible light satisfies at least one of the following requirement (A) or (B).
(A): coloring material which shields visible light includes two or more chromatic colorants, and a combination of the two or more chromatic colorants forms black.
(B): coloring material which shields visible light includes an organic black colorant.

Examples of the chromatic colorant include the above-described chromatic colorants. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, JP2015-525260A, and the like, and the bisbenzofuranone compound is available, for example, as "Irgaphor Black" manufactured by BASF. Examples of the perylene compound include compounds described in paragraphs "0016" to "0020" of JP2017-226821A, C. I. Pigment Black 31 and 32, and Lumogen Black FK4280. Examples of the azomethine compound include compounds described in JP1989-170601A (JP-1401-170601A) and JP1990-034664A (JP-H02-034664A). For example, "CHROMOFINE BLACK A1103" (manufactured by Dainichiseika Color & Chemicals Mfg. Co., Ltd.) is available.

In a case where a combination of two or more chromatic colorants forms black, examples of the combination of the chromatic colorants include the following.

(1) aspect in which the coloring material which shields visible light contains a yellow colorant, a blue colorant, a violet colorant, and a red colorant (2) aspect in which the coloring material which shields visible light contains a yellow colorant, a blue colorant, and a red colorant (3) aspect in which the coloring material which shields visible light contains a yellow colorant, a violet colorant, and a red colorant (4) aspect in which the coloring material which shields visible light contains a yellow colorant and a violet colorant (5) aspect in which the coloring material which shields visible light contains a green colorant, a blue colorant, a violet colorant, and a red colorant (6) aspect in which the coloring material which shields visible light contains a violet colorant and an orange colorant (7) aspect in which the coloring material which shields visible light contains a green colorant, a violet colorant, and a red colorant (8) aspect in which the coloring material which shields visible light contains a green colorant and a red colorant In a case where the photosensitive composition according to the embodiment of the present invention contains a coloring material which shields visible light, the content of the coloring material which shields visible light is preferably 60 mass % or less, more preferably 50 mass % or less, still more preferably 30 mass % or less, even more preferably 20 mass % or less, and particularly preferably 15 mass % or less with respect to the total solid content of the photosensitive composition. The lower limit may be, for example, 0.1 mass % or more or 0.5 mass % or more.

In addition, it is also preferable that the photosensitive composition according to the embodiment of the present invention does not substantially contain the coloring material which shields visible light. A case where the photosensitive composition according to the embodiment of the present invention does not substantially contain coloring material which shields visible light represents that the content of the coloring material which shields visible light is preferably 0.05 mass % or less, more preferably 0.01 mass % or less, and still more preferably 0 mass % with respect to the total solid content of the photosensitive composition.

<<Pigment Derivative>>

In a case where the photosensitive composition according to the embodiment of the present invention includes the pigment, it is preferable that the photosensitive composition according to the embodiment of the present invention further contains a pigment derivative. Examples of the pigment derivative include a compound having a structure in which a part of the pigment is substituted with an acidic group or a basic group. Examples of the acid group include a sulfo group, a carboxyl group, a phosphoric acid group, a boronic acid group, a sulfonimide group, a sulfonamide group, salts of these group, and a desalted structure of these salts. Examples of an atom or atomic group constituting the salts include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion. In addition, examples of the desalted structure of the salt include groups in which an atom or an atomic group forming the salt has been eliminated from the above-described salt. For example, a desalted structure of a salt of a carboxyl group is a carboxylate group ($-COO^-$). Examples of the basic group include an amino group, a pyridinyl group, salts of these groups, and a desalted structure of these salts. Examples of an atom or atomic group constituting the salts include a hydroxide ion, a halogen ion, a carboxylate ion, a sulfonate ion, and a phenoxide ion. In addition, examples of the desalted structure of the salt include groups in which an atom or an atomic group forming the salt has been eliminated from the above-described salt.

The pigment derivative preferably has at least one group selected from a sulfo group, a carboxyl group, a phosphoric acid group, a boronic acid group, a sulfonimide group, a sulfonamide group, an amino group, a pyridinyl group, salts of these group, and a desalted structure of these salts, and more preferably has a sulfo group, a carboxyl group, and an amino group. In a case where the pigment derivative has such a group, an effect of improving dispersion stability is obtained.

In a case where a pigment is used as the oxocarbon compound A, the pigment derivative is preferably a compound having a π-conjugated plane, and is more preferably a compound having a π-conjugated plane having the same structure as the π-conjugated plane included in the oxocarbon compound A. In addition, the number of π electrons included in the π-conjugated plane of the pigment derivative is preferably 8 to 100. The upper limit is preferably 90 or less and more preferably 80 or less. The lower limit is preferably 10 or more and more preferably 12 or more. In addition, it is also preferable that the pigment derivative is a compound having a π-conjugated plane including a partial structure represented by Formula (SQ-a), or a compound having a π-conjugated plane including a partial structure represented by Formula (CR-a).

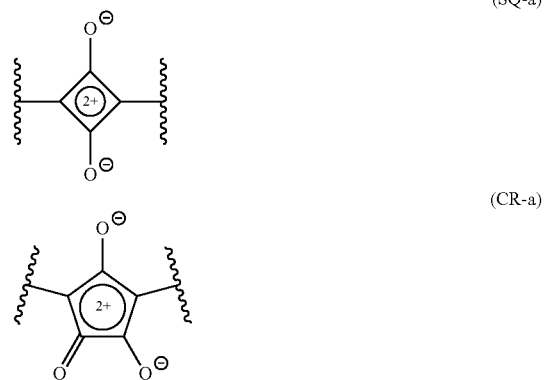

In the formulae, a wavy line represents a bonding hand.

It is also preferable that the pigment derivative is at least one compound selected from a compound represented by Formula (Syn1) or a compound represented by Formula (Syn2).

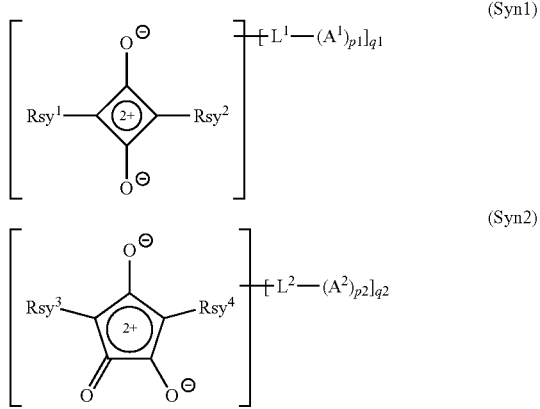

In Formula (Syn1), $Rsy^1$ and $Rsy^2$ each independently represent an organic group; $L^1$ represents a single bond or a p1+1-valent group; $A^1$ represents a group selected from a sulfo group, a carboxyl group, a phosphoric acid group, a boronic acid group, a sulfonimide group, a sulfonamide group, an amino group, a pyridinyl group, salts of these groups, and a desalted structure of these; and p1 and q1 each independently represent an integer of 1 or more. In a case where p1 is 2 or more, a plurality of $A^1$'s may be the same or different from each other. In a case where q1 is 2 or more, a plurality of $L^1$'s and $A^1$'s may be respectively the same or different from each other.

In Formula (Syn2), $Rsy^3$ and $Rsy^4$ each independently represent an organic group; $L^2$ represents a single bond or a p2+1-valent group; $A^2$ represents a group selected from a sulfo group, a carboxyl group, a phosphoric acid group, a boronic acid group, a sulfonimide group, a sulfonamide group, an amino group, a pyridinyl group, salts of these groups, and a desalted structure of these; and p2 and q2 each independently represent an integer of 1 or more. In a case where p2 is 2 or more, a plurality of $A^2$'s may be the same or different from each other. In a case where q2 is 2 or more, a plurality of $L^2$'s and $A^2$'s may be respectively the same or different from each other.

Examples of the organic group represented by $Rsy^1$ and $Rsy^2$ in Formula (Syn1) and the organic group represented by $Rsy^3$ and $Rsy^4$ in Formula (Syn2) include an aryl group, a heteroaryl group, a group represented by Formula (R1) described above, a group represented by Formula (1) described above, and a group represented by Formula (10) described above. The details and preferred ranges of these are the same as those described in the section of the oxocarbon compound A described above.

Examples of the p1+1-valent group represented by $L^1$ in Formula (Syn1) and the p2+1-valent group represented by $L^2$ in Formula (Syn2) include a hydrocarbon group, a heterocyclic group, —O—, —S—, —CO—, —COO—, —OCO—, —SO$_2$—, —NR$^L$—, NR$^L$CO—, —CONR$^L$—, —NR$^L$SO$_2$—, —SO$_2$NR$^L$—, a group of a combination of these groups. $R^L$ represents a hydrogen atom, an alkyl group, or an aryl group. The hydrocarbon group may be an aliphatic hydrocarbon group or an aromatic hydrocarbon group.

Examples of the hydrocarbon group include an alkylene group, an arylene group, and a group obtained by removing one or more hydrogen atoms from these groups. The number of carbon atoms in the alkylene group is preferably 1 to 30, more preferably 1 to 15, and still more preferably 1 to 10. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10. The heterocyclic group is preferably a monocyclic ring or a fused ring having 2 to 4 fused rings. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and still more preferably 3 to 12. The hydrocarbon group and heterocyclic group may have a substituent. Examples of the substituent include groups in the description of the substituent T described above. The number of carbon atoms in the alkyl group represented by $R^L$ is preferably 1 to 20, more preferably 1 to 15, and still more preferably 1 to 8. The alkyl group may be linear, branched, or cyclic, and is preferably linear or branched and more preferably linear. The alkyl group represented by $R^L$ may further have a substituent. Examples of the substituent include the above-described substituent T. The number of carbon atoms in the aryl group represented by $R^L$ is preferably 6 to 30, more preferably 6 to 20, and still more preferably 6 to 12. The aryl group represented by $R^L$ may further have a substituent. Examples of the substituent include the above-described substituent T.

Specific examples of the pigment derivative include compounds described in Examples. In a case where the photosensitive composition according to the embodiment of the present invention contains a pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is within the above-described range, dispersibility of the pigment can be enhanced, and aggregation of the pigment can be efficiently suppressed. In a case where the photosensitive composition according to the embodiment of the present invention includes two or more kinds of pigment derivatives, it is preferable that the total content thereof is within the above-described range.

<<Polymerizable Compound>>

The photosensitive composition according to the embodiment of the present invention contains a polymerizable compound. As the polymerizable compound, a known compound which is cross-linkable by a radical, an acid, or heat can be used. In the present invention, the polymerizable compound is preferably, for example, a compound having an ethylenically unsaturated bonding group. Examples of the ethylenically unsaturated bonding group include a vinyl group, a (meth)allyl group, and a (meth)acryloyl group. The polymerizable compound used in the present invention is preferably a radically polymerizable compound.

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more.

The polymerizable compound is preferably a compound including 3 or more ethylenically unsaturated bonding groups, more preferably a compound including 3 to 15 ethylenically unsaturated bonding groups, and still more preferably a compound having 3 to 6 ethylenically unsaturated bonding groups. In addition, the polymerizable compound is preferably a 3-functional to 15-functional (meth) acrylate compound and more preferably a 3-functional to 6-functional (meth)acrylate compound. Specific examples of the polymerizable compound include compounds described in paragraphs "0095" to "0108" of JP2009-288705A, paragraph "0227" of JP2013-029760A, paragraphs "0254" to "0257" of JP2008-292970A, paragraphs "0034" to "0038" of JP2013-253224A, paragraph "0477" of JP2012-208494A, JP2017-048367A, JP6057891B, and JP6031807B, the contents of which are incorporated herein by reference.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa (meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which the (meth)acryloyl group of these compounds is bonded through an ethylene glycol and/or a propylene glycol residue (for example, SR454 and SR499 which are commercially available from Sartomer) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A -TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an acid group can also be used. By using a polymerizable compound having an acid group, the polymerizable compound in an unexposed area is easily removed during development and the generation of the development residue can be suppressed. Examples of the acid group include a carboxyl group, a sulfo group, and a phosphoric acid group, and a carboxyl group is preferable. Examples of a commercially available product of the polymerizable compound having an acid group include ARONIX M-510, M-520, and ARONIX TO-2349 (manufactured by TOAGOSEI CO., LTD.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

The polymerizable compound is preferably a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a 3-functional to 6-functional (meth) acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having four ethyleneoxy groups, and KAYARAD TPA-330 manufactured by Nippon Kayaku Co., Ltd, which is a trifunctional (meth)acrylate having three isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, AI-600, and LINC-202UA (manufactured by KYOEISHA CHEMICAL Co., Ltd.) can also be used.

The content of the polymerizable compound in the total solid content of the photosensitive composition is preferably 0.1 to 60 mass %. The lower limit is more preferably 0.5 mass % or more and still more preferably 1 mass % or more. The upper limit is more preferably 55 mass % or less and still more preferably 50 mass % or less. In a case where the photosensitive composition according to the embodiment of the present invention includes two or more kinds of polymerizable compounds, it is preferable that the total content thereof is within the above-described range.

<<Photopolymerization Initiator>>

The photosensitive composition according to the embodiment of the present invention contains a photopolymerization initiator. The photopolymerization initiator can be appropriately selected from known photopolymerization initiators. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, and an acylphosphine compound is more preferable, and an oxime compound is still more preferable. The details of the photopolymerization initiator can be found in paragraphs "0065" to "0111" of JP2014-130173A and in JP6301489B, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF). Examples of a commercially available product of the α-aminoketone compound include IRGACURE-907, IRGACURE-369, IRGACURE-379, and IRGACURE-379EG (all of which are manufactured by BASF). Examples of a commercially available product of the acylphosphine compound include IRGACURE-819 and DAROCUR-TPO (both of which are manufactured by BASF).

Examples of the oxime compound include compounds described in JP2001-233842A, compounds described in JP2000-080068A, compounds described in JP2006-342166A, compounds described in J. C. S. Perkin II (1979, pp. 1653-1660), compounds described in J. C. S. Perkin II (1979, pp. 156-162), compounds described in Journal of Photopolymer Science and Technology (1995, pp. 202-232), compounds described in JP2000-066385A, compounds described in JP2000-080068A, compounds described in JP2004-534797A, compounds described in JP2006-342166A, compounds described in JP2017-019766A, compounds described in JP6065596B, compounds described in WO2015/152153A, compounds described in WO2017/051680A, compounds described in JP2017-198865A, and compounds described in paragraphs "0025" to "0038" of WO2017/164127A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of a commercially available product thereof include IRGACURE-OXE01, IRGACURE-OXE02, IRGACURE-OXE03, and IRGACURE-OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no coloring property or a compound having high transparency and being resistant to discoloration. Examples of a commercially available product thereof include ADEKA ARKLS NCI-730, NCI-831, and NCI-930 (all of which are manufactured by ADEKA Corporation).

In the present invention, an oxime compound having a fluorene ring can also be used as the photopolymerization initiator. Specific examples of the oxime compound having a fluorene ring include compounds described in JP2014-137466A. The content thereof is incorporated herein by reference.

In the present invention, an oxime compound having a fluorine atom can also be used as the photopolymerization initiator. Specific examples of the oxime compound having a fluorine atom include compounds described in JP2010-262028A, Compounds 24 and 36 to 40 described in JP2014-500852A, and Compound (C-3) described in JP2013-164471A. The content thereof is incorporated herein by reference.

In the present invention, an oxime compound having a nitro group can be used as the photopolymerization initiator. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by ADEKA Corporation).

In the present invention, an oxime compound having a benzofuran skeleton can also be used as the photopolymerization initiator. Specific examples thereof include OE-01 to OE-75 described in WO2015/036910A.

Specific examples of the oxime compound which are preferably used in the present invention are shown below, but the present invention is not limited thereto.

(C-1)
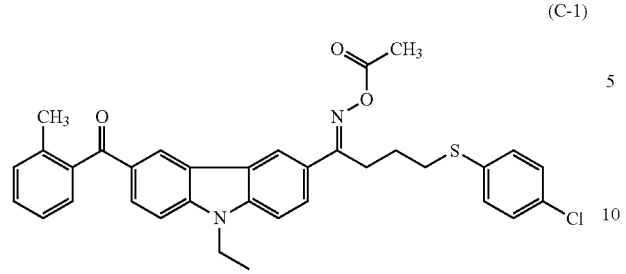
(C-2)
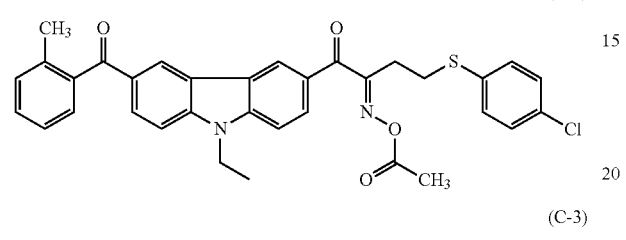
(C-3)
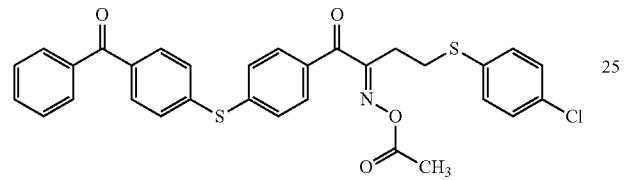
(C-4)
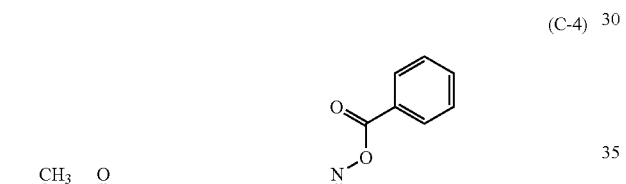
(C-5)
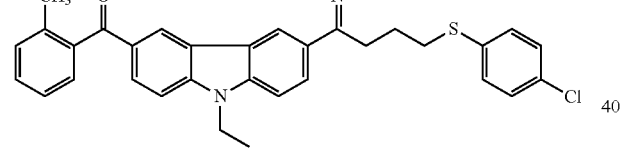
(C-6)
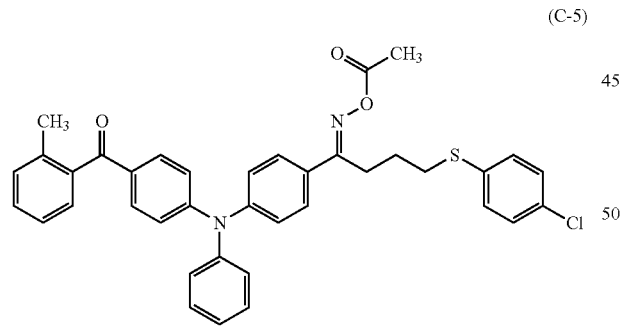
(C-7)
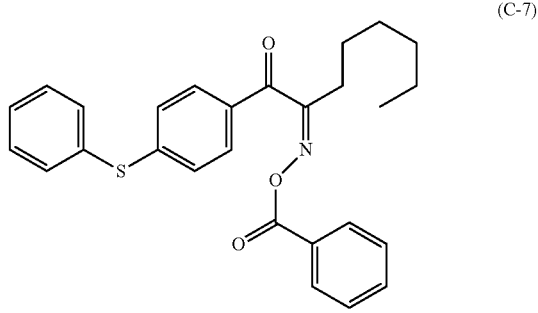
(C-8)
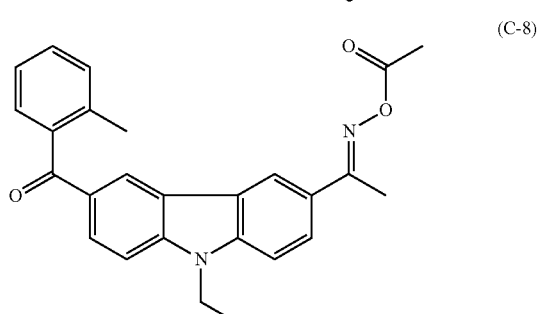
(C-9)
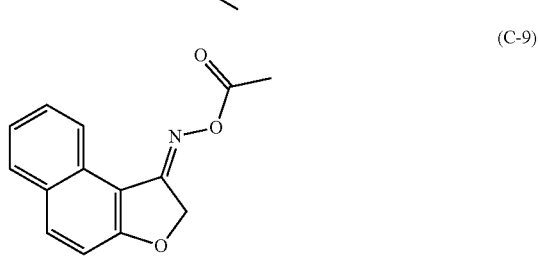
(C-10)
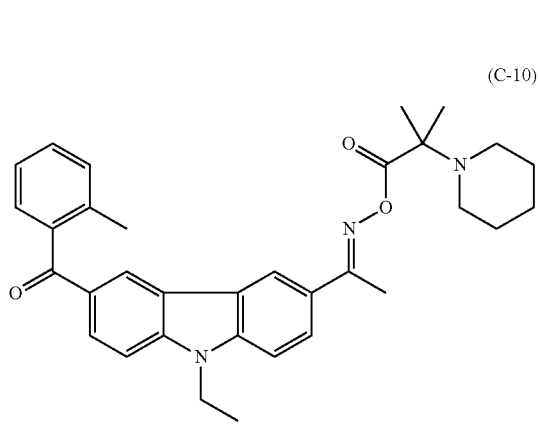
(C-11)
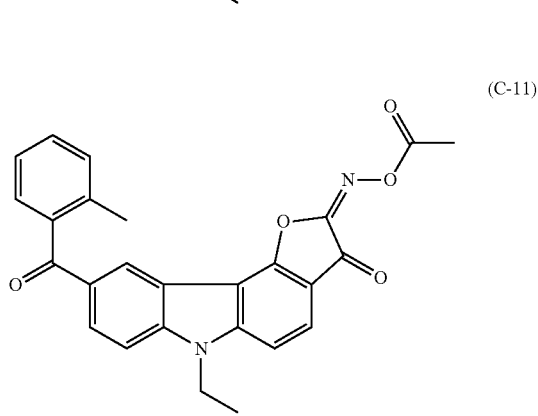

-continued

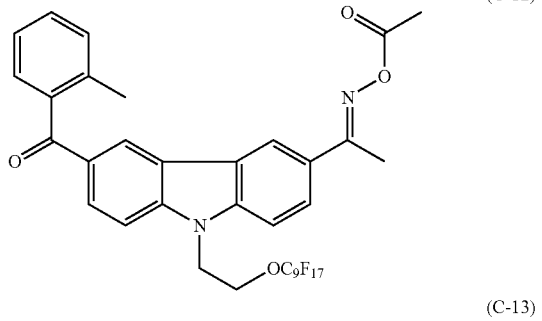
(C-12)

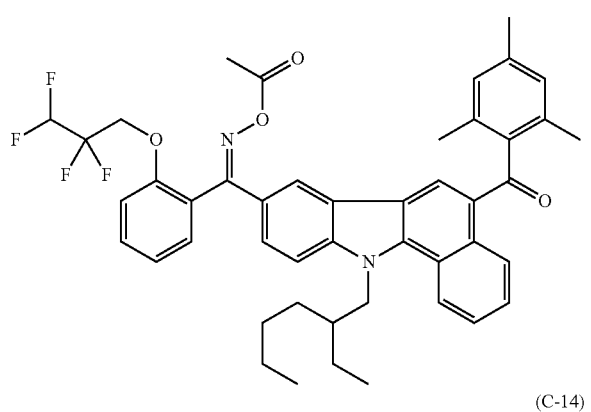
(C-13)

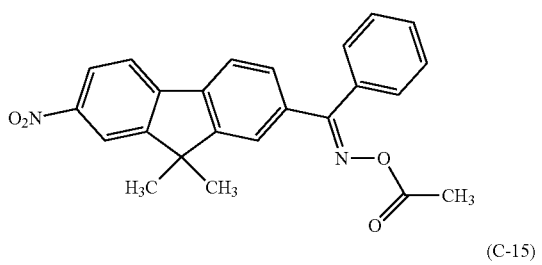
(C-14)

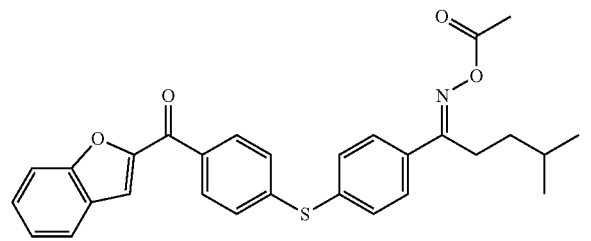
(C-15)

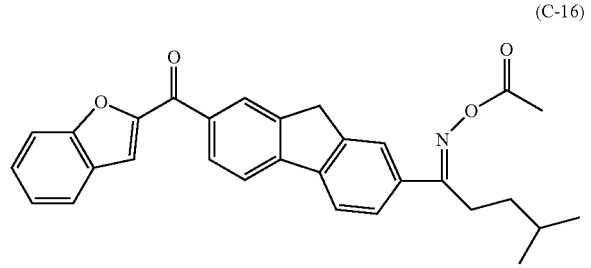
(C-16)

The oxime compound is preferably a compound having a maximum absorption wavelength in a wavelength range of 350 to 500 nm and more preferably a compound having a maximum absorption wavelength in a wavelength range of 360 to 480 nm. In addition, from the viewpoint of sensitivity, the molar absorption coefficient of the oxime compound at a wavelength of 365 nm or at a wavelength of 405 nm is preferably high, more preferably 1,000 to 300,000, still more preferably 2,000 to 300,000, and particularly preferably 5,000 to 200,000. The molar absorption coefficient of a compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, as the photopolymerization initiator, a bifunctional or tri- or more functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the composition can be improved. Specific examples of the bifunctional or tri- or more functional photoradical polymerization initiator include dimers of the oxime compounds described in JP2010-527339A, JP2011-524436A, WO2015/004565A, paragraphs "0407" to "0412" of JP2016-532675A, and paragraphs "0039" to "0055" of WO2017/033680A; the compound (E) and compound (G) described in JP2013-522445A; Cmpd 1 to 7 described in WO2016/034963A; the oxime ester photoinitiators described in paragraph "0007" of JP2017-523465A; the photoinitiators described in paragraphs "0020" to "0033" of JP2017-167399A; and the photopolymerization initiator (A) described in paragraphs "0017" to "0026" of JP2017-151342A.

It is also preferable that the photopolymerization initiator includes an oxime compound and an α-aminoketone compound. By using the oxime compound and the α-aminoketone compound in combination, developability is improved, and a pattern having excellent rectangularity is likely to be formed. In a case where an oxime compound and an α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator in the total solid content of the photosensitive composition is preferably 0.1 to 50 mass %, more preferably 0.5 to 30 mass %, and still more preferably 1 to 20 mass %. In a case where the content of the photopolymerization initiator is within the above-described range, better sensitivity and pattern formability can be obtained. In a case where the photosensitive composition according to the embodiment of the present invention includes two or more kinds of photopolymerization initiators, it is preferable that the total content thereof is within the above-described range.

<<Solvent>>

The photosensitive composition according to the embodiment of the present invention contains a solvent. Examples of the solvent include an organic solvent. Basically, the solvent is not particularly limited as long as it satisfies the solubility of the respective components and the application properties of the photosensitive composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide and 3-butoxy-N,N-dimethylpropanamide are also preferable from the viewpoint of improving solubility. In this case, it may be preferable that the content of aromatic hydrocarbons (such as benzene, toluene, xylene, and ethylbenzene) as the solvent is low (for example, 50 parts per million (ppm) by mass or less, 10 ppm by mass or less, or 1 ppm by mass or less with respect to the total amount of the organic solvent) in consideration of environmental aspects and the like.

In the present invention, a solvent having a low metal content is preferably used. For example, the metal content in the solvent is preferably 10 mass parts per billion (ppb) or less. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method for removing impurities such as a metal from the solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The solvent may include isomers (compounds having the same number of atoms and different structures). In addition, only one kind of isomers may be included, or a plurality of isomers may be included.

In the present invention, as the organic solvent, an organic solvent containing 0.8 mmol/L or less of a peroxide is preferable, and an organic solvent containing substantially no peroxide is more preferable.

The content of the solvent is preferably 10 to 90 mass % with respect to the total amount of the photosensitive composition according to the embodiment of the present invention. The lower limit is preferably 20 mass % or more, more preferably 30 mass % or more, still more preferably 40 mass % or more, even more preferably 50 mass % or more, and particularly preferably 60 mass % or more.

In addition, from the viewpoint of environmental regulation, it is preferable that the photosensitive composition according to the embodiment of the present invention does not substantially contain environmentally regulated substances. In the present invention, the description "does not substantially contain environmentally regulated substances" means that the content of the environmentally regulated substances in the photosensitive composition is 50 ppm by mass or less, preferably 30 ppm by mass or less, still more preferably 10 ppm by mass or less, and particularly preferably 1 ppm by mass or less. Examples of the environmentally regulated substances include benzenes; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent in a case of producing respective components used in the photosensitive composition according to the embodiment of the present invention, and may be incorporated into the photosensitive composition as a residual solvent. From the viewpoint of human safety and environmental considerations, it is preferable to reduce these substances as much as possible. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, or photosensitive composition produced by mixing these compounds.

<<Resin>>

The photosensitive composition according to the embodiment of the present invention preferably contains a resin. The resin is blended in, for example, an application for dispersing particles such as a pigment in a photosensitive composition or an application as a binder. The resin which is mainly used to disperse particles of the pigments and the like will also be called a dispersant. However, such applications of the resin are merely exemplary, and the resin can also be used for other purposes in addition to such applications.

The weight-average molecular weight (Mw) of the resin is preferably 3000 to 2000000. The upper limit is preferably 1000000 or less and more preferably 500000 or less. The lower limit is preferably 4000 or more and more preferably 5000 or more.

Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. Among these resins, one kind may be used alone, or a mixture of two or more kinds may be used. In addition, resins described in paragraphs "0041" to "0060" of JP2017-206689A, and resins described in paragraphs "0022" to "007" of JP2018-010856A can also be used.

In the present invention, as the resin, a resin having an acid group can be preferably used. According to this aspect, developability of the photosensitive composition can be improved, and pixels having excellent rectangularity can be easily formed. Examples of the acid group include a carboxyl group, a phosphoric acid group, a sulfo group, and a phenolic hydroxy group, and a carboxyl group is preferable. The resin having an acid group can be used, for example, as an alkali-soluble resin.

The resin having an acid group preferably includes a repeating unit having an acid group in the side chain, and more preferably includes 5 to 70 mol % of repeating units having an acid group in the side chain with respect to the total repeating units of the resin. The upper limit of the content of the repeating unit having an acid group in the side chain is preferably 50 mol % or less and more preferably 30 mol % or less. The lower limit of the content of the repeating unit having an acid group in the side chain is preferably 10 mol % or more and more preferably 20 mol % or more.

It is also preferable that the resin having an acid group includes a repeating unit having an ethylenically unsaturated bonding group in the side chain. According to this aspect, a film having excellent solvent resistance while having excellent developability is easily obtained. Examples of the ethylenically unsaturated bonding group include a vinyl group, a (meth)allyl group, and a (meth)acryloyl group.

It is also preferable that the resin having an acid group includes a repeating unit derived from a monomer component including a compound represented by Formula (ED1) and/or a compound represented by Formula (ED2) (hereinafter, these compounds may be referred to as an "ether dimer").

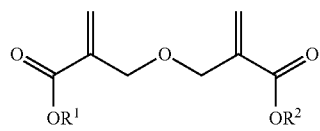
(ED1)

In Formula (ED1), $R^1$ and $R^2$ each independently represent a hydrogen atom or a hydrocarbon group having 1 to 25 carbon atoms which may have a substituent.

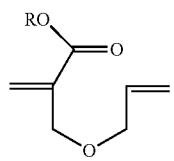
(ED2)

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

Specific examples of the ether dimer can be found in paragraph "0317" of JP2013-029760A, the content of which is incorporated herein by reference.

It is also preferable that the resin used in the present invention includes a repeating unit derived from a compound represented by Formula (X).

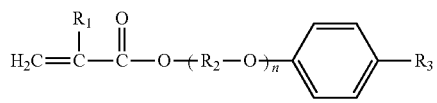
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

With regard to the resin having an acid group, reference can be made to the description in paragraphs "0558" to "0571" of JP2012-208494A (paragraphs "0685" to "0700" of the corresponding US2012/0235099A) and the description in paragraphs "0076" to "0099" of JP2012-198408A, the contents of which are incorporated herein by reference. In addition, as the resin having an acid group, a commercially available product may also be used.

The acid value of the resin having an acid group is preferably 30 to 500 mgKOH/g. The lower limit is preferably 50 mgKOH/g or more and more preferably 70 mgKOH/g or more. The upper limit is preferably 400 mgKOH/g or less, more preferably 300 mgKOH/g or less, and still more preferably 200 mgKOH/g or less. The weight-average molecular weight (Mw) of the resin having an acid group is preferably 5000 to 100000. In addition, the number-average molecular weight (Mn) of the resin having an acid group is preferably 1000 to 20000.

Examples of the resin having an acid group include resins having the following structures.

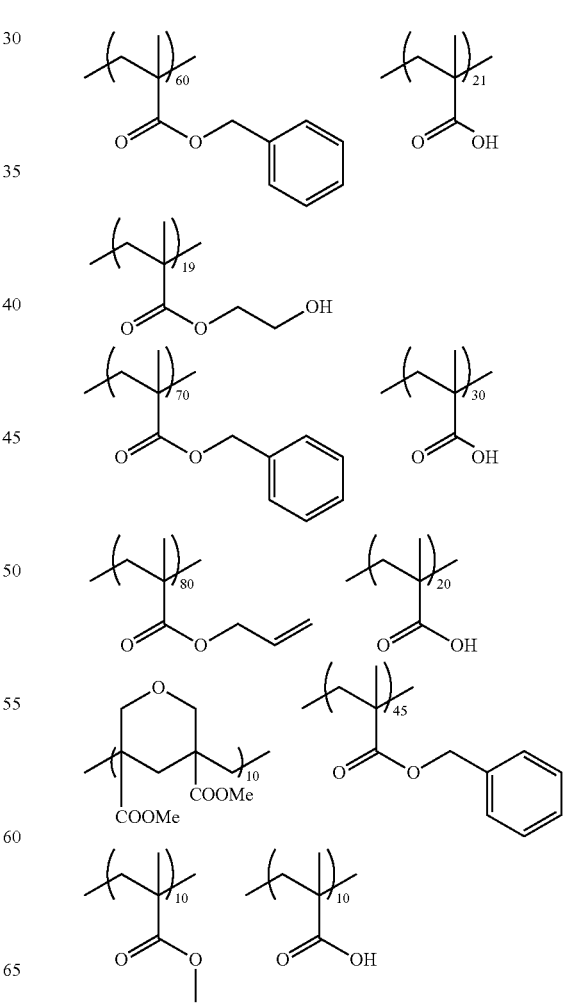

-continued

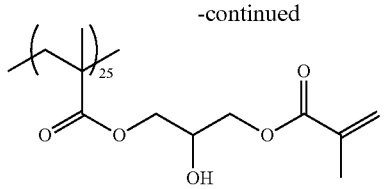

The photosensitive composition according to the embodiment of the present invention can also include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total content of the acid group and the basic group is 100 mol %, and more preferably a resin substantially consisting of only an acid group. The acid group in the acidic dispersant (acidic resin) is preferably a carboxyl group. The acid value of the acidic dispersant (acidic resin) is preferably 40 mgKOH/g or more, more preferably 50 mgKOH/g or more, still more preferably 60 mgKOH/g or more, even more preferably 70 mgKOH/g or more, and particularly preferably 80 mgKOH/g or more. The upper limit is preferably 200 mgKOH/g or less and still more preferably 150 mgKOH/g or less. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total content of the acid group and the basic group is 100 mol %. The basic group in the basic dispersant is preferably an amino group.

It is preferable that the resin used as a dispersant includes a repeating unit having an acid group. In a case where the resin used as a dispersant includes a repeating unit having an acid group, the generation of the development residue can be further suppressed in the formation of a pattern by a photolithography method.

It is also preferable that the resin used as a dispersant is a graft resin. With regard to details of the graft resin, reference can be made to the description in paragraphs "0025" to "0094" of JP2012-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraphs "0102" to "0166" of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraphs "0196" to "0209" of JP2013-043962A.

In addition, the above-described resin (alkali-soluble resin) having an acid group can also be used as a dispersant.

In addition, it is also preferable that the resin used as a dispersant is a resin including a repeating unit having an ethylenically unsaturated bonding group in the side chain. According to this aspect, a film having excellent solvent resistance while having excellent developability is easily obtained. Examples of the ethylenically unsaturated bonding group include a vinyl group, a (meth)allyl group, and a (meth)acryloyl group. The content of the repeating unit having an ethylenically unsaturated bonding group in the side chain is preferably 10 mol % or more, more preferably 10 to 80 mol %, and still more preferably 20 to 70 mol % with respect to all the repeating units of the resin.

A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. In addition, pigment dispersants described in paragraphs "0041" to "0130" of JP2014-130338A can also be used, the contents of which are incorporated herein by reference. The resin described as a dispersant can be used for an application other than the dispersant. For example, the resin can also be used as a binder.

The content of the resin in the total solid content of the photosensitive composition is preferably 5 to 60 mass %. The lower limit is preferably 10 mass % or more and more preferably 15 mass % or more. The upper limit is preferably 50 mass % or less, more preferably 45 mass % or less, and still more preferably 40 mass % or less.

In addition, the content of the resin (alkali-soluble resin) having an acid group in the total solid content of the photosensitive composition is preferably 5 to 60 mass %. The lower limit is preferably 10 mass % or more and more preferably 15 mass % or more. The upper limit is preferably 50 mass % or less, more preferably 45 mass % or less, and still more preferably 40 mass % or less.

In addition, from the reason that excellent developability is easily obtained, the content of the resin (alkali-soluble resin) having an acid group in the total amount of the resin is preferably 30 mass % or more, more preferably 50 mass % or more, still more preferably 70 mass % or more, and particularly preferably 80 mass % or more. The upper limit may be 100 mass %, 95 mass %, or 90 mass % or less.

In addition, the total content of the polymerizable compound and the resin in the total solid content of the photosensitive composition is preferably 0.1 to 80 mass %. The lower limit is preferably 0.5 mass % or more, more preferably 1.0 mass % or more, and still more preferably 2.0 mass % or more. The upper limit is preferably 75 mass % or less, more preferably 70 mass % or less, and still more preferably 60 mass % or less.

In addition, the photosensitive composition according to the embodiment of the present invention preferably contains 10 to 1000 parts by mass of the resin having an acid group with respect to 100 parts by mass of the polymerizable compound. The lower limit is preferably 20 parts by mass or more and more preferably 30 parts by mass or more. According to this aspect, excellent developability is easily obtained. The upper limit is preferably 900 parts by mass or less and more preferably 500 parts by mass or less. According to this aspect, excellent curability is easily obtained.

<<Compound having Epoxy Group>>

The photosensitive composition according to the embodiment of the present invention may contain a compound having an epoxy group (hereinafter, also referred to as an epoxy compound). Examples of the epoxy compound include a compound having one or more epoxy groups in one molecule, and a compound two or more epoxy groups in one molecule is preferable. The epoxy compound preferably has 1 to 100 epoxy groups in one molecule. The upper limit of the number of epoxy groups may be, for example, 10 or less or 5 or less. The lower limit of the number of epoxy groups is preferably 2 or more. As the epoxy compound, compounds described in paragraphs "0034" to "0036" of JP2013-011869A, paragraphs "0147" to "0156" of JP2014-043556A, and paragraphs "0085" to "0092" of JP2014-089408A, and compounds described in JP2017-179172A can also be used. The contents thereof are incorporated herein by reference.

The epoxy compound may be a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the epoxy compound is preferably 200 to 100000 and more preferably 500 to 50000. The upper limit of the weight-average molecular weight is preferably 10000 or less, more preferably 5000 or less, and still more preferably 3000 or less.

Examples of a commercially available product of the epoxy compound include EHPE3150 (manufactured by Daicel Corporation) and EPICLON N-695 (manufactured by DIC Corporation).

In a case where the photosensitive composition according to the embodiment of the present invention contains an epoxy compound, the content of the epoxy compound in the total solid content of the photosensitive composition is preferably 0.1 to 20 mass %. The lower limit is, for example, preferably 0.5 mass % or more, and more preferably 1 mass % or more. The upper limit is, for example, preferably 15 mass % or less and still more preferably 10 mass % or less. The epoxy compound contained in the photosensitive composition may be only one kind or two or more kinds thereof. In a case of using two or more kinds thereof, it is preferable that the total content thereof is within the above-described range.

<<Silane Coupling Agent>>

The photosensitive composition according to the embodiment of the present invention may contain a silane coupling agent. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group. Among these, an amino group, a (meth)acryloyl group, or an epoxy group is preferable. Specific examples of the silane coupling agent include compounds described in paragraphs "0018" to "0036" of JP2009-288703A and compounds described in paragraphs "0056" to "0066" of JP2009-242604A, the contents of which are incorporated herein by reference.

In a case where the photosensitive composition according to the embodiment of the present invention contains a silane coupling agent, the content of the silane coupling agent in the total solid content of the photosensitive composition is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof. In a case of using two or more kinds thereof, it is preferable that the total content thereof is within the above-described range.

<<Polymerization Inhibitor>>

The photosensitive composition according to the embodiment of the present invention may contain a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), an N-nitrosophenylhydroxyamine salt (an ammonium salt, a cerous salt, or the like), and 2,2,6,6-tetramethylpiperidine 1-oxyl. The content of the polymerization inhibitor in the total solid content of the photosensitive composition is preferably 0.0001 to 5 mass %. In a case where the photosensitive composition according to the embodiment of the present invention includes two or more kinds of polymerization inhibitors, it is preferable that the total content thereof is within the above-described range.

<<Surfactant>>

The photosensitive composition according to the embodiment of the present invention may contain a surfactant. As the surfactant, various surfactants such as a fluorine surfactant, a nonionic surfactant, a cationic surfactant, an anionic surfactant, or a silicon-based surfactant can be used. With regard to the surfactant, reference can be made to the description in paragraphs "0238" to "0245" of WO2015/166779A, the contents of which are incorporated herein by reference.

In the present invention, it is preferable that the surfactant is a fluorine surfactant. By containing a fluorine surfactant in the photosensitive composition, liquid characteristics (particularly, fluidity) are further improved, and liquid saving properties can be further improved. In addition, it is possible to form a film with a small thickness unevenness.

The fluorine content in the fluorine surfactant is preferably 3 to 40 mass %, more preferably 5 to 30 mass %, and still more preferably 7 to 25 mass %. The fluorine surfactant in which the fluorine content is within the above-described range is effective in terms of the evenness of the thickness of the coating film or liquid saving properties and the solubility of the surfactant in the photosensitive composition is also good.

Examples of the fluorine surfactant include surfactants described in paragraphs "0060" to "0064" of JP2014-041318A (paragraphs "0060" to "0064" of the corresponding WO2014/017669A) and the like, and surfactants described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound which has a molecular structure having a functional group containing a fluorine atom and in which, by applying heat to the molecular structure, the functional group containing a fluorine atom is broken to volatilize a fluorine atom can be used. Examples of such a fluorine surfactant include MEGAFACE DS series manufactured by DIC Corporation (for example, MEGAFACE DS-21).

In addition, as the fluorine surfactant, a copolymer of a fluorine atom-containing vinyl ether compound having a fluorinated alkyl group or a fluorinated alkylene ether group, and a hydrophilic vinyl ether compound can be used. With regard to such a fluorine surfactant, reference can be made to the description in JP2016-216602A, the contents of which are incorporated herein by reference.

As the fluorine surfactant, a block polymer can also be used. Examples of the block polymer include compounds described in JP2011-089090A. In addition, as the fluorine surfactant, a fluorine-containing copolymer including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can be used. For example, the following compound can also be used as the fluorine surfactant used in the present invention.

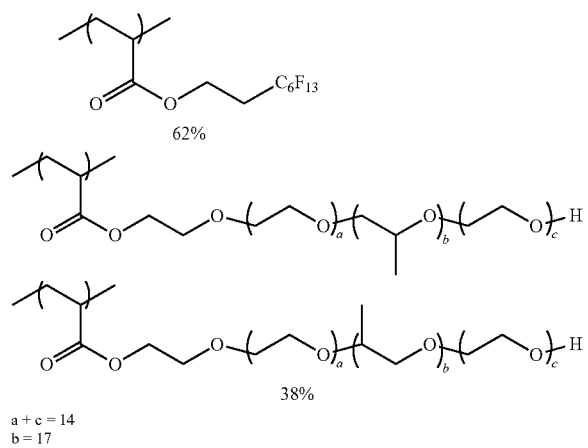

a + c = 14
b = 17

The weight-average molecular weight of the compound is preferably 3000 to 50000 and, for example, 14000. In the compound, "%" representing the proportion of a repeating unit is mol %.

In addition, as the fluorine surfactant, a fluorine-containing copolymer including a repeating unit having an ethylenically unsaturated group in the side chain can be used. Specific examples thereof include compounds described in paragraphs "0050" to "0090" and paragraphs "0289" to "0295" of JP2010-164965A, and MEGAFACE RS-101, RS-102, RS-718K, and RS-72-K manufactured by DIC Corporation. In addition, as the fluorine surfactant, compounds described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Corporation), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil & Fat Co., Ltd.), and OLFINE E1010 and SURFYNOL 104, 400, and 440 (all of which are manufactured by Nissin Chemical Co., Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6001, and KF-6002 (all of which are manufactured by Shin-Etsu Chemical Co., Ltd.), and BYK307, BYK323, and BYK330 (all of which are manufactured by BYK Chemie). The content of the surfactant in the total solid content of the photosensitive composition is preferably 0.001 to 5.0 mass % and more preferably 0.005 to 3.0 mass %. In a case where the photosensitive composition according to the embodiment of the present invention includes two or more kinds of surfactants, it is preferable that the total content thereof is within the above-described range.

<<Ultraviolet Absorber>>

The photosensitive composition according to the embodiment of the present invention may contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, and the like can be used. With regard to details thereof, reference can be made to the description in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Examples of a commercially available product of the ultraviolet absorber include UV-503 (manufactured by Daito Chemical Co., Ltd.). In addition, compounds described in Examples can also be used. In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraphs "0049" to "0059" of JP6268967B can also be used. The content of the ultraviolet absorber in the total solid content of the photosensitive composition is preferably 0.01 to 10 mass % and more preferably 0.01 to 5 mass %. In a case where the photosensitive composition according to the embodiment of the present invention includes two or more kinds of ultraviolet absorbers, it is preferable that the total content thereof is within the above-described range.

<<Other Additives>>

Various additives such as a filler, an adhesion promoter, an antioxidant, a potential antioxidant, and an aggregation inhibitor can be blended into the photosensitive composition according to the embodiment of the present invention as necessary. Examples of these additives include additives described in paragraphs "0155" and "0156" of JP2004-295116A, the contents of which are incorporated herein by reference. In addition, examples of the antioxidant include a phenol compound, a phosphorus-based compound (for example, compounds described in paragraphs "0042" of JP2011-090147A), a thioether compound. In addition, antioxidants described in WO2017/164024A can also be used. Examples of a commercially available product of the antioxidant include ADK STAB series (AO-20, AO-30, AO-40, AO-50, AO-50F. AO-60, AO-60G, AO-80, AO-330, and the like) manufactured by ADEKA Corporation. In addition, compounds described in Examples can also be used. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid/a base catalyst. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation).

In addition, in order to adjust the refractive index of the film to be obtained, the photosensitive composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and most preferably 5 to 50 nm. The metal oxide may have a core-shell structure, and in this case, the core portion may be hollow.

In addition, the photosensitive composition according to the embodiment of the present invention may include a light-resistance improver. Examples of the light-resistance improver include the compounds described in paragraphs "0036" and "0037" of JP2017-198787A, the compounds described in paragraphs "0029" to "0034" of JP2017-146350A, the compounds described in paragraphs "0036" and "0037", and "0049" to "0052" of JP2017-129774A, the compounds described in paragraphs "0031" to "0034", "0058", and "0059" of JP2017-129674A, the compounds described in paragraphs "0036" and "0037", and "0051" to "0054" of JP2017-122803A, the compounds described in paragraphs "0025" to "0039" of WO2017/164127A, the compounds described in paragraphs "0034" to "0047" of JP2017-186546A, the compounds described in paragraphs "0019" to "0041" of JP2015-025116A, the compounds described in paragraphs "0101" to "0125" of JP2012-145604A, the compounds described in paragraphs "0018" to "0021" of JP2012-103475A, the compounds described in paragraphs "0015" to "0018" of JP2011-257591A, the compounds described in paragraphs "0017" to "0021" of JP2011-191483A, the compounds described in paragraphs "0108" to "0116" of JP2011-145668A, and the compounds described in paragraphs "0103" to "0153" of JP2011-253174A.

The viscosity (at 25° C.) of the photosensitive composition according to the embodiment of the present invention is preferably 1 to 100 mPa×s. The lower limit is more preferably 2 mPa×s or more and still more preferably 3 mPa×s or more. The upper limit is more preferably 50 mPa×s or less, still more preferably 30 mPa×s or less, and particularly preferably 15 mPa×s or less.

In the photosensitive composition according to the embodiment of the present invention, the content of free metal which is not bonded to or coordinated with a pigment or the like is preferably 100 ppm or less, more preferably 50 ppm or less, and still more preferably 10 ppm or less, it is particularly preferable to not contain the free metal substantially. According to this aspect, effects such as stabilization of pigment dispersibility (restraint of aggregation), improvement of spectral characteristics due to improvement of dispersibility, restraint of conductivity fluctuation due to stabilization of curable components or elution of metal atoms and metal ions, and improvement of display characteristics can be expected. Furthermore, the effects described in JP2012-153796A, JP2000-345085A, JP2005-200560A, JP1996-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can also be obtained. Examples of the types of the above-described free metals include Na, K, Ca, Sc, Ti, Mn, Cu, Zn, Fe, Cr, Fe, Co, Mg, Al, Ti, Sn, Zn, Zr, Ga, Ge, Ag, Au, Pt, Cs, and Bi. In addition, in the photosensitive composition according to the embodiment of the present invention, the content of free halogen which is not bonded to or coordinated with a pigment or the like is preferably 100 ppm or less, more preferably 50 ppm or less, and still more preferably 10 ppm or less, it is particularly preferable to not contain the free halogen substantially. Examples of a method for reducing free metals and halogens in the photosensitive composition include washing with ion exchange water, filtration, ultrafiltration, and purification with an ion exchange resin.

A storage container of the photosensitive composition according to the embodiment of the present invention is not particularly limited, and a known storage container can be used. In addition, as the storage container, in order to suppress infiltration of impurities into the raw materials or the photosensitive composition, a multilayer bottle in which a container inner wall having a six-layer structure is formed of six kinds of resins or a bottle in which a container inner wall having a seven-layer structure is formed of six kinds of resins is preferably used. Examples of such a container include a container described in JP2015-123351A. In addition, storage conditions of the photosensitive composition according to the embodiment of the present invention is not particularly limited, and a known method in the related art can be used. In addition, a method described in JP2016-180058A can be used.

<Method for Preparing Photosensitive Composition>

The photosensitive composition according to the embodiment of the present invention can be prepared by mixing the above-described components with each other. During the preparation of the photosensitive composition, all the components may be dissolved or dispersed in a solvent at the same time to prepare the photosensitive composition. Optionally, two or more solutions or dispersion liquids in which the respective components are appropriately blended may be prepared, and the solutions or dispersion liquids may be mixed with each other during use (during application) to prepare the photosensitive composition.

In addition, in the preparation of the photosensitive composition, a process of dispersing the pigment is preferably included. In the process of dispersing the pigment, examples of a mechanical force which is used for dispersing the pigment include compression, pressing, impact, shear, and cavitation. Specific examples of a unit for performing these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. In addition, it is preferable that rough particles are removed by filtering, centrifugal separation, and the like after pulverization treatment. In addition, as the process and dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph "0022" of JP2015-157893A can be used. In addition, in the process of dispersing the pigment, a refining treatment of pigments in a salt milling step may be performed. A material, a device, process conditions, and the like used in the salt milling step can be found in, for example, JP2015-194521A and JP2012-046629A.

During the preparation of the photosensitive composition, it is preferable that the photosensitive composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NXIY and the like), Advantec Toyo Kaisha, Ltd., Nihon Entegris G.K. (formerly Nippon Microlith Co., Ltd.), Kitz Microfilter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and the filtering using the second filter may be performed on a mixture of the dispersion liquid and other components.

<Cured Film>

Next, a cured film according to an embodiment of the present invention will be described. The cured film according to the embodiment of the present invention is obtained from the above-described photosensitive composition according to the embodiment of the present invention. The cured film according to the embodiment of the present invention can be preferably used as a near-infrared cut filter, a near-infrared transmitting filter, and the like.

The cured film according to the embodiment of the present invention may be used in a state where it is laminated on a support, or may be used in a state where it is peeled off from a support. Examples of the support include a semiconductor base material such as silicon and a transparent base material. The transparent base material is not particularly limited as long as it is formed of a material which can allow transmission of at least visible light. Examples thereof include a base material formed of a material such as glass, crystal, and resin. Glass is preferable as the material of the transparent base material. That is, the transparent base material is preferably a glass base material. Examples of the glass include soda lime glass, borosilicate glass, non-alkali glass, quartz glass, and copper-containing glass. Examples of the copper-containing glass include a phosphate glass containing copper and a fluorophosphate glass containing copper. Examples of a commercially available product of the copper-containing glass include NF-50 (manufactured by AGC Techno Glass Co., Ltd.). Examples of the crystal include rock crystal, lithium niobate, and sapphire. Examples of the resin include polyester resins such as polyethylene terephthalate and polybutylene terephthalate, polyolefin resins such as polyethylene, polypropylene, and ethylene vinyl acetate copolymer, norbornene resin, acrylic resins such as polyacrylate and polymethylmethacrylate, urethane resin, vinyl chloride resin, fluororesin, polycarbonate resin, polyvinyl butyral resin, and polyvinyl alcohol resin. In addition, in order to enhance adhesiveness between the support and the cured film according to the embodiment of the present invention, an underlayer or the like may be provided on the surface of the support.

In a case where the cured film according to the embodiment of the present invention is used as a near-infrared cut filter, it is preferable that the cured film according to the embodiment of the present invention has a maximum absorption wavelength in a range of 700 to 1200 nm. The average light transmittance in a wavelength range of 400 to 550 nm is preferably 70% or more, more preferably 80% or more, still more preferably 85% or more, and particularly preferably 90% or more. In addition, the light transmittance in the entire wavelength range of 400 to 550 nm is preferably 70% or more, more preferably 80% or more, and still more preferably 90% or more. In addition, the light transmittance at at least one point in a wavelength range of 700 to 1000 nm is preferably 20% or less, more preferably 15% or less, and still more preferably 10% or less.

In a case where the cured film according to the embodiment of the present invention is used as a near-infrared transmitting filter, it is preferable that the cured film according to the embodiment of the present invention has, for example, any one of the following spectral characteristic (1) or (2).

(1): cured film in which the maximum value of the light transmittance of the film in a thickness direction in a wavelength range of 400 to 830 nm is 20% or less (preferably 15% or less and more preferably 10% or less) and the minimum value of the light transmittance of the film in a thickness direction in a wavelength range of 1000 to 1300 nm is 70% or more (preferably 75% or more and more preferably 80% or more). This cured film can shield light having the wavelength range of 400 to 830 nm and can transmit light having a wavelength exceeding 940 nm.

(2): cured film in which the maximum value of the light transmittance of the film in a thickness direction in a wavelength range of 400 to 950 nm is 20% or less (preferably 15% or less and more preferably 10% or less) and the minimum value of the light transmittance of the film in a thickness direction in a wavelength range of 1100 to 1300 nm is 70% or more (preferably 75% or more and more preferably 80% or more). This cured film can shield light having the wavelength range of 400 to 950 nm and can transmit light having a wavelength exceeding 1040 nm.

The cured film according to the embodiment of the present invention can be used in combination with a color filter which includes a chromatic colorant. The color filter can be manufactured using a coloring composition including a chromatic colorant. Examples of the chromatic colorant include the chromatic colorant described above. The coloring composition can further contain a curable compound, a photopolymerization initiator, a surfactant, a solvent, a polymerization inhibitor, an ultraviolet absorber, and the like. Examples of the details thereof include the above-described materials, and these can be used.

In a case where the cured film according to the embodiment of the present invention is used as a near-infrared cut filter and used in combination with a color filter, it is preferable that the color filter is disposed on an optical path of the cured film according to the embodiment of the present invention. For example, the cured film according to the embodiment of the present invention and the color filter can be laminated to be used as a laminate. In the laminate, the cured film according to the embodiment of the present invention and the color filter may be or may not be adjacent to each other in a thickness direction. In a case where the cured film according to the embodiment of the present invention is not adjacent to the color filter in the thickness direction, the cured film according to the embodiment of the present invention may be formed on another support other than a support on which the color filter is formed, or another member (for example, a microlens or a planarizing layer) constituting a solid-state imaging element may be interposed between the cured film according to the embodiment of the present invention and the color filter.

The thickness of the cured film according to the embodiment of the present invention can be appropriately adjusted according to the purpose. The thickness of the cured film is preferably 20 μm or less, more preferably 10 μm or less, and still more preferably 5 μm or less. The lower limit of the thickness of the cured film is preferably 0.1 μm or more, more preferably 0.2 μm or more, and still more preferably 0.3 μm or more.

In the present invention, a near-infrared cut filter refers to a filter which allows transmission of light (visible light) in the visible range and shields at least a part of light (near infrared light) in the near infrared range. The near-infrared cut filter may be a filter which allows transmission of light in the entire wavelength range of the visible range, or may be a filter which allows transmission of light in a specific wavelength range of the visible range and shields light in another specific wavelength range of the visible range. In addition, in the present invention, a color filter refers to a filter which allows transmission of light in a specific wavelength range of the visible range and shields light in another specific wavelength range of the visible range. In addition, in the present invention, a near-infrared transmitting filter refers to a filter which shields visible light and allows transmission of at least a part of near infrared light.

<Optical Filter>

Next, an optical filter according to an embodiment of the present invention will be described. The optical filter according to an embodiment of the present invention has the cured film according to the embodiment of the present invention. Examples of the optical filter include a near-infrared cut filter and a near-infrared transmitting filter.

In a case where the optical filter according to the embodiment of the present invention is used as a near-infrared transmitting filter, examples of the near-infrared transmitting filter include a filter which shields visible light and transmits light having a wavelength of 900 nm or more.

In the optical filter, the thickness of the cured film according to the embodiment of the present invention can be appropriately adjusted according to the purpose. The thickness is preferably 20 μm or less, more preferably 10 μm or less, and still more preferably 5 μm or less. The lower limit is preferably 0.1 μm or more, more preferably 0.2 μm or more, and still more preferably 0.3 μm or more.

In a case where the optical filter according to the embodiment of the present invention is used as a near-infrared cut filter, the near-infrared cut filter may further have a dielectric multilayer film, an ultraviolet absorbing layer, and the like, in addition to the cured film according to the embodiment of the present invention. The details of the ultraviolet absorbing layer can be found in the description of an absorbing layer described in paragraphs "0040" to "0070" and "0119" to "0145" of WO2015/099060A, the content of which is incorporated herein by reference. Examples of the dielectric multilayer film include dielectric multilayer films described in paragraphs "0255" to "0259" of JP2014-041318A, the content of which is incorporated herein by reference.

In addition, in the optical filter according to the embodiment of the present invention, a protective layer may be provided on the surface of the cured film according to the embodiment of the present invention. By providing the protective layer, various functions such as oxygen shielding, low reflection, hydrophilicity/hydrophobicity, and shielding of light (ultraviolet rays, near infrared rays, and the like) having a specific wavelength can be imparted. The thickness of the protective layer is preferably 0.01 to 10 μm and still more preferably 0.1 to 5 μm. Examples of a method for forming the protective layer include a method of forming the protective layer by applying a resin composition dissolved in an organic solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polycarbonate resin, a polyacrylonitrile resin, a cellulose resin, Si, C, W, $Al_2O_3$, Mo, $SiO_2$, and $Si_3N_4$, and two or more kinds of these components may be contained. For example, in a case of a protective layer for oxygen shielding, it is preferable that the protective layer contains a polyol resin, $SiO_2$, and $Si_3N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an inkjet method can be used. As the organic solvent contained in the resin composition, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

Optionally, the protective layer may contain an additive such as organic or inorganic fine particles, an absorber of a specific wavelength (for example, ultraviolet rays, near infrared rays, and the like), a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of a specific wavelength, a known absorber can be used. Examples of the ultraviolet absorber and near-infrared absorber include the above-described materials. The content of these additives can be appropriately adjusted, but is preferably 0.1 to 70 mass % and still more preferably 1 to 60 mass % with respect to the total weight of the protective layer.

In addition, as the protective layer, the protective layers described in paragraphs "0073" to "0092" of JP2017-151176A can also be used.

The optical filter according to the embodiment of the present invention can be used in various devices including a solid-state imaging element such as a charge coupled device (CCD) or a complementary metal-oxide semiconductor (CMOS), an infrared sensor, or an image display device.

In addition, it is also preferable that the optical filter according to the embodiment of the present invention has a pixel of the cured film according to the embodiment of the present invention, and at least one pixel selected from a red pixel, a green pixel, a blue pixel, a magenta pixel, a yellow pixel, a cyan pixel, a black pixel, or an achromatic pixel.

It is also preferable that the optical filter according to the embodiment of the present invention has a pixel (pattern) of the film obtained using the near-infrared absorbing composition according to the embodiment of the present invention, and at least one pixel (pattern) selected from a red pixel, a green pixel, a blue pixel, a magenta pixel, a yellow pixel, a cyan pixel, a black pixel, or an achromatic pixel.

<Method for Forming Pattern>

Next, a method for forming a pattern according to an embodiment of the present invention will be described. The method for forming a pattern according to an embodiment of the present invention includes a step of forming a composition layer on a support using the above-described photosensitive composition according to the embodiment of the present invention, a step of patternwise exposing the composition layer, and a step of removing an unexposed area of the composition layer by development. Hereinafter, the respective steps will be described.

In the step of forming a composition layer, the composition layer is formed on a support using the photosensitive composition according to the embodiment of the present invention. The support to which the photosensitive composition is applied is not particularly limited, and examples thereof include a semiconductor base material such as silicon and the above-described transparent base material. An organic film or an inorganic film may be formed on the support. In addition, a charge coupled device (CCD), a complementary metal-oxide semiconductor (CMOS), a transparent conductive film, or the like may be formed on the support. In addition, a black matrix which separates respective pixels from each other may be formed on the support. In addition, optionally, an undercoat layer may be provided on the support to improve adhesiveness with a layer above the support, to prevent diffusion of substances, or to make the surface of the support flat. In addition, in a case where a glass base material is used as the support, it is preferable that an inorganic film is formed on the surface of the glass base material, or the glass base material is dealkalized to be used.

As a method of applying the photosensitive composition, a known method can be used. Examples of the known method include: a drop casting method; a slit coating method; a spray method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (published in February, 2005, S. B. Research Co., Ltd.) and methods described in JP2003-262716A, JP2003-185831A, JP2003-261827A, JP2012-126830A, and JP2006-169325A. In addition, with regard to the method of applying the resin composition, reference can be made to the description in WO2017/030174A and WO2017/018419A, the contents of which are incorporated herein by reference.

The composition layer formed by applying the photosensitive composition may be dried (pre-baked). In a case where pre-baking is performed, the pre-baking temperature is preferably 150° C. or lower, more preferably 120° C. or lower, and still more preferably 110° C. or lower. The lower limit may be, for example, 50° C. or higher or 80° C. or higher. By performing the pre-baking at the temperature of 150° C. or lower, even in a case where, for example, a photoelectric conversion film of an image sensor is formed of an organic material, the characteristics of the organic material can be more effectively maintained. The pre-baking time is preferably 10 to 3000 seconds, more preferably 40 to 2500 seconds, and still more preferably 80 to 220 seconds. Pre-baking can be performed using a hot plate, an oven, or the like.

Next, the composition layer is patternwise exposed. For example, the composition layer can be patternwise exposed using a stepper exposure device, a scanner exposure device, or the like through a mask having a predetermined mask pattern. As a result, an exposed portion of the composition layer can be cured.

Examples of the radiation (light) which can be used during the exposure include g-rays and i-rays. In addition, light (preferably light having a wavelength of 180 to 300 nm) having a wavelength of 300 nm or less can also be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50000000 W/m$^2$ or more, more preferably 100000000 W/m$^2$ or more, and still more preferably 200000000 W/m$^2$ or more. In addition, the upper limit of the maximum instantaneous illuminance is preferably 1000000000 W/m$^2$ or less, more preferably 800000000 W/m$^2$ or less, and still more preferably 500000000 W/m$^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

Next, the unexposed area of the composition layer is removed by development to form a pattern (pixel). The unexposed area of the composition layer can be removed by development using a developer. Thus, the composition layer of the unexposed area in the exposure step is eluted into the developer, and as a result, only a photocured portion remains. Examples of the developer include an organic solvent and an alkali developer. For example, the temperature of the developer is preferably 20° C. to 30° C. The development time is preferably 20 to 180 seconds. In addition, in order to further improve residues removing properties, a step of shaking the developer off per 60 seconds and supplying a new developer may be repeated multiple times.

As the developer, an alkaline aqueous solution (alkali developer) obtained by diluting an alkaline agent with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene; and an inorganic alkaline compound such as sodium hydroxide, potassium hydroxide, sodium carbonate, sodium bicarbonate, sodium silicate, and sodium metasilicate. In consideration of environmental aspects and safety aspects, the alkaline agent is preferably a compound having a high molecular weight. The concentration of the alkaline agent in the alkaline aqueous solution is preferably 0.001 to 10 mass % and more preferably 0.01 to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In addition, it is also preferable to wash (rinse) with pure water after development. In addition, it is preferable that the rinsing is performed by supplying a rinsing liquid to the composition layer after development while rotating the support on which the composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is also preferable to perform an additional exposure treatment or a heat treatment (post-baking) after carrying out drying. The additional exposure treatment or post-baking is a curing treatment which is performed after development to complete the curing. The heating temperature in the post-baking is, for example, preferably 100° C. to 240° C. and more preferably 200° C. to 240° C. The film after development is post-baked continuously or batchwise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be performed by the method described in KR10-2017-122130A.

<Solid-State Imaging Element>

A solid-state imaging element according to an embodiment of the present invention has the above-described cured film according to the embodiment of the present invention. The configuration of the solid-state imaging element according to the embodiment of the present invention is not particularly limited as long as it has the cured film according to the embodiment of the present invention and functions as a solid-state imaging element. For example, the following configuration can be adopted.

The solid-state imaging element includes a plurality of photodiodes and transfer electrodes on the support, the photodiodes constituting a light receiving area of the solid-state imaging element, and the transfer electrode consisting of polysilicon or the like. In the solid-state imaging element, a light-shielding film consisting of tungsten or the like which has openings through only light receiving sections of the photodiodes is provided on the photodiodes and the transfer electrodes, a device protective film consisting of silicon nitride or the like is formed on the light-shielding film so as to cover the entire surface of the light-shielding film and the light receiving sections of the photodiodes, and the cured film according to the embodiment of the present invention is formed on the device protective film. Furthermore, a configuration in which a light collecting unit (for example, a microlens; hereinafter, the same shall be applied) is provided above the device protective film and below the cured film according to the embodiment of the present invention (on a side thereof close the support), or a configuration in which a light collecting unit is provided on the film according to the embodiment of the present invention may be adopted. In addition, the pixels of each color in the color filter may be embedded in a space partitioned by a partition wall, for example, a space partitioned in a lattice form. In this case, it is preferable that the partition wall has a lower refractive index than each pixel. Examples of an imaging device having such a structure include devices described in JP2012-227478A and JP2014-179577A.

<Image Display Device>

An image display device according to an embodiment of the present invention has the cured film according to the embodiment of the present invention. Examples of the image display device include a liquid crystal display device or an organic electroluminescence (organic EL) display device. The definition and details of the image display device can be found in, for example, "Electronic Display Device (written by Akiya Sasaki, Kogyo Chosakai Publishing Co., Ltd., published in 1990)" or "Display Device (written by Sumiaki Ibuki, Sangyo Tosho Co., Ltd., published in 1989). In addition, the details of a liquid crystal display device can be found in, for example, "Next-Generation Liquid Crystal Display Techniques (Edited by Tatsuo Uchida, Kogyo Chosakai Publishing Co., Ltd., published in 1994)". The liquid crystal display device to which the present invention is applicable is not particularly limited. For example, the present invention is applicable to various liquid crystal display devices described in "Next-Generation Liquid Crystal Display Techniques". The image display device may be an image display device having a white organic EL element. It is preferable that the white organic EL element has a tandem structure. The tandem structure of the organic EL element is described in, for example, JP2003-045676A, or pp. 326 to 328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 to 485 nm), a green range (530 to 580 nm), and a yellow range (580 to 620 nm). It is more preferable that the spectrum has a maximum emission peak in a red range (650 to 700 nm) in addition to the above-described emission peaks.

<Infrared Sensor>

An infrared sensor according to an embodiment of the present invention has the above-described cured film according to the embodiment of the present invention. The configuration of the infrared sensor is not particularly limited as long as it functions as an infrared sensor. Hereinafter, an embodiment of the infrared sensor according to the present invention will be described using the drawing.

In FIG. 1, reference numeral 110 represents a solid-state imaging element. In an imaging region provided on the solid-state imaging element 110, near-infrared cut filters 111 and near-infrared transmitting filters 114 are provided. In addition, color filters 112 are laminated on the near-infrared cut filters 111. Microlenses 115 are disposed on an incidence ray hv side of the color filters 112 and the near-infrared transmitting filters 114. A planarizing layer 116 is formed so as to cover the microlenses 115.

The near-infrared cut filter 111 can be formed using the photosensitive composition according to the embodiment of the present invention. Spectral characteristics of the near-infrared cut filters 111 can be selected according to the emission wavelength of an infrared light emitting diode (infrared LED) to be used. The color filters 112 is not particularly limited as long as pixels which allow transmission of light having a specific wavelength in a visible range and absorbs the light are formed therein, and a known color filter in the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference. Characteristics of the near-infrared transmitting filter 114 can be selected according to the emission wavelength of the infrared LED to be used. The near-infrared transmitting filters 114 can also be formed using the photosensitive composition according to the embodiment of the present invention.

In the infrared sensor shown in FIG. 1, a near-infrared cut filter (other near-infrared cut filters) other than the near-infrared cut filter 111 may be further disposed on the planarizing layer 116. As the other near-infrared cut filters, for example, a layer containing copper and/or a dielectric multilayer film may be provided. In addition, as the other near-infrared cut filters, a dual band pass filter may be used. In addition, in the infrared sensor shown in FIG. 1, the positions of the near-infrared cut filter 111 and the color filter 112 may be switched. In addition, another layer may be disposed between the solid-state imaging element 110 and the near-infrared cut filter 111, and/or between the solid-state imaging element 110 and the near-infrared transmitting filter 114. Examples of another layer include an organic layer formed using a composition including a curable compound. In addition, a planarizing layer may be formed on the color filter 112.

EXAMPLES

Hereinafter, the present invention will be described in detail using Examples. Materials, used amounts, proportions, treatment details, treatment procedures, and the like shown in the following examples can be appropriately changed within a range not departing from the scope of the present invention. Accordingly, the scope of the present invention is not limited to the following specific examples.

<Preparation of Dispersion Liquid>

A compound A, a pigment derivative, a dispersion resin, and a solvent described in the column of Dispersion liquid of the following tables were mixed with each other in part by mass shown in the column of Dispersion liquid of the following tables, 117 parts by mass of zirconia beads having a diameter of 0.3 mm was further added thereto, the mixture was dispersed using a paint shaker for 5 hours, and the beads were separated by filtration, thereby producing a dispersion liquid. As the compound A, a compound subjected to the following kneading and polishing treatment was used.

(Kneading and Polishing Treatment Conditions)

10.6 parts by mass of a compound A, 149.4 parts by mass of a grinding agent, and 28 parts by mass of a binding agent were added to Labo Plastomill (manufactured by Toyo Seiki Seisaku-sho, Ltd.), the temperature of a kneaded material in the device was controlled to 70° C., and kneading was performed for 2 hours. As the grinding agent, neutral mirabilite anhydride E (average particle diameter (50% diameter (D50) based on volume)=20 μm, manufactured by Mitajiri Chemical Industry Co., Ltd.) was used, and as the binding agent, diethylene glycol was used. The kneaded material after kneading and polishing was washed with 20 L of water at 24° C. to remove the grinding agent and the binding agent, and then treated in a heating oven at 80° C. for 24 hours.

TABLE 1

| Name of dispersion liquid | Compound A Type | Part by mass | Pigment derivative Type | Part by mass | Dispersion resin Type | Part by mass | Solvent Type | Part by mass |
|---|---|---|---|---|---|---|---|---|
| Dispersion liquid 1 | A-a-1 | 6 | — | 0 | E-1 | 3.6 | D-1 | 78 |
| Dispersion liquid 2 | A-a-2 | 6 | — | 0 | E-2 | 3.6 | D-1 | 78 |
| Dispersion liquid 3 | A-a-3 | 6 | — | 0 | E-1 | 3.6 | D-1 | 78 |
| Dispersion liquid 4 | A-a-4 | 6 | — | 0 | E-1 | 3.6 | D-1 | 78 |
| Dispersion liquid 5 | A-a-5 | 6 | — | 0 | E-2 | 3.6 | D-1 | 78 |
| Dispersion liquid 6 | A-a-6 | 6 | — | 0 | E-1 | 3.6 | D-1 | 78 |
| Dispersion liquid 7 | A-a-7 | 6 | — | 0 | E-1 | 3.6 | D-1 | 78 |
| Dispersion liquid 8 | A-a-8 | 6 | — | 0 | E-1 | 3.6 | D-1 | 78 |
| Dispersion liquid 9 | A-b-1 | 6 | — | 0 | E-1 | 3.6 | D-1 | 78 |
| Dispersion liquid 10 | A-b-2 | 6 | — | 0 | E-2 | 3.6 | D-1 | 78 |
| Dispersion liquid 11 | A-b-3 | 6 | — | 0 | E-1 | 3.6 | D-1 | 78 |
| Dispersion liquid 12 | A-b-4 | 6 | — | 0 | E-2 | 3.6 | D-1 | 78 |
| Dispersion liquid 13 | A-b-5 | 6 | — | 0 | E-2 | 3.6 | D-1 | 78 |
| Dispersion liquid 14 | A-b-6 | 6 | — | 0 | E-1 | 3.6 | D-1 | 78 |
| Dispersion liquid 15 | A-b-7 | 6 | — | 0 | E-1 | 3.6 | D-1 | 78 |
| Dispersion liquid 16 | A-b-8 | 6 | — | 0 | E-2 | 3.6 | D-1 | 78 |
| Dispersion liquid 17 | A-c-1 | 6 | — | 0 | E-1 | 3.6 | D-1 | 78 |
| Dispersion liquid 18 | A-c-2 | 6 | — | 0 | E-2 | 3.6 | D-1 | 78 |
| Dispersion liquid 19 | A-d-1 | 6 | — | 0 | E-2 | 3.6 | D-1 | 78 |
| Dispersion liquid 20 | A-d-2 | 6 | — | 0 | E-1 | 3.6 | D-1 | 78 |
| Dispersion liquid 21 | A-d-3 | 6 | — | 0 | E-2 | 3.6 | D-1 | 78 |
| Dispersion liquid 22 | A-d-4 | 6 | — | 0 | E-1 | 3.6 | D-1 | 78 |
| Dispersion liquid 23 | A-d-5 | 6 | — | 0 | E-1 | 3.6 | D-1 | 78 |
| Dispersion liquid 24 | A-d-6 | 6 | — | 0 | E-1 | 3.6 | D-1 | 78 |
| Dispersion liquid 25 | A-d-7 | 6 | — | 0 | E-2 | 3.6 | D-1 | 78 |
| Dispersion liquid 26 | A-e-1 | 6 | — | 0 | E-1 | 3.6 | D-1 | 78 |
| Dispersion liquid 27 | A-e-2 | 6 | — | 0 | E-2 | 3.6 | D-1 | 78 |
| Dispersion liquid 28 | A-e-3 | 6 | — | 0 | E-1 | 3.6 | D-1 | 78 |
| Dispersion liquid 29 | A-e-4 | 6 | — | 0 | E-2 | 3.6 | D-1 | 78 |
| Dispersion liquid 30 | A-e-5 | 6 | — | 0 | E-1 | 3.6 | D-1 | 78 |
| Dispersion liquid 31 | A-b-6<br>A-c-1 | 3<br>3 | — | 0 | E-1 | 3.6 | D-1 | 78 |
| Dispersion liquid 32 | A-b-6<br>A-e-5 | 3<br>3 | — | 0 | E-1 | 3.6 | D-1 | 78 |
| Dispersion liquid 33 | A-c-1<br>A-e-5 | 3<br>3 | — | 0 | E-1 | 3.6 | D-1 | 78 |
| Dispersion liquid 34 | A-b-6 | 4.8 | F-1 | 1.2 | E-2 | 3.6 | D-1 | 78 |
| Dispersion liquid 35 | A-b-6 | 4.8 | F-2 | 1.2 | E-1 | 3.6 | D-1 | 78 |
| Dispersion liquid 36 | A-b-6 | 4.8 | F-3 | 1.2 | E-2 | 3.6 | D-1 | 78 |
| Dispersion liquid 37 | A-c-1 | 4.8 | F-1 | 1.2 | E-2 | 3.6 | D-1 | 78 |
| Dispersion liquid 38 | A-c-1 | 4.8 | F-4 | 1.2 | E-1 | 3.6 | D-1 | 78 |
| Dispersion liquid 39 | A-c-1 | 4.8 | F-5 | 1.2 | E-2 | 3.6 | D-1 | 78 |
| Dispersion liquid 40 | A-e-5 | 4.8 | F-1 | 1.2 | E-2 | 3.6 | D-1 | 78 |
| Dispersion liquid 41 | A-e-5 | 4.8 | F-6 | 1.2 | E-1 | 3.6 | D-1 | 78 |
| Dispersion liquid 42 | A-e-5 | 4.8 | F-7 | 1.2 | E-2 | 3.6 | D-1 | 78 |
| Dispersion liquid 43 | A-b-6 | 6 | — | 0 | E-3 | 3.6 | D-1 | 78 |
| Dispersion liquid 44 | A-b-6 | 4.8 | F-3 | 1.2 | E-4 | 3.6 | D-1 | 78 |
| Dispersion liquid 45 | A-b-6 | 6 | — | 0 | E-5 | 3.6 | D-1 | 78 |
| Dispersion liquid 46 | A-b-6 | 6 | — | 0 | E-6 | 3.6 | D-1 | 78 |
| Dispersion liquid 47 | A-c-1 | 6 | — | 0 | E-3 | 3.6 | D-1 | 78 |
| Dispersion liquid 48 | A-c-1 | 4.8 | F-5 | 1.2 | E-4 | 3.6 | D-1 | 78 |
| Dispersion liquid 49 | A-c-1 | 6 | — | 0 | E-5 | 3.6 | D-1 | 78 |
| Dispersion liquid 50 | A-c-1 | 6 | — | 0 | E-6 | 3.6 | D-1 | 78 |
| Dispersion liquid 51 | A-e-5 | 6 | — | 0 | E-3 | 3.6 | D-1 | 78 |
| Dispersion liquid 52 | A-e-5 | 4.8 | F-7 | 1.2 | E-4 | 3.6 | D-1 | 78 |
| Dispersion liquid 53 | A-e-5 | 6 | — | 0 | E-5 | 3.6 | D-1 | 78 |

TABLE 1-continued

| Name of dispersion liquid | Compound A Type | Part by mass | Pigment derivative Type | Part by mass | Dispersion resin Type | Part by mass | Solvent Type | Part by mass |
|---|---|---|---|---|---|---|---|---|
| Dispersion liquid 54 | A-e-5 | 6 | — | 0 | E-6 | 3.6 | D-1 | 78 |
| Dispersion liquid R1 | R-1 | 6 | — | 0 | E-1 | 3.6 | D-1 | 78 |
| Dispersion liquid R2 | R-2 | 6 | — | 0 | E-1 | 3.6 | D-1 | 78 |

TABLE 2

| | Compound A Type | Part by mass | Pigment derivative Type | Part by mass | Dispersion resin Type | Part by mass | Solvent Type | Part by mass |
|---|---|---|---|---|---|---|---|---|
| Dispersion liquid 55 | A-a-9 | 3 | — | 0 | E-1 | 1.8 | D-1 | 39 |
| Dispersion liquid 56 | A-a-10 | 3 | — | 0 | E-2 | 1.8 | D-1 | 39 |
| Dispersion liquid 57 | A-a-11 | 3 | — | 0 | E-1 | 1.8 | D-1 | 39 |
| Dispersion liquid 58 | A-a-12 | 3 | — | 0 | E-2 | 1.8 | D-1 | 39 |
| Dispersion liquid 59 | A-a-13 | 3 | — | 0 | E-1 | 1.8 | D-1 | 39 |
| Dispersion liquid 60 | A-a-14 | 3 | — | 0 | E-2 | 1.8 | D-1 | 39 |
| Dispersion liquid 61 | A-a-15 | 3 | — | 0 | E-1 | 1.8 | D-1 | 39 |
| Dispersion liquid 62 | A-a-16 | 3 | — | 0 | E-2 | 1.8 | D-1 | 39 |
| Dispersion liquid 63 | A-a-17 | 3 | — | 0 | E-1 | 1.8 | D-1 | 39 |
| Dispersion liquid 64 | A-a-18 | 3 | — | 0 | E-2 | 1.8 | D-1 | 39 |
| Dispersion liquid 65 | A-a-19 | 3 | — | 0 | E-1 | 1.8 | D-1 | 39 |
| Dispersion liquid 66 | A-a-20 | 3 | — | 0 | E-2 | 1.8 | D-1 | 39 |
| Dispersion liquid 67 | A-a-21 | 3 | — | 0 | E-1 | 1.8 | D-1 | 39 |
| Dispersion liquid 68 | A-b-10 | 3 | — | 0 | E-2 | 1.8 | D-1 | 39 |
| Dispersion liquid 69 | A-b-11 | 3 | — | 0 | E-1 | 1.8 | D-1 | 39 |
| Dispersion liquid 70 | A-c-4 | 3 | — | 0 | E-2 | 1.8 | D-1 | 39 |
| Dispersion liquid 71 | A-c-5 | 3 | — | 0 | E-1 | 1.8 | D-1 | 39 |
| Dispersion liquid 72 | A-c-6 | 3 | — | 0 | E-2 | 1.8 | D-1 | 39 |
| Dispersion liquid 73 | A-c-7 | 3 | — | 0 | E-1 | 1.8 | D-1 | 39 |
| Dispersion liquid 74 | A-c-8 | 3 | — | 0 | E-2 | 1.8 | D-1 | 39 |
| Dispersion liquid 75 | A-c-9 | 3 | — | 0 | E-1 | 1.8 | D-1 | 39 |
| Dispersion liquid 76 | A-d-8 | 3 | — | 0 | E-2 | 1.8 | D-1 | 39 |
| Dispersion liquid 77 | A-d-9 | 3 | — | 0 | E-1 | 1.8 | D-1 | 39 |
| Dispersion liquid 78 | A-d-10 | 3 | — | 0 | E-2 | 1.8 | D-1 | 39 |
| Dispersion liquid 79 | A-d-11 | 3 | — | 0 | E-1 | 1.8 | D-1 | 39 |

The materials described in the above tables are as follows.
(Compound A)

A-a-1 to A-e-5: compounds A-a-1 to A-e-5 having a structure shown in the specific examples of the oxocarbon compound A described above R-1: NK-5060 (manufactured by Hayashibara Co., Ltd., cyanine compound)

R-2: Excolor TX-EX 708K (manufactured by NIPPON SHOKUBAT CO., LTD., phthalocyanine compound)

(Dispersion Resin)

E-1: resin having the following structure (acid value=32.3 mgKOH/g, amine value=45.0 mgKOH/g, weight-average molecular weight=22900), a numerical value added to a main chain represents a molar ratio of a repeating unit and a numerical value added to a side chain represents the number of repeating units.

E-2: resin having the following structure (acid value=99.1 mgKOH/g, weight-average molecular weight=38000), a numerical value added to a main chain represents a molar ratio of a repeating unit and a numerical value added to a side chain represents the number of repeating units.

E-3: resin having the following structure (acid value=87.0 mgKOH/g, weight-average molecular weight=18000), a numerical value added to a main chain represents a molar ratio of a repeating unit and a numerical value added to a side chain represents the number of repeating units.

E-4: resin having the following structure (acid value=85.0 mgKOH/g, weight-average molecular weight=22000), a numerical value added to a main chain represents a molar ratio of a repeating unit and a numerical value added to a side chain represents the number of repeating units.

E-5: block resin having the following structure (amine value=90 mgKOH/g, quaternary ammonium salt value=30 mgKOH/g, weight-average molecular weight=9800), a numerical value added to a main chain represents a molar ratio of a repeating unit.

E-6: resin having the following structure (acid value=43 mgKOH/g, weight-average molecular weight=9000), a numerical value added to a main chain represents a molar ratio of a repeating unit.

(E-1)
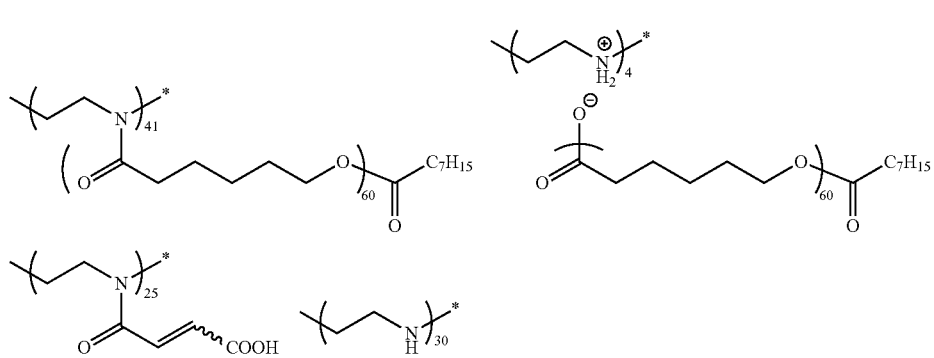
(E-2)
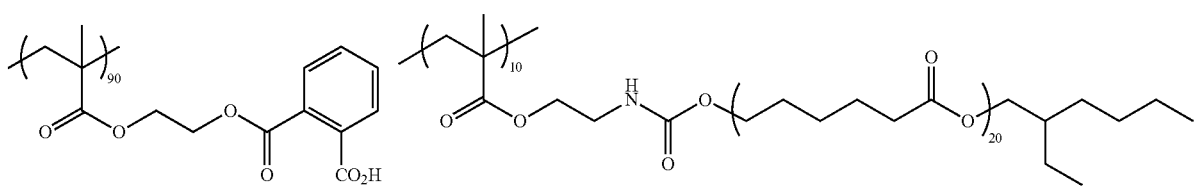
(E-3)
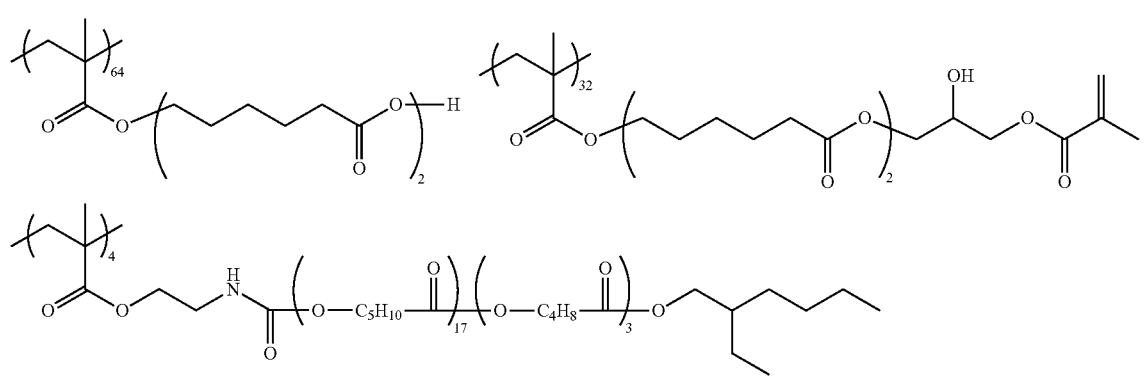
(E-4)
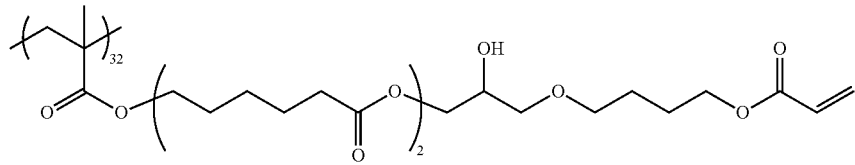
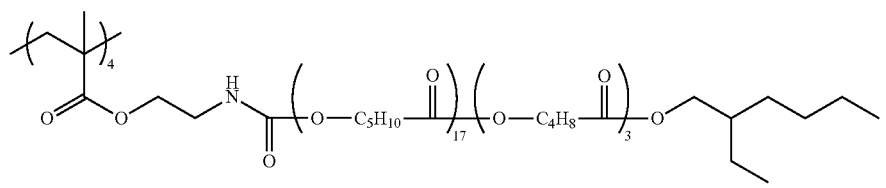

-continued
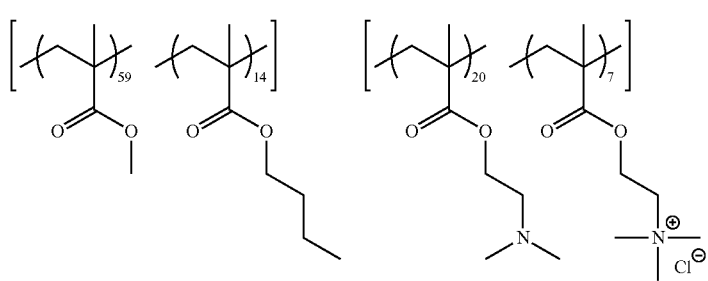
(E-5)
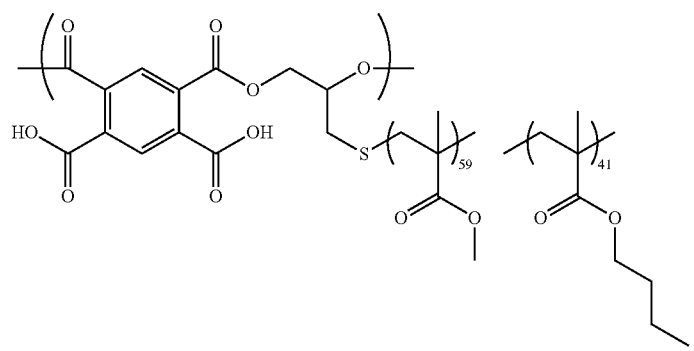
(E-6)
(Pigment Derivative)
F-1 to F-7: compounds having the following structures
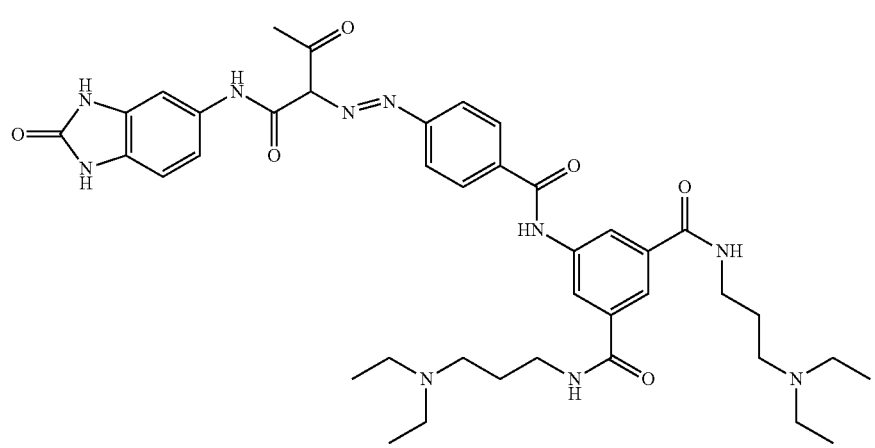
(F-1)
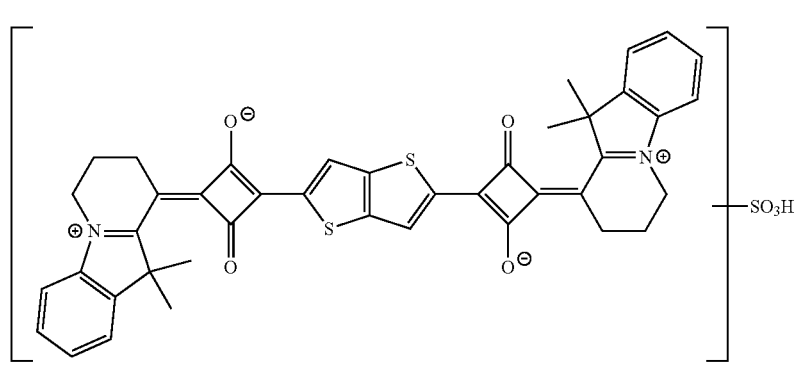
(F-2)

(F-3)
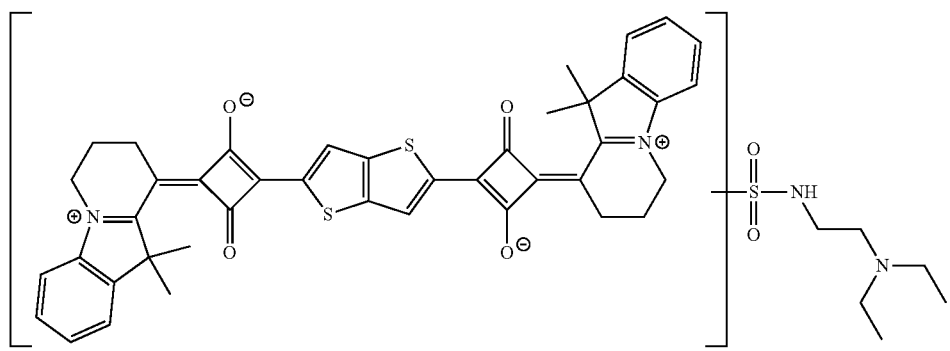
(F-4)
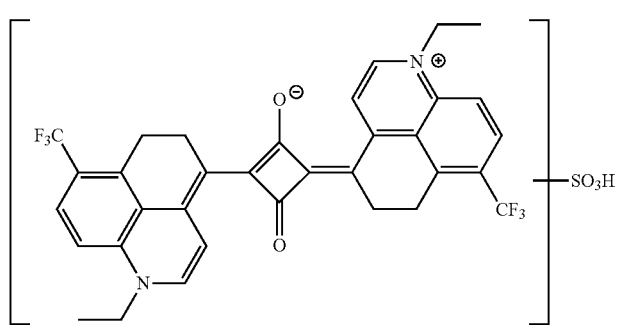
(F-5)
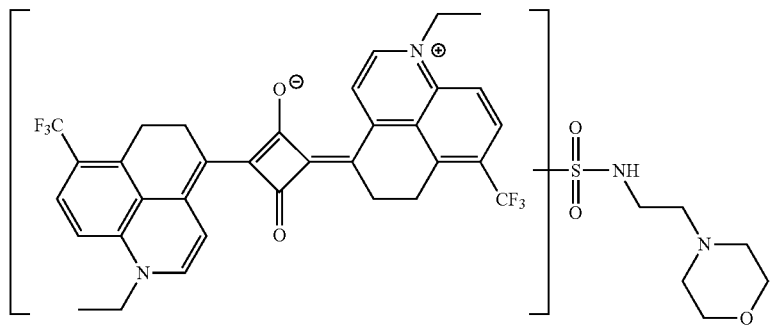
(F-6)
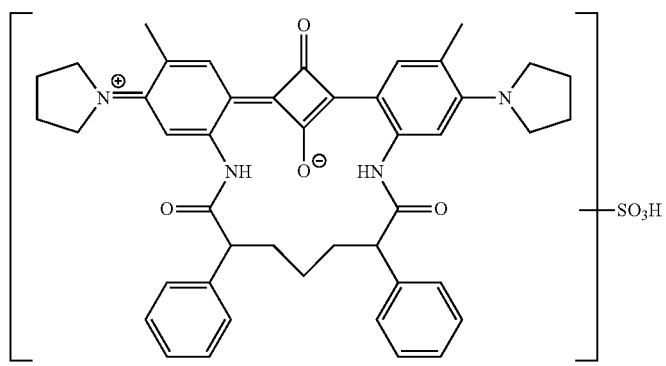

-continued

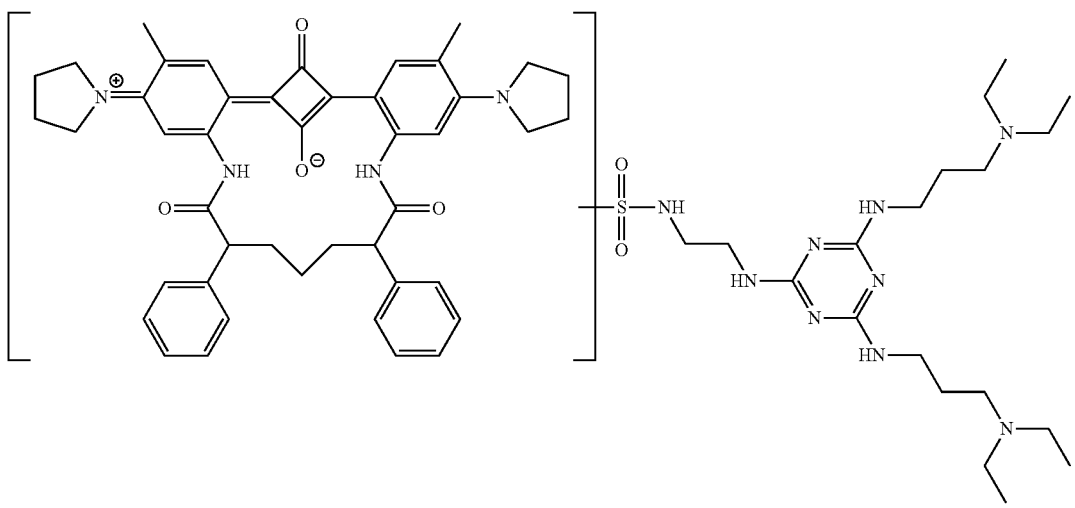

(F-7)

(Solvent)
D-1: propylene glycol monomethyl ether acetate

<Preparation of Photosensitive Composition>

The components described in the following tables were mixed with each other in part by mass shown in the following tables to prepare a photosensitive composition.

TABLE 3

| Name of photosensitive composition | Compound A or dispersion liquid | | Alkali-soluble resin | | Polymerizable compound | | Photopolymerization initiator | | Ultraviolet absorber | |
|---|---|---|---|---|---|---|---|---|---|---|
| | Type | Part by mass | Type | Part by mass | Type | Part by mass | Type | Part by mass | Type | Part by mass |
| Composition 1 | Dispersion liquid 1 | 43.8 | G-1 | 5.5 | B-1 | 6.4 | C-7 | 1 | H-1 | 1.6 |
| Composition 2 | Dispersion liquid 2 | 43.8 | G-1 | 5.5 | B-1 | 6.4 | C-7 | 1 | H-1 | 1.6 |
| Composition 3 | Dispersion liquid 3 | 43.8 | G-1 | 5.5 | B-1 | 6.4 | C-7 | 1 | H-1 | 1.6 |
| Composition 4 | Dispersion liquid 4 | 43.8 | G-1 | 5.5 | B-1 | 6.4 | C-7 | 1 | H-1 | 1.6 |
| Composition 5 | Dispersion liquid 5 | 43.8 | G-1 | 5.5 | B-1 | 6.4 | C-7 | 1 | H-1 | 1.6 |
| Composition 6 | Dispersion liquid 6 | 43.8 | G-1 | 5.5 | B-1 | 6.4 | C-7 | 1 | H-1 | 1.6 |
| Composition 7 | Dispersion liquid 7 | 43.8 | G-1 | 5.5 | B-1 | 6.4 | C-7 | 1 | H-1 | 1.6 |
| Composition 8 | Dispersion liquid 8 | 43.8 | G-1 | 5.5 | B-1 | 6.4 | C-7 | 1 | H-1 | 1.6 |
| Composition 9 | Dispersion liquid 9 | 43.8 | G-1 | 5.5 | B-1 | 6.4 | C-7 | 1 | H-1 | 1.6 |
| Composition 10 | Dispersion liquid 10 | 43.8 | G-1 | 5.5 | B-1 | 6.4 | C-7 | 1 | H-1 | 1.6 |
| Composition 11 | Dispersion liquid 11 | 43.8 | G-1 | 5.5 | B-1 | 6.4 | C-7 | 1 | H-1 | 1.6 |
| Composition 12 | Dispersion liquid 12 | 43.8 | G-1 | 5.5 | B-1 | 6.4 | C-7 | 1 | H-1 | 1.6 |
| Composition 13 | Dispersion liquid 13 | 43.8 | G-1 | 5.5 | B-1 | 6.4 | C-7 | 1 | H-1 | 1.6 |
| Composition 14 | Dispersion liquid 14 | 43.8 | G-1 | 5.5 | B-1 | 6.4 | C-7 | 1 | H-1 | 1.6 |
| Composition 15 | Dispersion liquid 15 | 43.8 | G-1 | 5.5 | B-1 | 6.4 | C-7 | 1 | H-1 | 1.6 |
| Composition 16 | Dispersion liquid 16 | 43.8 | G-1 | 5.5 | B-1 | 6.4 | C-7 | 1 | H-1 | 1.6 |
| Composition 17 | Dispersion liquid 17 | 43.8 | G-1 | 5.5 | B-1 | 6.4 | C-7 | 1 | H-1 | 1.6 |
| Composition 18 | Dispersion liquid 18 | 43.8 | G-1 | 5.5 | B-1 | 6.4 | C-7 | 1 | H-1 | 1.6 |
| Composition 19 | Dispersion liquid 19 | 43.8 | G-1 | 5.5 | B-1 | 6.4 | C-7 | 1 | H-1 | 1.6 |
| Composition 20 | Dispersion liquid 20 | 43.8 | G-1 | 5.5 | B-1 | 6.4 | C-7 | 1 | H-1 | 1.6 |
| Composition 21 | Dispersion liquid 21 | 43.8 | G-1 | 5.5 | B-1 | 6.4 | C-7 | 1 | H-1 | 1.6 |
| Composition 22 | Dispersion liquid 22 | 43.8 | G-1 | 5.5 | B-1 | 6.4 | C-7 | 1 | H-1 | 1.6 |
| Composition 23 | Dispersion liquid 23 | 43.8 | G-1 | 5.5 | B-1 | 6.4 | C-7 | 1 | H-1 | 1.6 |
| Composition 24 | Dispersion liquid 24 | 43.8 | G-1 | 5.5 | B-1 | 6.4 | C-7 | 1 | H-1 | 1.6 |
| Composition 25 | Dispersion liquid 25 | 43.8 | G-1 | 5.5 | B-1 | 6.4 | C-7 | 1 | H-1 | 1.6 |
| Composition 26 | Dispersion liquid 26 | 43.8 | G-1 | 5.5 | B-1 | 6.4 | C-7 | 1 | H-1 | 1.6 |
| Composition 27 | Dispersion liquid 27 | 43.8 | G-1 | 5.5 | B-1 | 6.4 | C-7 | 1 | H-1 | 1.6 |
| Composition 28 | Dispersion liquid 28 | 43.8 | G-1 | 5.5 | B-1 | 6.4 | C-7 | 1 | H-1 | 1.6 |
| Composition 29 | Dispersion liquid 29 | 43.8 | G-1 | 5.5 | B-1 | 6.4 | C-7 | 1 | H-1 | 1.6 |
| Composition 30 | Dispersion liquid 30 | 43.8 | G-1 | 5.5 | B-1 | 6.4 | C-7 | 1 | H-1 | 1.6 |
| Composition 31 | Dispersion liquid 31 | 43.8 | G-1 | 5.5 | B-1 | 6.4 | C-7 | 1 | H-1 | 1.6 |
| Composition 32 | Dispersion liquid 32 | 43.8 | G-1 | 5.5 | B-1 | 6.4 | C-7 | 1 | H-1 | 1.6 |

TABLE 3-continued

| Name of photosensitive composition | Antioxidant | | Additive | | Surfactant | | Polymerization inhibitor | | Solvent | |
|---|---|---|---|---|---|---|---|---|---|---|
| | Type | Part by mass | Type | Part by mass | Type | Part by mass | Type | Part by mass | Type | Part by mass |
| Composition 1 | I-1 | 0.2 | — | 0 | J-1 | 0.025 | K-1 | 0.003 | D-1 | 41.5 |
| Composition 2 | I-1 | 0.2 | — | 0 | J-1 | 0.025 | K-1 | 0.003 | D-1 | 41.5 |
| Composition 3 | I-1 | 0.2 | — | 0 | J-1 | 0.025 | K-1 | 0.003 | D-1 | 41.5 |
| Composition 4 | I-1 | 0.2 | — | 0 | J-1 | 0.025 | K-1 | 0.003 | D-1 | 41.5 |
| Composition 5 | I-1 | 0.2 | — | 0 | J-1 | 0.025 | K-1 | 0.003 | D-1 | 41.5 |
| Composition 6 | I-1 | 0.2 | — | 0 | J-1 | 0.025 | K-1 | 0.003 | D-1 | 41.5 |
| Composition 7 | I-1 | 0.2 | — | 0 | J-1 | 0.025 | K-1 | 0.003 | D-1 | 41.5 |
| Composition 8 | I-1 | 0.2 | — | 0 | J-1 | 0.025 | K-1 | 0.003 | D-1 | 41.5 |
| Composition 9 | I-1 | 0.2 | — | 0 | J-1 | 0.025 | K-1 | 0.003 | D-1 | 41.5 |
| Composition 10 | I-1 | 0.2 | — | 0 | J-1 | 0.025 | K-1 | 0.003 | D-1 | 41.5 |
| Composition 11 | I-1 | 0.2 | — | 0 | J-1 | 0.025 | K-1 | 0.003 | D-1 | 41.5 |
| Composition 12 | I-1 | 0.2 | — | 0 | J-1 | 0.025 | K-1 | 0.003 | D-1 | 41.5 |
| Composition 13 | I-1 | 0.2 | — | 0 | J-1 | 0.025 | K-1 | 0.003 | D-1 | 41.5 |
| Composition 14 | I-1 | 0.2 | — | 0 | J-1 | 0.025 | K-1 | 0.003 | D-1 | 41.5 |
| Composition 15 | I-1 | 0.2 | — | 0 | J-1 | 0.025 | K-1 | 0.003 | D-1 | 41.5 |
| Composition 16 | I-1 | 0.2 | — | 0 | J-1 | 0.025 | K-1 | 0.003 | D-1 | 41.5 |
| Composition 17 | I-1 | 0.2 | — | 0 | J-1 | 0.025 | K-1 | 0.003 | D-1 | 41.5 |
| Composition 18 | I-1 | 0.2 | — | 0 | J-1 | 0.025 | K-1 | 0.003 | D-1 | 41.5 |
| Composition 19 | I-1 | 0.2 | — | 0 | J-1 | 0.025 | K-1 | 0.003 | D-1 | 41.5 |
| Composition 20 | I-1 | 0.2 | — | 0 | J-1 | 0.025 | K-1 | 0.003 | D-1 | 41.5 |
| Composition 21 | I-1 | 0.2 | — | 0 | J-1 | 0.025 | K-1 | 0.003 | D-1 | 41.5 |
| Composition 22 | I-1 | 0.2 | — | 0 | J-1 | 0.025 | K-1 | 0.003 | D-1 | 41.5 |
| Composition 23 | I-1 | 0.2 | — | 0 | J-1 | 0.025 | K-1 | 0.003 | D-1 | 41.5 |
| Composition 24 | I-1 | 0.2 | — | 0 | J-1 | 0.025 | K-1 | 0.003 | D-1 | 41.5 |
| Composition 25 | I-1 | 0.2 | — | 0 | J-1 | 0.025 | K-1 | 0.003 | D-1 | 41.5 |
| Composition 26 | I-1 | 0.2 | — | 0 | J-1 | 0.025 | K-1 | 0.003 | D-1 | 41.5 |
| Composition 27 | I-1 | 0.2 | — | 0 | J-1 | 0.025 | K-1 | 0.003 | D-1 | 41.5 |
| Composition 28 | I-1 | 0.2 | — | 0 | J-1 | 0.025 | K-1 | 0.003 | D-1 | 41.5 |
| Composition 29 | I-1 | 0.2 | — | 0 | J-1 | 0.025 | K-1 | 0.003 | D-1 | 41.5 |
| Composition 30 | I-1 | 0.2 | — | 0 | J-1 | 0.025 | K-1 | 0.003 | D-1 | 41.5 |
| Composition 31 | I-1 | 0.2 | — | 0 | J-1 | 0.025 | K-1 | 0.003 | D-1 | 41.5 |
| Composition 32 | I-1 | 0.2 | — | 0 | J-1 | 0.025 | K-1 | 0.003 | D-1 | 41.5 |

TABLE 4

| Name of photosensitive composition | Compound A or dispersion liquid | | Alkali-soluble resin | | Polymerizable compound | | Photopolymerization initiator | | Ultraviolet absorber | |
|---|---|---|---|---|---|---|---|---|---|---|
| | Type | Part by mass | Type | Part by mass | Type | Part by mass | Type | Part by mass | Type | Part by mass |
| Composition 33 | Dispersion liquid 33 | 43.8 | G-1 | 5.5 | B-1 | 6.4 | C-7 | 1 | H-1 | 1.6 |
| Composition 34 | A-b-9 | 3 | G-1 | 7.3 | B-1 | 6.4 | C-7 | 1 | H-1 | 1.6 |
| Composition 35 | A-c-3 | 3 | G-1 | 7.3 | B-1 | 6.4 | C-7 | 1 | H-1 | 1.6 |
| Composition 36 | A-e-6 | 3 | G-1 | 7.3 | B-1 | 6.4 | C-7 | 1 | H-1 | 1.6 |
| Composition 37 | A-b-9<br>A-c-3 | 1.5<br>1.5 | G-1 | 7.3 | B-1 | 6.4 | C-7 | 1 | H-1 | 1.6 |
| Composition 38 | A-b-9<br>A-e-6 | 1.5<br>1.5 | G-1 | 7.3 | B-1 | 6.4 | C-7 | 1 | H-1 | 1.6 |
| Composition 39 | A-c-3<br>A-e-6 | 1.5<br>1.5 | G-1 | 7.3 | B-1 | 6.4 | C-7 | 1 | H-1 | 1.6 |
| Composition 40 | Dispersion liquid 34 | 43.8 | G-1 | 5.5 | B-1 | 6.4 | C-7 | 1 | H-1 | 1.6 |
| Composition 41 | Dispersion liquid 35 | 43.8 | G-1 | 5.5 | B-1 | 6.4 | C-7 | 1 | H-1 | 1.6 |
| Composition 42 | Dispersion liquid 36 | 43.8 | G-1 | 5.5 | B-1 | 6.4 | C-7 | 1 | H-1 | 1.6 |
| Composition 43 | Dispersion liquid 37 | 43.8 | G-1 | 5.5 | B-1 | 6.4 | C-7 | 1 | H-1 | 1.6 |
| Composition 44 | Dispersion liquid 38 | 43.8 | G-1 | 5.5 | B-1 | 6.4 | C-7 | 1 | H-1 | 1.6 |
| Composition 45 | Dispersion liquid 39 | 43.8 | G-1 | 5.5 | B-1 | 6.4 | C-7 | 1 | H-1 | 1.6 |
| Composition 46 | Dispersion liquid 40 | 43.8 | G-1 | 5.5 | B-1 | 6.4 | C-7 | 1 | H-1 | 1.6 |
| Composition 47 | Dispersion liquid 41 | 43.8 | G-1 | 5.5 | B-1 | 6.4 | C-7 | 1 | H-1 | 1.6 |
| Composition 48 | Dispersion liquid 42 | 43.8 | G-1 | 5.5 | B-1 | 6.4 | C-7 | 1 | H-1 | 1.6 |
| Composition 49 | Dispersion liquid 43 | 43.8 | G-1 | 5.5 | B-1 | 6.4 | C-7 | 1 | H-1 | 1.6 |
| Composition 50 | Dispersion liquid 44 | 43.8 | G-1 | 5.5 | B-1 | 6.4 | C-7 | 1 | H-1 | 1.6 |
| Composition 51 | Dispersion liquid 45 | 43.8 | G-1 | 5.5 | B-1 | 6.4 | C-7 | 1 | H-1 | 1.6 |
| Composition 52 | Dispersion liquid 46 | 43.8 | G-1 | 5.5 | B-1 | 6.4 | C-7 | 1 | H-1 | 1.6 |
| Composition 53 | Dispersion liquid 47 | 43.8 | G-1 | 5.5 | B-1 | 6.4 | C-7 | 1 | H-1 | 1.6 |
| Composition 54 | Dispersion liquid 48 | 43.8 | G-1 | 5.5 | B-1 | 6.4 | C-7 | 1 | H-1 | 1.6 |
| Composition 55 | Dispersion liquid 49 | 43.8 | G-1 | 5.5 | B-1 | 6.4 | C-7 | 1 | H-1 | 1.6 |
| Composition 56 | Dispersion liquid 50 | 43.8 | G-1 | 5.5 | B-1 | 6.4 | C-7 | 1 | H-1 | 1.6 |
| Composition 57 | Dispersion liquid 51 | 43.8 | G-1 | 5.5 | B-1 | 6.4 | C-7 | 1 | H-1 | 1.6 |
| Composition 58 | Dispersion liquid 52 | 43.8 | G-1 | 5.5 | B-1 | 6.4 | C-7 | 1 | H-1 | 1.6 |
| Composition 59 | Dispersion liquid 53 | 43.8 | G-1 | 5.5 | B-1 | 6.4 | C-7 | 1 | H-1 | 1.6 |

TABLE 4-continued

| | | | | | | | | | |
|---|---|---|---|---|---|---|---|---|---|
| Composition 60 | Dispersion liquid 54 | 43.8 | G-1 | 5.5 | B-1 | 6.4 | C-7 | 1 | H-1 | 1.6 |
| Composition 61 | Dispersion liquid 14 | 43.8 | G-2 | 5.5 | B-1 | 6.4 | C-7 | 1 | H-1 | 1.6 |

| Name of photosensitive composition | Antioxidant | | Additive | | Surfactant | | Polymerization inhibitor | | Solvent | |
|---|---|---|---|---|---|---|---|---|---|---|
| | Type | Part by mass | Type | Part by mass | Type | Part by mass | Type | Part by mass | Type | Part by mass |
| Composition 33 | I-1 | 0.2 | — | 0 | J-1 | 0.025 | K-1 | 0.003 | D-1 | 41.5 |
| Composition 34 | I-1 | 0.2 | — | 0 | J-1 | 0.025 | K-1 | 0.003 | D-3 | 80.5 |
| Composition 35 | I-1 | 0.2 | — | 0 | J-1 | 0.025 | K-1 | 0.003 | D-3 | 80.5 |
| Composition 36 | I-1 | 0.2 | — | 0 | J-1 | 0.025 | K-1 | 0.003 | D-3 | 80.5 |
| Composition 37 | I-1 | 0.2 | — | 0 | J-1 | 0.025 | K-1 | 0.003 | D-3 | 80.5 |
| Composition 38 | I-1 | 0.2 | — | 0 | J-1 | 0.025 | K-1 | 0.003 | D-3 | 80.5 |
| Composition 39 | I-1 | 0.2 | — | 0 | J-1 | 0.025 | K-1 | 0.003 | D-3 | 80.5 |
| Composition 40 | I-1 | 0.2 | — | 0 | J-1 | 0.025 | K-1 | 0.003 | D-1 | 41.5 |
| Composition 41 | I-1 | 0.2 | — | 0 | J-1 | 0.025 | K-1 | 0.003 | D-1 | 41.5 |
| Composition 42 | I-1 | 0.2 | — | 0 | J-1 | 0.025 | K-1 | 0.003 | D-1 | 41.5 |
| Composition 43 | I-1 | 0.2 | — | 0 | J-1 | 0.025 | K-1 | 0.003 | D-1 | 41.5 |
| Composition 44 | I-1 | 0.2 | — | 0 | J-1 | 0.025 | K-1 | 0.003 | D-1 | 41.5 |
| Composition 45 | I-1 | 0.2 | — | 0 | J-1 | 0.025 | K-1 | 0.003 | D-1 | 41.5 |
| Composition 46 | I-1 | 0.2 | — | 0 | J-1 | 0.025 | K-1 | 0.003 | D-1 | 41.5 |
| Composition 47 | I-1 | 0.2 | — | 0 | J-1 | 0.025 | K-1 | 0.003 | D-1 | 41.5 |
| Composition 48 | I-1 | 0.2 | — | 0 | J-1 | 0.025 | K-1 | 0.003 | D-1 | 41.5 |
| Composition 49 | I-1 | 0.2 | — | 0 | J-1 | 0.025 | K-1 | 0.003 | D-1 | 41.5 |
| Composition 50 | I-1 | 0.2 | — | 0 | J-1 | 0.025 | K-1 | 0.003 | D-1 | 41.5 |
| Composition 51 | I-1 | 0.2 | — | 0 | J-1 | 0.025 | K-1 | 0.003 | D-1 | 41.5 |
| Composition 52 | I-1 | 0.2 | — | 0 | J-1 | 0.025 | K-1 | 0.003 | D-1 | 41.5 |
| Composition 53 | I-1 | 0.2 | — | 0 | J-1 | 0.025 | K-1 | 0.003 | D-1 | 41.5 |
| Composition 54 | I-1 | 0.2 | — | 0 | J-1 | 0.025 | K-1 | 0.003 | D-1 | 41.5 |
| Composition 55 | I-1 | 0.2 | — | 0 | J-1 | 0.025 | K-1 | 0.003 | D-1 | 41.5 |
| Composition 56 | I-1 | 0.2 | — | 0 | J-1 | 0.025 | K-1 | 0.003 | D-1 | 41.5 |
| Composition 57 | I-1 | 0.2 | — | 0 | J-1 | 0.025 | K-1 | 0.003 | D-1 | 41.5 |
| Composition 58 | I-1 | 0.2 | — | 0 | J-1 | 0.025 | K-1 | 0.003 | D-1 | 41.5 |
| Composition 59 | I-1 | 0.2 | — | 0 | J-1 | 0.025 | K-1 | 0.003 | D-1 | 41.5 |
| Composition 60 | I-1 | 0.2 | — | 0 | J-1 | 0.025 | K-1 | 0.003 | D-1 | 41.5 |
| Composition 61 | I-1 | 0.2 | — | 0 | J-1 | 0.025 | K-1 | 0.003 | D-1 | 41.5 |

TABLE 5

| Name of photosensitive composition | Compound A or dispersion liquid | | Alkali-soluble resin | | Polymerizable compound | | Photopolymerization initiator | | Ultraviolet absorber | |
|---|---|---|---|---|---|---|---|---|---|---|
| | Type | Part by mass | Type | Part by mass | Type | Part by mass | Type | Part by mass | Type | Part by mass |
| Composition 62 | Dispersion liquid 14 | 43.8 | G-3 | 5.5 | B-1 | 6.4 | C-7 | 1 | H-1 | 1.6 |
| Composition 63 | Dispersion liquid 14 | 43.8 | G-4 | 5.5 | B-1 | 6.4 | C-7 | 1 | H-1 | 1.6 |
| Composition 64 | Dispersion liquid 14 | 43.8 | G-5 | 5.5 | B-1 | 6.4 | C-7 | 1 | H-1 | 1.6 |
| Composition 65 | Dispersion liquid 14 | 43.8 | G-2 G-3 | 3 2.5 | B-1 | 6.4 | C-7 | 1 | H-1 | 1.6 |
| Composition 66 | Dispersion liquid 14 | 43.8 | G-2 | 5.5 | B-1 | 6.4 | C-7 | 1 | 1I-1 | 1.6 |
| Composition 67 | Dispersion liquid 14 | 43.8 | G-3 | 5.5 | B-1 | 6.4 | C-7 | 1 | H-1 | 1.6 |
| Composition 68 | Dispersion liquid 14 | 43.8 | G-4 | 5.5 | B-1 | 6.4 | C-7 | 1 | H-1 | 1.6 |
| Composition 69 | Dispersion liquid 14 | 43.8 | G-5 | 5.5 | B-1 | 6.4 | C-7 | 1 | H-1 | 1.6 |
| Composition 70 | Dispersion liquid 14 | 43.8 | G-2 G-3 | 3 2.5 | B-1 | 6.4 | C-7 | 1 | 1I-1 | 1.6 |
| Composition 71 | Dispersion liquid 14 | 43.8 | G-2 | 5.5 | B-1 | 6.4 | C-7 | 1 | H-1 | 1.6 |
| Composition 72 | Dispersion liquid 14 | 43.8 | G-3 | 5.5 | B-1 | 6.4 | C-7 | 1 | H-1 | 1.6 |
| Composition 73 | Dispersion liquid 14 | 43.8 | G-4 | 5.5 | B-1 | 6.4 | C-7 | 1 | H-1 | 1.6 |
| Composition 74 | Dispersion liquid 14 | 43.8 | G-5 | 5.5 | B-1 | 6.4 | C-7 | 1 | H-1 | 1.6 |
| Composition 75 | Dispersion liquid 14 | 43.8 | G-2 G-3 | 3 2.5 | B-1 | 6.4 | C-7 | 1 | H-1 | 1.6 |
| Composition 76 | Dispersion liquid 14 | 43.8 | G-1 | 5.5 | B-2 | 6.4 | C-7 | 1 | H-1 | 1.6 |
| Composition 77 | Dispersion liquid 14 | 43.8 | G-1 | 5.5 | B-3 | 6.4 | C-7 | 1 | H-1 | 1.6 |
| Composition 78 | Dispersion liquid 14 | 43.8 | G-1 | 5.5 | B-2 B-4 | 4.8 1.6 | C-7 | 1 | H-1 | 1.6 |
| Composition 79 | Dispersion liquid 14 | 43.8 | G-1 | 5.5 | B-2 | 6.4 | C-7 | 1 | H-1 | 1.6 |
| Composition 80 | Dispersion liquid 14 | 43.8 | G-1 | 5.5 | B-3 | 6.4 | C-7 | 1 | H-1 | 1.6 |
| Composition 81 | Dispersion liquid 14 | 43.8 | G-1 | 5.5 | B-2 B-4 | 4.8 1.6 | C-7 | 1 | H-1 | 1.6 |
| Composition 82 | Dispersion liquid 14 | 43.8 | G-1 | 5.5 | B-2 | 6.4 | C-7 | 1 | H-1 | 1.6 |
| Composition 83 | Dispersion liquid 14 | 43.8 | G-1 | 5.5 | B-3 | 6.4 | C-7 | 1 | H-1 | 1.6 |
| Composition 84 | Dispersion liquid 14 | 43.8 | G-1 | 5.5 | B-2 B-4 | 4.8 1.6 | C-7 | 1 | H-1 | 1.6 |
| Composition 85 | Dispersion liquid 14 | 43.8 | G-1 | 5.5 | B-1 | 6.4 | C-8 | 1 | H-1 | 1.6 |

TABLE 5-continued

| | | | | | | | | | |
|---|---|---|---|---|---|---|---|---|---|
| Composition 86 | Dispersion liquid 14 | 43.8 | G-1 | 5.5 | B-1 | 6.4 | C-13 | 1 | H-1 | 1.6 |
| Composition 87 | Dispersion liquid 14 | 43.8 | G-1 | 5.5 | B-1 | 6.4 | C-15 | 1 | H-1 | 1.6 |

| Name of photosensitive composition | Antioxidant | | Additive | | Surfactant | | Polymerization inhibitor | | Solvent | |
|---|---|---|---|---|---|---|---|---|---|---|
| | Type | Part by mass | Type | Part by mass | Type | Part by mass | Type | Part by mass | Type | Part by mass |
| Composition 62 | I-1 | 0.2 | — | 0 | J-1 | 0.025 | K-1 | 0.003 | D-1 | 41.5 |
| Composition 63 | I-1 | 0.2 | — | 0 | J-1 | 0.025 | K-1 | 0.003 | D-1 | 41.5 |
| Composition 64 | I-1 | 0.2 | — | 0 | J-1 | 0.025 | K-1 | 0.003 | D-1 | 41.5 |
| Composition 65 | I-1 | 0.2 | — | 0 | J-1 | 0.025 | K-1 | 0.003 | D-1 | 41.5 |
| Composition 66 | I-1 | 0.2 | — | 0 | J-1 | 0.025 | K-1 | 0.003 | D-1 | 41.5 |
| Composition 67 | I-1 | 0.2 | — | 0 | J-1 | 0.025 | K-1 | 0.003 | D-1 | 41.5 |
| Composition 68 | I-1 | 0.2 | — | 0 | J-1 | 0.025 | K-1 | 0.003 | D-1 | 41.5 |
| Composition 69 | I-1 | 0.2 | — | 0 | J-1 | 0.025 | K-1 | 0.003 | D-1 | 41.5 |
| Composition 70 | I-1 | 0.2 | — | 0 | J-1 | 0.025 | K-1 | 0.003 | D-1 | 41.5 |
| Composition 71 | I-1 | 0.2 | — | 0 | J-1 | 0.025 | K-1 | 0.003 | D-1 | 41.5 |
| Composition 72 | I-1 | 0.2 | — | 0 | J-1 | 0.025 | K-1 | 0.003 | D-1 | 41.5 |
| Composition 73 | I-1 | 0.2 | — | 0 | J-1 | 0.025 | K-1 | 0.003 | D-1 | 41.5 |
| Composition 74 | I-1 | 0.2 | — | 0 | J-1 | 0.025 | K-1 | 0.003 | D-1 | 41.5 |
| Composition 75 | I-1 | 0.2 | — | 0 | J-1 | 0.025 | K-1 | 0.003 | D-1 | 41.5 |
| Composition 76 | I-1 | 0.2 | — | 0 | J-1 | 0.025 | K-1 | 0.003 | D-1 | 41.5 |
| Composition 77 | I-1 | 0.2 | — | 0 | J-1 | 0.025 | K-1 | 0.003 | D-1 | 41.5 |
| Composition 78 | I-1 | 0.2 | — | 0 | J-1 | 0.025 | K-1 | 0.003 | D-1 | 41.5 |
| Composition 79 | I-1 | 0.2 | — | 0 | J-1 | 0.025 | K-1 | 0.003 | D-1 | 41.5 |
| Composition 80 | I-1 | 0.2 | — | 0 | J-1 | 0.025 | K-1 | 0.003 | D-1 | 41.5 |
| Composition 81 | I-1 | 0.2 | — | 0 | J-1 | 0.025 | K-1 | 0.003 | D-1 | 41.5 |
| Composition 82 | I-1 | 0.2 | — | 0 | J-1 | 0.025 | K-1 | 0.003 | D-1 | 41.5 |
| Composition 83 | I-1 | 0.2 | — | 0 | J-1 | 0.025 | K-1 | 0.003 | D-1 | 41.5 |
| Composition 84 | I-1 | 0.2 | — | 0 | J-1 | 0.025 | K-1 | 0.003 | D-1 | 41.5 |
| Composition 85 | I-1 | 0.2 | — | 0 | J-1 | 0.025 | K-1 | 0.003 | D-1 | 41.5 |
| Composition 86 | I-1 | 0.2 | — | 0 | J-1 | 0.025 | K-1 | 0.003 | D-1 | 41.5 |
| Composition 87 | I-1 | 0.2 | — | 0 | J-1 | 0.025 | K-1 | 0.003 | D-1 | 41.5 |

TABLE 6

| Name of photosensitive composition | Compound A or dispersion liquid | | Alkali-soluble resin | | Polymerizable compound | | Photopolymerization initiator | | Ultraviolet absorber | |
|---|---|---|---|---|---|---|---|---|---|---|
| | Type | Part by mass | Type | Part by mass | Type | Part by mass | Type | Part by mass | Type | Part by mass |
| Composition 88 | Dispersion liquid 14 | 43.8 | G-1 | 5.5 | B-1 | 6.4 | C-7<br>C-13 | 0.5<br>0.5 | H-1 | 1.6 |
| Composition 89 | Dispersion liquid 14 | 43.8 | G-1 | 5.5 | B-1 | 6.4 | C-8 | 1 | H-1 | 1.6 |
| Composition 90 | Dispersion liquid 14 | 43.8 | G-1 | 5.5 | B-1 | 6.4 | C-13 | 1 | H-1 | 1.6 |
| Composition 91 | Dispersion liquid 14 | 43.8 | G-1 | 5.5 | B-1 | 6.4 | C-15 | 1 | H-1 | 1.6 |
| Composition 92 | Dispersion liquid 14 | 43.8 | G-1 | 5.5 | B-1 | 6.4 | C-7<br>C-13 | 0.5<br>0.5 | H-1 | 1.6 |
| Composition 93 | Dispersion liquid 14 | 43.8 | G-1 | 5.5 | B-1 | 6.4 | C-8 | 1 | H-1 | 1.6 |
| Composition 94 | Dispersion liquid 14 | 43.8 | G-1 | 5.5 | B-1 | 6.4 | C-13 | 1 | H-1 | 1.6 |
| Composition 95 | Dispersion liquid 14 | 43.8 | G-1 | 5.5 | B-1 | 6.4 | C-15 | 1 | H-1 | 1.6 |
| Composition 96 | Dispersion liquid 14 | 43.8 | G-1 | 5.5 | B-1 | 6.4 | C-7<br>C-13 | 0.5<br>0.5 | H-1 | 1.6 |
| Composition 97 | Dispersion liquid 14 | 43.8 | G-1 | 5.5 | B-1 | 6.4 | C-7 | 1 | H-2 | 1.6 |
| Composition 98 | Dispersion liquid 14 | 43.8 | G-1 | 5.5 | B-1 | 6.4 | C-7 | 1 | H-3 | 1.6 |
| Composition 99 | Dispersion liquid 14 | 43.8 | G-1 | 5.5 | B-1 | 6.4 | C-7 | 1 | H-1<br>H-3 | 0.8<br>0.8 |
| Composition 100 | Dispersion liquid 14 | 43.8 | G-1 | 5.5 | B-1 | 6.4 | C-7 | 1 | H-2 | 1.6 |
| Composition 101 | Dispersion liquid 14 | 43.8 | G-1 | 5.5 | B-1 | 6.4 | C-7 | 1 | H-3 | 1.6 |
| Composition 102 | Dispersion liquid 14 | 43.8 | G-1 | 5.5 | B-1 | 6.4 | C-7 | 1 | H-1<br>H-3 | 0.8<br>0.8 |
| Composition 103 | Dispersion liquid 14 | 43.8 | G-1 | 5.5 | B-1 | 6.4 | C-7 | 1 | H-2 | 1.6 |
| Composition 104 | Dispersion liquid 14 | 43.8 | G-1 | 5.5 | B-1 | 6.4 | C-7 | 1 | H-3 | 1.6 |
| Composition 105 | Dispersion liquid 14 | 43.8 | G-1 | 5.5 | B-1 | 6.4 | C-7 | 1 | H-1<br>H-3 | 0.8<br>0.8 |
| Composition 106 | Dispersion liquid 14 | 43.8 | G-1 | 5.5 | B-1 | 6.4 | C-7 | 1 | H-1 | 1.6 |
| Composition 107 | Dispersion liquid 14 | 43.8 | G-1 | 5.5 | B-1 | 6.4 | C-7 | 1 | H-1 | 1.6 |
| Composition 108 | Dispersion liquid 14 | 43.8 | G-1 | 5.5 | B-1 | 6.4 | C-7 | 1 | H-1 | 1.6 |
| Composition 109 | Dispersion liquid 14 | 43.8 | G-1 | 5.5 | B-1 | 6.4 | C-7 | 1 | H-1 | 1.6 |
| Composition 110 | Dispersion liquid 14 | 43.8 | G-1 | 5.5 | B-1 | 6.4 | C-7 | 1 | H-1 | 1.6 |
| Composition 111 | Dispersion liquid 14 | 43.8 | G-1 | 5.5 | B-1 | 6.4 | C-7 | 1 | H-1 | 1.6 |
| Composition 112 | Dispersion liquid 14 | 43.8 | G-1 | 5.4 | B-1 | 6.3 | C-7 | 1 | H-1 | 1.6 |
| Composition 113 | Dispersion liquid 14 | 43.8 | G-1 | 5.4 | B-1 | 6.3 | C-7 | 1 | H-1 | 1.6 |

TABLE 6-continued

| Name of photosensitive composition | Antioxidant Type | Part by mass | Additive Type | Part by mass | Surfactant Type | Part by mass | Polymerization inhibitor Type | Part by mass | Solvent Type | Part by mass |
|---|---|---|---|---|---|---|---|---|---|---|
| Composition 88  | I-1 | 0.2 | — | 0 | J-1 | 0.025 | K-1 | 0.003 | D-1 | 41.5 |
| Composition 89  | I-1 | 0.2 | — | 0 | J-1 | 0.025 | K-1 | 0.003 | D-1 | 41.5 |
| Composition 90  | I-1 | 0.2 | — | 0 | J-1 | 0.025 | K-1 | 0.003 | D-1 | 41.5 |
| Composition 91  | I-1 | 0.2 | — | 0 | J-1 | 0.025 | K-1 | 0.003 | D-1 | 41.5 |
| Composition 92  | I-1 | 0.2 | — | 0 | J-1 | 0.025 | K-1 | 0.003 | D-1 | 41.5 |
| Composition 93  | I-1 | 0.2 | — | 0 | J-1 | 0.025 | K-1 | 0.003 | D-1 | 41.5 |
| Composition 94  | I-1 | 0.2 | — | 0 | J-1 | 0.025 | K-1 | 0.003 | D-1 | 41.5 |
| Composition 95  | I-1 | 0.2 | — | 0 | J-1 | 0.025 | K-1 | 0.003 | D-1 | 41.5 |
| Composition 96  | I-1 | 0.2 | — | 0 | J-1 | 0.025 | K-1 | 0.003 | D-1 | 41.5 |
| Composition 97  | I-1 | 0.2 | — | 0 | J-1 | 0.025 | K-1 | 0.003 | D-1 | 41.5 |
| Composition 98  | I-1 | 0.2 | — | 0 | J-1 | 0.025 | K-1 | 0.003 | D-1 | 41.5 |
| Composition 99  | I-1 | 0.2 | — | 0 | J-1 | 0.025 | K-1 | 0.003 | D-1 | 41.5 |
| Composition 100 | I-1 | 0.2 | — | 0 | J-1 | 0.025 | K-1 | 0.003 | D-1 | 41.5 |
| Composition 101 | I-1 | 0.2 | — | 0 | J-1 | 0.025 | K-1 | 0.003 | D-1 | 41.5 |
| Composition 102 | I-1 | 0.2 | — | 0 | J-1 | 0.025 | K-1 | 0.003 | D-1 | 41.5 |
| Composition 103 | I-1 | 0.2 | — | 0 | J-1 | 0.025 | K-1 | 0.003 | D-1 | 41.5 |
| Composition 104 | I-1 | 0.2 | — | 0 | J-1 | 0.025 | K-1 | 0.003 | D-1 | 41.5 |
| Composition 105 | I-1 | 0.2 | — | 0 | J-1 | 0.025 | K-1 | 0.003 | D-1 | 41.5 |
| Composition 106 | 1-2 | 0.2 | — | 0 | J-1 | 0.025 | K-1 | 0.003 | D-1 | 41.5 |
| Composition 107 | 1-3 | 0.2 | — | 0 | J-1 | 0.025 | K-1 | 0.003 | D-1 | 41.5 |
| Composition 108 | 1-2 | 0.2 | — | 0 | J-1 | 0.025 | K-1 | 0.003 | D-1 | 41.5 |
| Composition 109 | 1-3 | 0.2 | — | 0 | J-1 | 0.025 | K-1 | 0.003 | D-1 | 41.5 |
| Composition 110 | 1-2 | 0.2 | — | 0 | J-1 | 0.025 | K-1 | 0.003 | D-1 | 41.5 |
| Composition 111 | 1-3 | 0.2 | — | 0 | J-1 | 0.025 | K-1 | 0.003 | D-1 | 41.5 |
| Composition 112 | I-1 | 0.2 | L-1 | 0.2 | J-1 | 0.025 | K-1 | 0.003 | D-1 | 41.5 |
| Composition 113 | I-1 | 0.2 | L-2 | 0.2 | J-1 | 0.025 | K-1 | 0.003 | D-1 | 41.5 |

TABLE 7

| Name of photosensitive composition | Compound A or dispersion liquid Type | Part by mass | Alkali-soluble resin Type | Part by mass | Polymerizable compound Type | Part by mass | Photopolymerization initiator Type | Part by mass | Ultraviolet absorber Type | Part by mass |
|---|---|---|---|---|---|---|---|---|---|---|
| Composition 114 | Dispersion liquid 14 | 43.8 | G-1 | 5.4 | B-1 | 6.3 | C-7 | 1 | H-1 | 1.6 |
| Composition 115 | Dispersion liquid 14 | 43.8 | G-1 | 5.3 | B-1 | 6.2 | C-7 | 1 | H-1 | 1.6 |
| Composition 116 | Dispersion liquid 14 | 43.8 | G-1 | 5.4 | B-1 | 6.3 | C-7 | 1 | H-1 | 1.6 |
| Composition 117 | Dispersion liquid 14 | 43.8 | G-1 | 5.4 | B-1 | 6.3 | C-7 | 1 | H-1 | 1.6 |
| Composition 118 | Dispersion liquid 14 | 43.8 | G-1 | 5.4 | B-1 | 6.3 | C-7 | 1 | H-1 | 1.6 |
| Composition 119 | Dispersion liquid 14 | 43.8 | G-1 | 5.3 | B-1 | 6.2 | C-7 | 1 | H-1 | 1.6 |
| Composition 120 | Dispersion liquid 14 | 43.8 | G-1 | 5.4 | B-1 | 6.3 | C-7 | 1 | H-1 | 1.6 |
| Composition 121 | Dispersion liquid 14 | 43.8 | G-1 | 5.4 | B-1 | 6.3 | C-7 | 1 | H-1 | 1.6 |
| Composition 122 | Dispersion liquid 14 | 43.8 | G-1 | 5.4 | B-1 | 6.3 | C-7 | 1 | H-1 | 1.6 |
| Composition 123 | Dispersion liquid 14 | 43.8 | G-1 | 5.3 | B-1 | 6.2 | C-7 | 1 | H-1 | 1.6 |
| Composition 124 | Dispersion liquid 14 | 43.8 | G-1 | 5.5 | B-1 | 6.4 | C-7 | 1 | H-1 | 1.6 |
| Composition 125 | Dispersion liquid 14 | 43.8 | G-1 | 5.5 | B-1 | 6.4 | C-7 | 1 | H-1 | 1.6 |
| Composition 126 | Dispersion liquid 14 | 43.8 | G-1 | 5.5 | B-1 | 6.4 | C-7 | 1 | H-1 | 1.6 |
| Composition 127 | Dispersion liquid 14 | 43.8 | G-1 | 5.5 | B-1 | 6.4 | C-7 | 1 | H-1 | 1.6 |
| Composition 128 | Dispersion liquid 14 | 43.8 | G-1 | 5.5 | B-1 | 6.4 | C-7 | 1 | H-1 | 1.6 |
| Composition 129 | Dispersion liquid 14 | 43.8 | G-1 | 5.5 | B-1 | 6.4 | C-7 | 1 | H-1 | 1.6 |
| Composition 130 | Dispersion liquid 14 | 43.8 | G-1 | 5.5 | B-1 | 6.4 | C-7 | 1 | H-1 | 1.6 |
| Composition 131 | Dispersion liquid 14 | 43.8 | G-1 | 5.5 | B-1 | 6.4 | C-7 | 1 | H-1 | 1.6 |
| Composition 132 | Dispersion liquid 14 | 43.8 | G-1 | 5.5 | B-1 | 6.4 | C-7 | 1 | H-1 | 1.6 |
| Composition 133 | A-b-9 | 3 | G-1 | 7.3 | B-1 | 6.4 | C-7 | 1 | H-1 | 1.6 |
| Composition 134 | A-b-9 | 3 | G-1 | 7.3 | B-1 | 6.4 | C-7 | 1 | H-1 | 1.6 |
| Composition 135 | A-c-3 | 3 | G-1 | 7.3 | B-1 | 6.4 | C-7 | 1 | H-1 | 1.6 |
| Composition 136 | A-c-3 | 3 | G-1 | 7.3 | B-1 | 6.4 | C-7 | 1 | H-1 | 1.6 |
| Composition 137 | A-e-6 | 3 | G-1 | 7.3 | B-1 | 6.4 | C-7 | 1 | H-1 | 1.6 |
| Composition 138 | A-e-6 | 3 | G-1 | 7.3 | B-1 | 6.4 | C-7 | 1 | H-1 | 1.6 |
| Composition R1  | Dispersion liquid R1 | 43.8 | G-1 | 5.5 | B-1 | 6.4 | C-7 | 1 | H-1 | 1.6 |
| Composition R2  | Dispersion liquid R2 | 43.8 | G-1 | 5.5 | B-1 | 6.4 | C-7 | 1 | H-1 | 1.6 |

TABLE 7-continued

| Name of photosensitive composition | Antioxidant Type | Part by mass | Additive Type | Part by mass | Surfactant Type | Part by mass | Polymerization inhibitor Type | Part by mass | Solvent Type | Part by mass |
|---|---|---|---|---|---|---|---|---|---|---|
| Composition 114 | I-1 | 0.2 | L-3 | 0.2 | J-1 | 0.025 | K-1 | 0.003 | D-1 | 41.5 |
| Composition 115 | I-1 | 0.2 | L-1 | 0.2 | J-1 | 0.025 | K-1 | 0.003 | D-1 | 41.5 |
|  |  |  | L-3 | 0.2 |  |  |  |  |  |  |
| Composition 116 | I-1 | 0.2 | L-1 | 0.2 | J-1 | 0.025 | K-1 | 0.003 | D-1 | 41.5 |
| Composition 117 | I-1 | 0.2 | L-2 | 0.2 | J-1 | 0.025 | K-1 | 0.003 | D-1 | 41.5 |
| Composition 118 | I-1 | 0.2 | L-3 | 0.2 | J-1 | 0.025 | K-1 | 0.003 | D-1 | 41.5 |
| Composition 119 | I-1 | 0.2 | L-1 | 0.2 | J-1 | 0.025 | K-1 | 0.003 | D-1 | 41.5 |
|  |  |  | L-3 | 0.2 |  |  |  |  |  |  |
| Composition 120 | I-1 | 0.2 | L-1 | 0.2 | J-1 | 0.025 | K-1 | 0.003 | D-1 | 41.5 |
| Composition 121 | I-1 | 0.2 | L-2 | 0.2 | J-1 | 0.025 | K-1 | 0.003 | D-1 | 41.5 |
| Composition 122 | I-1 | 0.2 | L-3 | 0.2 | J-1 | 0.025 | K-1 | 0.003 | D-1 | 41.5 |
| Composition 123 | I-1 | 0.2 | L-1 | 0.2 | J-1 | 0.025 | K-1 | 0.003 | D-1 | 41.5 |
|  |  |  | L-3 | 0.2 |  |  |  |  |  |  |
| Composition 124 | I-1 | 0.2 | — | 0 | J-1 | 0.025 | K-1 | 0.003 | D-2 | 41.5 |
| Composition 125 | I-1 | 0.2 | — | 0 | J-1 | 0.025 | K-1 | 0.003 | D-3 | 41.5 |
| Composition 126 | I-1 | 0.2 | — | 0 | J-1 | 0.025 | K-1 | 0.003 | D-1 | 21.0 |
|  |  |  |  |  |  |  |  |  | D-2 | 20.5 |
| Composition 127 | I-1 | 0.2 | — | 0 | J-1 | 0.025 | K-1 | 0.003 | D-2 | 41.5 |
| Composition 128 | I-1 | 0.2 | — | 0 | J-1 | 0.025 | K-1 | 0.003 | D-3 | 41.5 |
| Composition 129 | I-1 | 0.2 | — | 0 | J-1 | 0.025 | K-1 | 0.003 | D-1 | 21.0 |
|  |  |  |  |  |  |  |  |  | D-2 | 20.5 |
| Composition 130 | I-1 | 0.2 | — | 0 | J-1 | 0.025 | K-1 | 0.003 | D-2 | 41.5 |
| Composition 131 | I-1 | 0.2 | — | 0 | J-1 | 0.025 | K-1 | 0.003 | D-3 | 41.5 |
| Composition 132 | I-1 | 0.2 | — | 0 | J-1 | 0.025 | K-1 | 0.003 | D-1 | 21.0 |
|  |  |  |  |  |  |  |  |  | D-2 | 20.5 |
| Composition 133 | I-1 | 0.2 | — | 0 | J-1 | 0.025 | K-1 | 0.003 | D-4 | 80.5 |
| Composition 134 | I-1 | 0.2 | — | 0 | J-1 | 0.025 | K-1 | 0.003 | D-5 | 80.5 |
| Composition 135 | I-1 | 0.2 | — | 0 | J-1 | 0.025 | K-1 | 0.003 | D-5 | 80.5 |
| Composition 136 | I-1 | 0.2 | — | 0 | J-1 | 0.025 | K-1 | 0.003 | D-5 | 80.5 |
| Composition 137 | I-1 | 0.2 | — | 0 | J-1 | 0.025 | K-1 | 0.003 | D-4 | 80.5 |
| Composition 138 | I-1 | 0.2 | — | 0 | J-1 | 0.025 | K-1 | 0.003 | D-5 | 80.5 |
| Composition R1 | I-1 | 0.2 | — | 0 | J-1 | 0.025 | K-1 | 0.003 | D-1 | 41.5 |
| Composition R2 | I-1 | 0.2 | — | 0 | J-1 | 0.025 | K-1 | 0.003 | D-1 | 41.5 |

TABLE 8

| Name of photosensitive composition | Compound A or dispersion liquid Type | Part by mass | Alkali-soluble resin Type | Part by mass | Polymerizable compound Type | Part by mass | Photopolymerization initiator Type | Part by mass | Ultraviolet absorber Type | Part by mass |
|---|---|---|---|---|---|---|---|---|---|---|
| Composition 139 | Dispersion liquid 55 | 43.8 | G-1 | 5.5 | B-1 | 6.4 | C-7 | 1 | H-1 | 1.6 |
| Composition 140 | Dispersion liquid 56 | 43.8 | G-1 | 5.5 | B-1 | 6.4 | C-7 | 1 | H-1 | 1.6 |
| Composition 141 | Dispersion liquid 57 | 43.8 | G-1 | 5.5 | B-1 | 6.4 | C-7 | 1 | H-1 | 1.6 |
| Composition 142 | Dispersion liquid 58 | 43.8 | G-1 | 5.5 | B-1 | 6.4 | C-7 | 1 | H-1 | 1.6 |
| Composition 143 | Dispersion liquid 59 | 43.8 | G-1 | 5.5 | B-1 | 6.4 | C-7 | 1 | H-1 | 1.6 |
| Composition 144 | Dispersion liquid 60 | 43.8 | G-1 | 5.5 | B-1 | 6.4 | C-7 | 1 | H-1 | 1.6 |
| Composition 145 | Dispersion liquid 61 | 43.8 | G-1 | 5.5 | B-1 | 6.4 | C-7 | 1 | H-1 | 1.6 |
| Composition 146 | Dispersion liquid 62 | 43.8 | G-1 | 5.5 | B-1 | 6.4 | C-7 | 1 | H-1 | 1.6 |
| Composition 147 | Dispersion liquid 63 | 43.8 | G-1 | 5.5 | B-1 | 6.4 | C-7 | 1 | H-1 | 1.6 |
| Composition 148 | Dispersion liquid 64 | 43.8 | G-1 | 5.5 | B-1 | 6.4 | C-7 | 1 | H-1 | 1.6 |
| Composition 149 | Dispersion liquid 65 | 43.8 | G-1 | 5.5 | B-1 | 6.4 | C-7 | 1 | H-1 | 1.6 |
| Composition 150 | Dispersion liquid 66 | 43.8 | G-1 | 5.5 | B-1 | 6.4 | C-7 | 1 | H-1 | 1.6 |
| Composition 151 | Dispersion liquid 67 | 43.8 | G-1 | 5.5 | B-1 | 6.4 | C-7 | 1 | H-1 | 1.6 |
| Composition 152 | Dispersion liquid 68 | 43.8 | G-1 | 5.5 | B-1 | 6.4 | C-7 | 1 | H-1 | 1.6 |
| Composition 153 | Dispersion liquid 69 | 43.8 | G-1 | 5.5 | B-1 | 6.4 | C-7 | 1 | H-1 | 1.6 |
| Composition 154 | Dispersion liquid 70 | 43.8 | G-1 | 5.5 | B-1 | 6.4 | C-7 | 1 | H-1 | 1.6 |
| Composition 155 | Dispersion liquid 71 | 43.8 | G-1 | 5.5 | B-1 | 6.4 | C-7 | 1 | H-1 | 1.6 |
| Composition 156 | Dispersion liquid 72 | 43.8 | G-1 | 5.5 | B-1 | 6.4 | C-7 | 1 | H-1 | 1.6 |
| Composition 157 | Dispersion liquid 73 | 43.8 | G-1 | 5.5 | B-1 | 6.4 | C-7 | 1 | H-1 | 1.6 |

TABLE 8-continued

| Composition | Dispersion liquid | | | | | | | | | |
|---|---|---|---|---|---|---|---|---|---|---|
| Composition 158 | Dispersion liquid 74 | 43.8 | G-1 | 5.5 | B-1 | 6.4 | C-7 | 1 | H-1 | 1.6 |
| Composition 159 | Dispersion liquid 75 | 43.8 | G-1 | 5.5 | B-1 | 6.4 | C-7 | 1 | H-1 | 1.6 |
| Composition 160 | Dispersion liquid 76 | 43.8 | G-1 | 5.5 | B-1 | 6.4 | C-7 | 1 | H-1 | 1.6 |
| Composition 161 | Dispersion liquid 77 | 43.8 | G-1 | 5.5 | B-1 | 6.4 | C-7 | 1 | H-1 | 1.6 |
| Composition 162 | Dispersion liquid 78 | 43.8 | G-1 | 5.5 | B-1 | 6.4 | C-7 | 1 | H-1 | 1.6 |
| Composition 163 | Dispersion liquid 79 | 43.8 | G-1 | 5.5 | B-1 | 6.4 | C-7 | 1 | H-1 | 1.6 |

| Name of photosensitive composition | Antioxidant | | Additive | | Surfactant | | Polymerization inhibitor | | Solvent | |
|---|---|---|---|---|---|---|---|---|---|---|
| | Type | Part by mass | Type | Part by mass | Type | Part by mass | Type | Part by mass | Type | Part by mass |
| Composition 139 | I-1 | 0.2 | — | 0 | J-1 | 0.025 | K-1 | 0.003 | D-1 | 41.5 |
| Composition 140 | I-1 | 0.2 | — | 0 | J-1 | 0.025 | K-1 | 0.003 | D-1 | 41.5 |
| Composition 141 | I-1 | 0.2 | — | 0 | J-1 | 0.025 | K-1 | 0.003 | D-1 | 41.5 |
| Composition 142 | I-1 | 0.2 | — | 0 | J-1 | 0.025 | K-1 | 0.003 | D-1 | 41.5 |
| Composition 143 | I-1 | 0.2 | — | 0 | J-1 | 0.025 | K-1 | 0.003 | D-1 | 41.5 |
| Composition 144 | I-1 | 0.2 | — | 0 | J-1 | 0.025 | K-1 | 0.003 | D-1 | 41.5 |
| Composition 145 | I-1 | 0.2 | — | 0 | J-1 | 0.025 | K-1 | 0.003 | D-1 | 41.5 |
| Composition 146 | I-1 | 0.2 | — | 0 | J-1 | 0.025 | K-1 | 0.003 | D-1 | 41.5 |
| Composition 147 | I-1 | 0.2 | — | 0 | J-1 | 0.025 | K-1 | 0.003 | D-1 | 41.5 |
| Composition 148 | I-1 | 0.2 | — | 0 | J-1 | 0.025 | K-1 | 0.003 | D-1 | 41.5 |
| Composition 149 | I-1 | 0.2 | — | 0 | J-1 | 0.025 | K-1 | 0.003 | D-1 | 41.5 |
| Composition 150 | I-1 | 0.2 | — | 0 | J-1 | 0.025 | K-1 | 0.003 | D-1 | 41.5 |
| Composition 151 | I-1 | 0.2 | — | 0 | J-1 | 0.025 | K-1 | 0.003 | D-1 | 41.5 |
| Composition 152 | I-1 | 0.2 | — | 0 | J-1 | 0.025 | K-1 | 0.003 | D-1 | 41.5 |
| Composition 153 | I-1 | 0.2 | — | 0 | J-1 | 0.025 | K-1 | 0.003 | D-1 | 41.5 |
| Composition 154 | I-1 | 0.2 | — | 0 | J-1 | 0.025 | K-1 | 0.003 | D-1 | 41.5 |
| Composition 155 | I-1 | 0.2 | — | 0 | J-1 | 0.025 | K-1 | 0.003 | D-1 | 41.5 |
| Composition 156 | I-1 | 0.2 | — | 0 | J-1 | 0.025 | K-1 | 0.003 | D-1 | 41.5 |
| Composition 157 | I-1 | 0.2 | — | 0 | J-1 | 0.025 | K-1 | 0.003 | D-1 | 41.5 |
| Composition 158 | I-1 | 0.2 | — | 0 | J-1 | 0.025 | K-1 | 0.003 | D-1 | 41.5 |
| Composition 159 | I-1 | 0.2 | — | 0 | J-1 | 0.025 | K-1 | 0.003 | D-1 | 41.5 |
| Composition 160 | I-1 | 0.2 | — | 0 | J-1 | 0.025 | K-1 | 0.003 | D-1 | 41.5 |
| Composition 161 | I-1 | 0.2 | — | 0 | J-1 | 0.025 | K-1 | 0.003 | D-1 | 41.5 |
| Composition 162 | I-1 | 0.2 | — | 0 | J-1 | 0.025 | K-1 | 0.003 | D-1 | 41.5 |
| Composition 163 | I-1 | 0.2 | — | 0 | J-1 | 0.025 | K-1 | 0.003 | D-1 | 41.5 |

The materials described in the above tables are as follows.

(Compound A)

A-b-9, A-c-3, A-e-6: compounds A-b-9, A-c-3, and A-e-6 having a structure shown in the specific examples of the oxocarbon compound A described above (Dispersion Liquid)

Dispersion liquids 1 to 79, R1, R2: dispersion liquids 1 to 79, R1, and R2 described above (Alkali-Soluble Resin)

G-1: resin having the following structure (acid value=69.2 mgKOH/g, weight-average molecular weight=10000), a numerical value added to a main chain represents a molar ratio of a repeating unit.

G-2: resin having the following structure (acid value=91.3 mgKOH/g, weight-average molecular weight=41000), a numerical value added to a main chain represents a molar ratio of a repeating unit.

G-3: resin having the following structure (acid value=76.8 mgKOH/g, weight-average molecular weight=17000), a numerical value added to a main chain represents a molar ratio of a repeating unit.

G-4: resin having the following structure (acid value=110 mgKOH/g, weight-average molecular weight=10000), a numerical value added to a main chain represents a molar ratio of a repeating unit.

G-5: resin having the following structure (acid value=184 mgKOH/g, weight-average molecular weight=9700), a numerical value added to a main chain represents a molar ratio of a repeating unit.

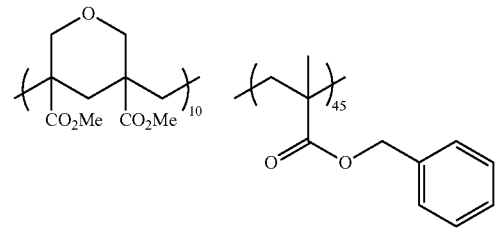

(G-1)

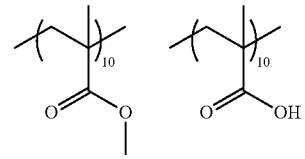

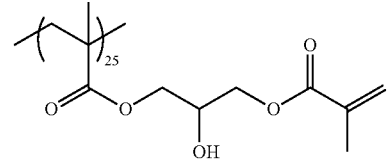

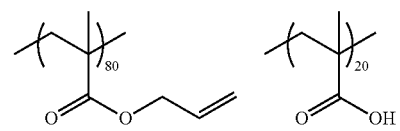

(G-2)

-continued

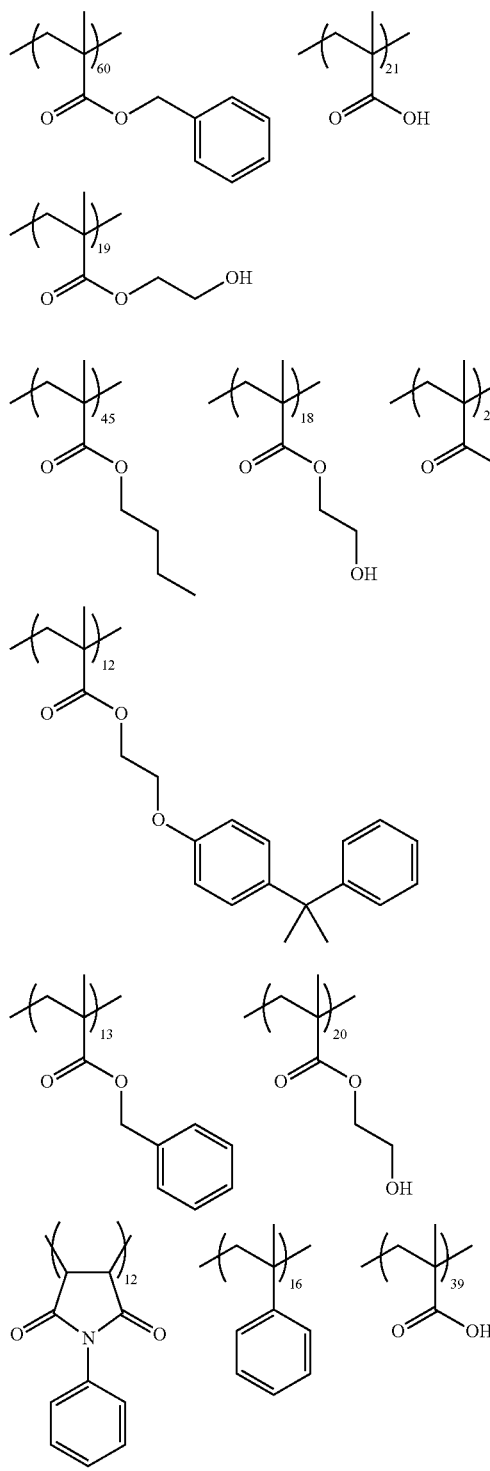

(Polymerizable Compound)

B-1: mixture of compounds having the following structures (a molar ratio between a left compound and a right compound is 7:3)

B-2: compound having the following structure

B-3: mixture of compounds having the following structures (containing 55 to 63 mol % of a left compound)

B-4: compound having the following structure

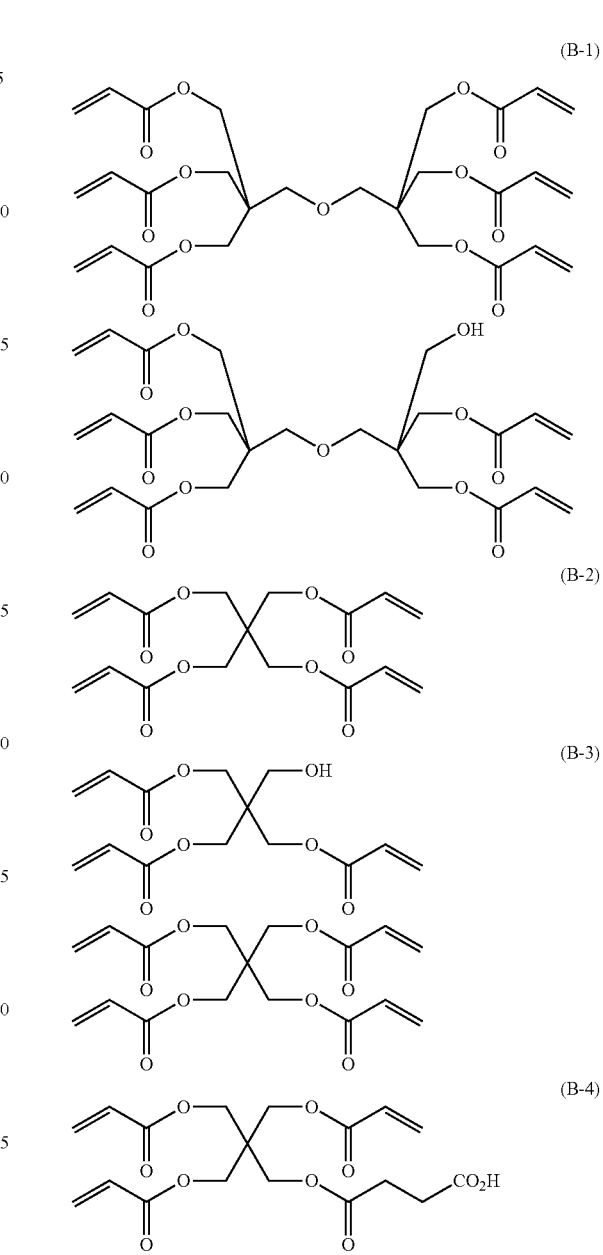

(Photopolymerization Initiator)
C-7, C-8, C-13, C-15: compounds C-7, C-8, C-13, and C-15 having a structure shown in the specific examples of the oxime compound described above (Ultraviolet Absorber)
H-1 to H-3: compounds having the following structures

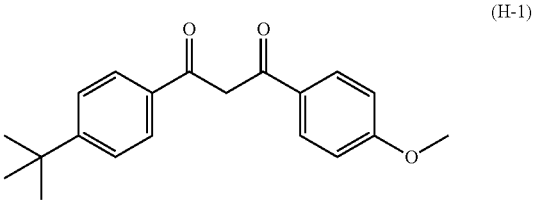

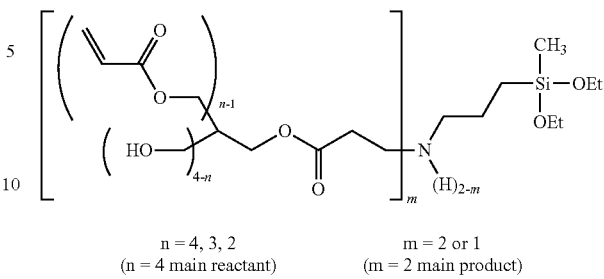
(Antioxidant)
I-1 to I-3: compounds having the following structures
(Surfactant)
J-1: compound having the following structure (weight-average molecular weight=14000; in the formula, "%" representing the proportion of a repeating unit is mol %)
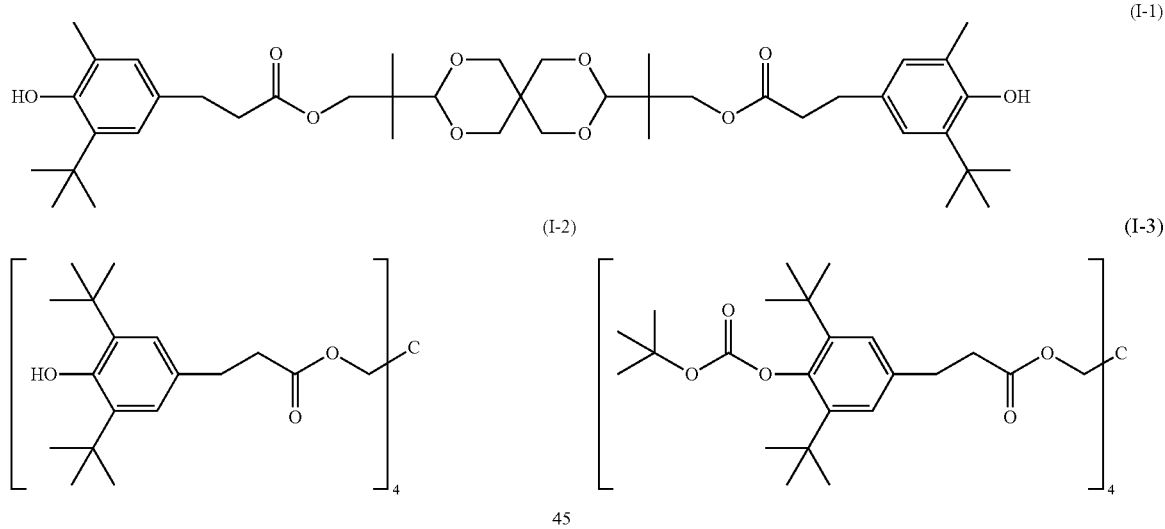
(Additive)
L-1 to L-3: compounds having the following structures
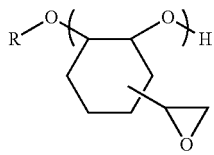
(L-1)
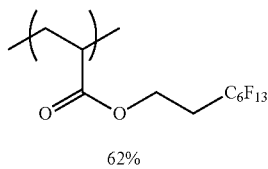
(J-1)
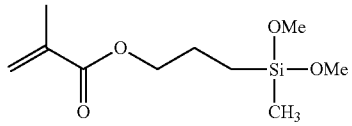
(L-2)
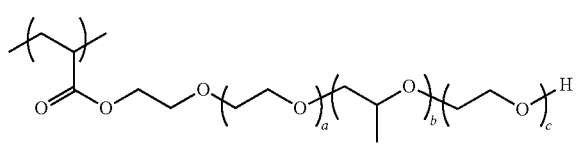

-continued

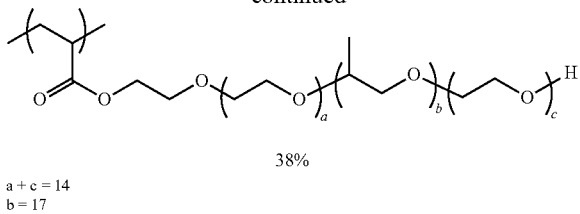

38% a + c = 14
b = 17

(Polymerization Inhibitor)
K-1: p-methoxyphenol
(Solvent)
D-1: propylene glycol monomethyl ether acetate
D-2: propylene glycol monomethyl ether
D-3: cyclopentanone
D-4: 3-methoxy-N,N-dimethylpropanamide
D-5: 3-buthoxy-N,N-dimethylpropanamide
<Production of Cured Film>

Examples 1 to 163 and Comparative Examples 1 and 2

Each of the photosensitive compositions was applied to a glass substrate (1737 manufactured by Corning Inc.) using a spin coater such that the thickness of a film after drying was 1.0 μm, and a heat treatment (pre-baking) was performed for 120 seconds using a hot plate at 100° C. Next, using an i-ray stepper exposure device FPA-3000 i5+ (manufactured by Canon Corporation), the entire surface of the film was exposed at an exposure dose of 500 mJ/cm$^2$. Next, using a developer (CD-2060, manufactured by FUJIFILM Electronic Materials Co., Ltd.), a puddle development was performed at 23° C. for 60 seconds, and then rinse treatment was performed with pure water and spin drying was performed. Furthermore, a heat treatment (post-baking) was performed for 300 seconds using a hot plate at 200° C., thereby obtaining a cured film.

<Evaluation of Spectral Characteristics>

Using a spectrophotometer (U-4100, manufactured by Hitachi High-Tech Corporation.), the absorption spectrum of the obtained cured film in a wavelength range of 400 to 1100 nm was measured. The maximum absorbance (Absλmax) in a wavelength of 650 to 1100 nm was measured, and "average absorbance at 400 to 600 nm" in a case where the maximum absorbance was set to be 1 was evaluated according to the following criteria. As the absorbance at 400 to 600 nm is smaller in a case where this absorbance is set to be 1, since the absorption spectrum has a steep spectral shape, and both high transparency in the visible range and high shielding properties in the near-infrared range are achieved, it can be said that the obtained film has excellent spectral characteristics.

A: less than 0.05
B: 0.05 or more and less than 0.1
C: 0.1 or more and less than 0.2
D: 0.2 or more and less than 0.3
E: 0.3 or more <Evaluation of Light Resistance>

After the obtained cured film was irradiated with light of 100000 lux for 5 hours from a Xe lamp through an ultraviolet cut filter, the color difference ΔEab value before and after irradiation of light was measured with a colorimeter MCPD-1000 (manufactured by OTSUKA ELECTRONICS Co., Ltd.). As the ΔEab value is smaller, light resistance is better. The ΔEab value is a value acquired using the following color difference expression based on the CIE1976 (L*, a*, b*) space color system (The Color Science Handbook (1985), new edition, p. 266, edited by The Color Science Association of Japan).

$$\Delta Eab = \{(\Delta L^*)^2 + (\Delta a^*)^2 + (\Delta b^*)^2\}^{1/2}$$

A: ΔEab value <2.5
B: 2.5≤ΔEab value<5
C: 5≤ΔEab value<10
D: 10≤ΔEab value<15
E: 15≤ΔEab value <Evaluation of Moisture Resistance>

A moisture resistance test was performed to the obtained cured film by allowing the obtained cured film to stand for 1000 hours under a high temperature and high humidity condition of 85° C. and a relative humidity of 95%. Regarding each of the cured films before and after the moisture resistance test, using a spectrophotometer (U-4100, manufactured by Hitachi High-Tech Corporation.), the maximum absorbance (Abs max) in a wavelength of 650 to 1100 nm and the minimum absorbance (Absλmin) in a wavelength of 400 to 650 nm were measured, and an absorbance ratio represented by "Absλmax/Absλmin" was obtained. The rate (%) of change in absorbance ratio, represented by |{(absorbance ratio of film before moisture resistance test−absorbance ratio of film after moisture resistance test)/absorbance ratio of film before moisture resistance test}×100|, was evaluated according to the following criteria. The results are shown in the tables below.

A: rate of change in absorbance ratio ≤2%
B: 2%<rate of change in absorbance ratio ≤4%
C: 4%<rate of change in absorbance ratio ≤7%
D: 7%<rate of change in absorbance ratio ≤10%
E: 10%<rate of change in absorbance ratio <Evaluation of Photolithography>

The photosensitive composition was applied to a silicon wafer with an undercoat layer by a spin coating method such that the thickness of a film after drying was 0.7 μm, and then heated on a hot plate at 100° C. for 2 minutes to obtain a composition layer. Next, the obtained composition layer was exposed to light (for the exposure dose, the optimum exposure amount to be a line width of 1.1 μm was selected) by using an i-rays stepper exposure device FPA-3000 i5+ (manufactured by Canon Inc.) through a mask having a Bayer pattern of 1.1 square. Next, puddle development was performed to the composition layer after exposure at 23° C. for 60 seconds using a tetramethylammonium hydroxide (TMAH) 0.3 mass % aqueous solution. Next, the composition layer was rinsed by spin showering and was cleaned with pure water to obtain a pattern. By binarizing the image, The amount of residue remaining on the undercoat of the obtained pattern was evaluated according to the following criteria.

A: amount of residue was 1% or less of the total area of the undercoat.
B: amount of residue was more than 1% and 3% or less of the total area of the undercoat.
C: amount of residue was more than 3% of the total area of the undercoat.

<Evaluation of Spectral Fluctuation during Exposure>

Regarding each of the films before and after exposure in the production of the above-described cured film, using a spectrophotometer (U-4100, manufactured by Hitachi High-Tech Corporation.), the maximum absorbance (Absλmax) in a wavelength of 650 to 1100 nm was measured, and the rate (%) of change in absorbance, represented by |{(absorbance of film before exposure−absorbance of film after exposure)/absorbance of film before exposure}×100|, was evaluated according to the following criteria.

A: rate of change in absorbance ≤2%
B: 2%<rate of change in absorbance ≤4%
C: 4%<rate of change in absorbance ≤7%
D: 7%<rate of change in absorbance ≤10%
E: 10%<rate of change in absorbance

TABLE 9

| Name of example | Name of photosensitive composition | Evaluation result | | | | |
|---|---|---|---|---|---|---|
| | | Spectral characteristics | Photolithography | Light resistance | Moisture resistance | Spectral fluctuation during exposure |
| Example 1 | Composition 1 | D | A | D | D | D |
| Example 2 | Composition 2 | D | A | D | D | D |
| Example 3 | Composition 3 | D | A | D | D | D |
| Example 4 | Composition 4 | D | A | D | D | D |
| Example 5 | Composition 5 | D | A | D | D | D |
| Example 6 | Composition 6 | D | A | D | D | D |
| Example 7 | Composition 7 | C | A | D | D | D |
| Example 8 | Composition 8 | C | A | D | D | D |
| Example 9 | Composition 9 | C | A | C | B | A |
| Example 10 | Composition 10 | B | A | C | B | A |
| Example 11 | Composition 11 | C | A | C | B | A |
| Example 12 | Composition 12 | C | A | C | B | A |
| Example 13 | Composition 13 | B | A | C | B | A |
| Example 14 | Composition 14 | A | A | C | A | A |
| Example 15 | Composition 15 | B | A | C | B | A |
| Example 16 | Composition 16 | B | A | C | B | A |
| Example 17 | Composition 17 | A | A | C | A | A |
| Example 18 | Composition 18 | A | A | C | A | A |
| Example 19 | Composition 19 | D | A | D | D | D |
| Example 20 | Composition 20 | D | A | D | D | D |
| Example 21 | Composition 21 | D | A | D | D | D |
| Example 22 | Composition 22 | C | A | D | D | D |
| Example 23 | Composition 23 | C | A | D | D | D |
| Example 24 | Composition 24 | D | A | D | D | D |
| Example 25 | Composition 25 | D | A | D | D | D |
| Example 26 | Composition 26 | B | A | B | C | A |
| Example 27 | Composition 27 | B | A | B | C | A |
| Example 28 | Composition 28 | B | A | B | C | A |
| Example 29 | Composition 29 | B | A | B | C | A |
| Example 30 | Composition 30 | A | A | A | C | A |
| Example 31 | Composition 31 | A | A | C | A | A |
| Example 32 | Composition 32 | A | A | B | B | A |
| Example 33 | Composition 33 | A | A | B | B | A |
| Example 34 | Composition 34 | A | B | C | A | B |
| Example 35 | Composition 35 | A | B | C | A | B |
| Example 36 | Composition 36 | B | B | B | C | B |
| Example 37 | Composition 37 | A | B | C | A | B |
| Example 38 | Composition 38 | A | B | B | B | B |
| Example 39 | Composition 39 | A | B | B | B | B |
| Comparative Example 1 | Composition R1 | B | C | E | E | E |
| Comparative Example 2 | Composition R2 | E | C | D | D | D |

TABLE 10

| Name of example | Name of photosensitive composition | Evaluation result | | | |
|---|---|---|---|---|---|
| | | Spectral characteristics | Photolithography | Light resistance | Moisture resistance |
| Example 40 | Composition 40 | B | A | C | A |
| Example 41 | Composition 41 | A | A | C | A |
| Example 42 | Composition 42 | A | A | C | A |
| Example 43 | Composition 43 | B | A | C | A |
| Example 44 | Composition 44 | A | A | C | A |
| Example 45 | Composition 45 | A | A | C | A |
| Example 46 | Composition 46 | B | A | A | C |
| Example 47 | Composition 47 | A | A | A | C |
| Example 48 | Composition 48 | A | A | A | C |
| Example 49 | Composition 49 | A | A | C | A |
| Example 50 | Composition 50 | A | A | C | A |
| Example 51 | Composition 51 | A | A | C | A |
| Example 52 | Composition 52 | A | A | C | A |
| Example 53 | Composition 53 | A | A | C | A |
| Example 54 | Composition 54 | A | A | C | A |
| Example 55 | Composition 55 | A | A | C | A |
| Example 56 | Composition 56 | A | A | C | A |
| Example 57 | Composition 57 | A | A | A | C |
| Example 58 | Composition 58 | A | A | A | C |

TABLE 10-continued

| Name of example | Name of photosensitive composition | Spectral characteristics | Photolithography | Light resistance | Moisture resistance |
|---|---|---|---|---|---|
| Example 59 | Composition 59 | A | A | A | C |
| Example 60 | Composition 60 | A | A | A | C |
| Example 61 | Composition 61 | A | A | C | A |
| Example 62 | Composition 62 | A | A | C | A |
| Example 63 | Composition 63 | A | A | C | A |
| Example 64 | Composition 64 | A | A | C | A |
| Example 65 | Composition 65 | A | A | C | A |
| Example 66 | Composition 66 | A | A | C | A |
| Example 67 | Composition 67 | A | A | C | A |
| Example 68 | Composition 68 | A | A | C | A |
| Example 69 | Composition 69 | A | A | C | A |
| Example 70 | Composition 70 | A | A | C | A |
| Example 71 | Composition 71 | A | A | A | C |
| Example 72 | Composition 72 | A | A | A | C |
| Example 73 | Composition 73 | A | A | A | C |
| Example 74 | Composition 74 | A | A | A | C |
| Example 75 | Composition 75 | A | A | A | C |
| Example 76 | Composition 76 | A | A | C | A |
| Example 77 | Composition 77 | A | A | C | A |
| Example 78 | Composition 78 | A | A | C | A |
| Example 79 | Composition 79 | A | A | C | A |
| Example 80 | Composition 80 | A | A | C | A |
| Example 81 | Composition 81 | A | A | C | A |
| Example 82 | Composition 82 | A | A | A | C |
| Example 83 | Composition 83 | A | A | A | C |
| Example 84 | Composition 84 | A | A | A | C |
| Example 85 | Composition 85 | A | A | C | A |
| Example 86 | Composition 86 | A | A | C | A |
| Example 87 | Composition 87 | A | A | C | A |
| Example 88 | Composition 88 | A | A | C | A |
| Example 89 | Composition 89 | A | A | C | A |

TABLE 11

| Name of example | Name of photosensitive composition | Spectral characteristics | Photolithography | Light resistance | Moisture resistance |
|---|---|---|---|---|---|
| Example 90 | Composition 90 | A | A | C | A |
| Example 91 | Composition 91 | A | A | C | A |
| Example 92 | Composition 92 | A | A | C | A |
| Example 93 | Composition 93 | A | A | A | C |
| Example 94 | Composition 94 | A | A | A | C |
| Example 95 | Composition 95 | A | A | A | C |
| Example 96 | Composition 96 | A | A | A | C |
| Example 97 | Composition 97 | A | A | C | A |
| Example 98 | Composition 98 | A | A | C | A |
| Example 99 | Composition 99 | A | A | C | A |
| Example 100 | Composition 100 | A | A | C | A |
| Example 101 | Composition 101 | A | A | C | A |
| Example 102 | Composition 102 | A | A | C | A |
| Example 103 | Composition 103 | A | A | A | C |
| Example 104 | Composition 104 | A | A | A | C |
| Example 105 | Composition 105 | A | A | A | C |
| Example 106 | Composition 106 | A | A | C | A |
| Example 107 | Composition 107 | A | A | C | A |
| Example 108 | Composition 108 | A | A | C | A |
| Example 109 | Composition 109 | A | A | C | A |
| Example 110 | Composition 110 | A | A | A | C |
| Example 111 | Composition 111 | A | A | A | C |
| Example 112 | Composition 112 | A | A | C | A |
| Example 113 | Composition 113 | A | A | C | A |
| Example 114 | Composition 114 | A | A | C | A |
| Example 115 | Composition 115 | A | A | C | A |
| Example 116 | Composition 116 | A | A | C | A |
| Example 117 | Composition 117 | A | A | C | A |
| Example 118 | Composition 118 | A | A | C | A |
| Example 119 | Composition 119 | A | A | C | A |
| Example 120 | Composition 120 | A | A | A | C |
| Example 121 | Composition 121 | A | A | A | C |
| Example 122 | Composition 122 | A | A | A | C |

TABLE 11-continued

| Name of example | Name of photosensitive composition | Spectral characteristics | Photolithography | Light resistance | Moisture resistance |
|---|---|---|---|---|---|
| Example 123 | Composition 123 | A | A | A | C |
| Example 124 | Composition 124 | A | A | C | A |
| Example 125 | Composition 125 | A | A | C | A |
| Example 126 | Composition 126 | A | A | C | A |
| Example 127 | Composition 127 | A | A | C | A |
| Example 128 | Composition 128 | A | A | C | A |
| Example 129 | Composition 129 | A | A | C | A |
| Example 130 | Composition 130 | A | A | A | C |
| Example 131 | Composition 131 | A | A | A | C |
| Example 132 | Composition 132 | A | A | A | C |
| Example 133 | Composition 133 | A | B | C | A |
| Example 134 | Composition 134 | A | B | C | A |
| Example 135 | Composition 135 | A | B | C | A |
| Example 136 | Composition 136 | A | B | C | A |
| Example 137 | Composition 137 | B | B | B | C |
| Example 138 | Composition 138 | B | B | B | C |

TABLE 12

| Name of example | Name of photosensitive composition | Spectral characteristics | Photolithography | Light resistance | Moisture resistance | Spectral fluctuation during exposure |
|---|---|---|---|---|---|---|
| Example 139 | Composition 139 | C | A | D | D | D |
| Example 140 | Composition 140 | D | A | D | D | D |
| Example 141 | Composition 141 | C | A | D | D | D |
| Example 142 | Composition 142 | D | A | D | D | D |
| Example 143 | Composition 143 | C | A | D | D | D |
| Example 144 | Composition 144 | D | A | D | D | D |
| Example 145 | Composition 145 | C | A | D | D | D |
| Example 146 | Composition 146 | C | A | D | D | D |
| Example 147 | Composition 147 | C | A | D | D | D |
| Example 148 | Composition 148 | C | A | D | D | D |
| Example 149 | Composition 149 | C | A | D | D | D |
| Example 150 | Composition 150 | C | A | D | D | D |
| Example 151 | Composition 151 | C | A | D | D | D |
| Example 152 | Composition 152 | C | A | C | B | A |
| Example 153 | Composition 153 | B | A | C | B | A |
| Example 154 | Composition 154 | C | A | C | B | A |
| Example 155 | Composition 155 | B | A | C | B | A |
| Example 156 | Composition 156 | D | A | C | B | A |
| Example 157 | Composition 157 | C | A | C | B | A |
| Example 158 | Composition 158 | D | A | C | B | A |
| Example 159 | Composition 159 | C | A | C | B | A |
| Example 160 | Composition 160 | B | A | D | D | D |
| Example 161 | Composition 161 | B | A | D | D | D |
| Example 162 | Composition 162 | B | A | D | D | D |
| Example 163 | Composition 163 | B | A | D | D | D |

As shown in the above tables, the photosensitive compositions of the example had good photolithography.

In addition, in Examples 9 to 18, 31 to 35, 37 to 45, 49 to 56, 61 to 70, 76 to 81, 85 to 92, 97 to 102, 106 to 109, 112 to 119, 124 to 129, 133 to 136, and 152 to 159 in which the compounds A-b-1 to A-b-11, and A-c-1 to A-c-9 having a group represented by Formula (1) described above were used as the oxocarbon compound A, it was possible to form a cured film having excellent moisture resistance.

In addition, in Examples 26 to 30, 32, 33, 36, 38, 39, 46 to 48, 57 to 60, 71 to 75, 82 to 84, 93 to 96, 103 to 105, 110, 111, 120 to 123, 130 to 132, 137, and 138 in which the compounds A-e-1 to A-e-6 having a group represented by Formula (10) described above were used as the oxocarbon compound A, it was possible to form a cured film having excellent light resistance.

In addition, in the examples in which the compounds A-b-1 to A-b-11, A-c-1 to A-c-9, and A-e-1 to A-e-6 having a group represented by Formula (1) or Formula (10) described above were used as the oxocarbon compound A, the spectral fluctuation during exposure was small.

<Evaluation of Storage Stability of Dispersion Liquid>

Examples 201 to 224

The viscosity of the dispersion liquid immediately after preparation was measured. The dispersion liquid of which the viscosity had been measured was stored in a constant-temperature tank at 45° C. for 72 hours, and then the viscosity thereof was measured. The viscosity was measured by adjusting the temperature of the dispersion liquid to 23° C. The thickening rate was obtained based on the following expression to evaluate storage stability.

Thickening rate (%)=((viscosity of dispersion liquid stored in constant-temperature tank at 45° C. for 72 hours/viscosity of dispersion liquid immediately after preparation)−1)×100

A: thickening rate of the dispersion liquid was 5% or less.

B: thickening rate of the dispersion liquid was more than 5% and 7% or less.

C: thickening rate of the dispersion liquid was more than 7% and 10% or less.

D: thickening rate of the dispersion liquid was more than 10% and 15% or less.

E: thickening rate of the dispersion liquid was more than 15%.

TABLE 13

| Name of example | Name of dispersion liquid | Evaluation result Storage stability |
|---|---|---|
| Example 201 | Dispersion liquid 14 | C |
| Example 202 | Dispersion liquid 17 | C |
| Example 203 | Dispersion liquid 30 | C |
| Example 204 | Dispersion liquid 34 | B |
| Example 205 | Dispersion liquid 35 | A |
| Example 206 | Dispersion liquid 36 | A |
| Example 207 | Dispersion liquid 37 | B |
| Example 208 | Dispersion liquid 38 | A |
| Example 209 | Dispersion liquid 39 | A |
| Example 210 | Dispersion liquid 40 | B |
| Example 211 | Dispersion liquid 41 | A |
| Example 212 | Dispersion liquid 42 | A |
| Example 213 | Dispersion liquid 43 | C |
| Example 214 | Dispersion liquid 44 | A |
| Example 215 | Dispersion liquid 45 | D |
| Example 216 | Dispersion liquid 46 | E |
| Example 217 | Dispersion liquid 47 | C |
| Example 218 | Dispersion liquid 48 | A |
| Example 219 | Dispersion liquid 49 | D |
| Example 220 | Dispersion liquid 50 | E |
| Example 221 | Dispersion liquid 51 | C |
| Example 222 | Dispersion liquid 52 | A |
| Example 223 | Dispersion liquid 53 | D |
| Example 224 | Dispersion liquid 54 | E |

As shown in the above table, in the dispersion liquids 14, 17, 30, 34 to 44, 47, 48, 51, 52 (Examples 201 to 214, 217, 218, 221, and 222) in which E-2 to E-4 which are acidic dispersants having an acid value of 80 mgKOH/g or more, or E-1 which is an polyimine-based dispersant was used, the storage stability was excellent. In addition, in the dispersion liquids 35, 36, 38, 39, 41, 42, 44, 48, and 52 (Examples 205, 206, 208, 209, 211, 212, 214, 218, and 222) in which F-2 to F-7 which are pigment derivatives having a partial structure of the compound A, the storage stability was particularly excellent.

<Evaluation of Solvent Resistance>

Examples 301 to 330

A solvent resistance test was performed by immersing the cured film as produced above in cyclohexanone for 1 hour. Regarding each of the films before and after the solvent resistance test, using a spectrophotometer (U-4100, manufactured by Hitachi High-Tech Corporation.), the maximum absorbance (Absλmax) in a wavelength of 650 to 1100 nm was measured, and the rate (%) of change in absorbance, represented by |{(absorbance of film before solvent resistance test−absorbance of film after solvent resistance test)/absorbance of film before solvent resistance test}×100|, was evaluated according to the following criteria.

A: rate of change in absorbance ≤2%

B: 2%<rate of change in absorbance ≤4%

C: 4%<rate of change in absorbance ≤7%

D: 7%<rate of change in absorbance ≤10%

E: 10%<rate of change in absorbance

TABLE 14

| Name of example | Name of photosensitive composition | Evaluation result Solvent resistance |
|---|---|---|
| Example 301 | Composition 14 | C |
| Example 302 | Composition 17 | C |
| Example 303 | Composition 30 | C |
| Example 304 | Composition 49 | B |
| Example 305 | Composition 50 | B |
| Example 306 | Composition 51 | C |
| Example 307 | Composition 52 | C |
| Example 308 | Composition 53 | B |
| Example 309 | Composition 54 | B |
| Example 310 | Composition 55 | C |
| Example 311 | Composition 56 | C |
| Example 312 | Composition 57 | B |
| Example 313 | Composition 58 | B |
| Example 314 | Composition 59 | C |
| Example 315 | Composition 60 | C |
| Example 316 | Composition 61 | C |
| Example 317 | Composition 62 | D |
| Example 318 | Composition 63 | D |
| Example 319 | Composition 64 | D |
| Example 320 | Composition 65 | C |
| Example 321 | Composition 66 | C |
| Example 322 | Composition 67 | D |
| Example 323 | Composition 68 | D |
| Example 324 | Composition 69 | D |
| Example 325 | Composition 70 | C |
| Example 326 | Composition 71 | C |
| Example 327 | Composition 72 | D |
| Example 328 | Composition 73 | D |
| Example 329 | Composition 74 | D |
| Example 330 | Composition 75 | C |

As shown in the above table, in Examples 301 to 316, 320, 321, 325, 326, and 330 in which G-1 and G-2 which are alkali-soluble resins including a repeating unit having an ethylenically unsaturated bonding group in the side chain were used, it was possible to form a cured film having excellent solvent resistance. In addition, in Examples 304, 305, 308, 309, 312, and 313 in which E-3 and E-4 which are dispersants including a repeating unit having an ethylenically unsaturated bonding group in the side chain were used, it was possible to form a cured film having particularly excellent solvent resistance.

EXPLANATION OF REFERENCES

110: solid-state imaging element

111: near-infrared cut filter

112: color filter

114: near-infrared transmitting filter

115: microlens

116: planarizing layer

What is claimed is:

1. A near-infrared absorbing photosensitive composition comprising:
a compound represented by Formula (SQ2);
a polymerizable compound;
a photopolymerization initiator; and
a solvent,

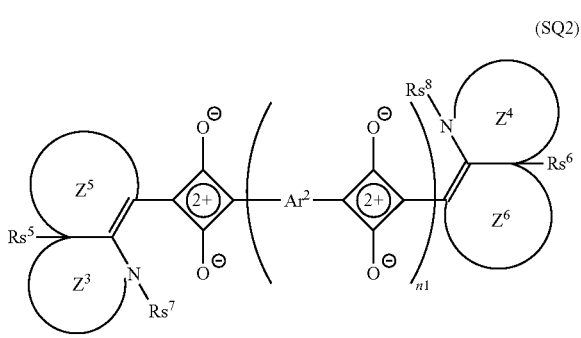

(SQ2)

in Formula (SQ2), a ring $Z^3$ and a ring $Z^4$ each independently represent a polycyclic aromatic ring having a 5-membered or 6-membered nitrogen-containing heterocyclic ring, which may have one or a plurality of substituents, a ring $Z^5$ and a ring $Z^6$ each independently represent a 4-membered to 9-membered hydrocarbon ring or heterocyclic ring, which may have one or a plurality of substituents, in a case where the ring $Z^3$ to the ring $Z^6$ have a plurality of substituents, the plurality of substituents may be the same or different from each other, $Rs^5$ to $Rs^8$ each independently represent a hydrogen atom or a substituent, $Ar^1$ represents a group represented by any one of Formulae (Ar-1) to (Ar-4), and n1 represents an integer of 1 or 2,

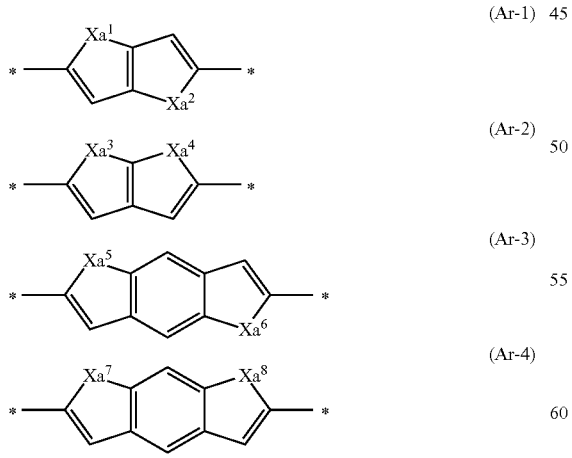

(Ar-1)

(Ar-2)

(Ar-3)

(Ar-4)

in the formulae, $Xa^1$ to $Xa^8$ each independently represent a sulfur atom, an oxygen atom, or $NRx^a$, in which $Rx^a$ represents a hydrogen atom or a substituent, and * represents a bonding hand.

2. The near-infrared absorbing photosensitive composition according to claim 1, further comprising:
a resin.

3. The near-infrared absorbing photosensitive composition according to claim 2,
wherein the resin includes a resin having an acid group.

4. The near-infrared absorbing photosensitive composition according to claim 3,
wherein the near-infrared absorbing photosensitive composition includes 10 to 1000 parts by mass of the resin having an acid group with respect to 100 parts by mass of the polymerizable compound.

5. The near-infrared absorbing photosensitive composition according to claim 1, further comprising:
a pigment derivative.

6. A cured film obtained from the near-infrared absorbing photosensitive composition according to claim 1.

7. An optical filter comprising:
the cured film according to claim 6.

8. The optical filter according to claim 7,
wherein the optical filter is a near-infrared cut filter or a near-infrared transmitting filter.

9. A method for forming a pattern, comprising:
forming a composition layer on a support using the near-infrared absorbing photosensitive composition according to claim 1;
patternwise exposing the composition layer; and
removing an unexposed area of the composition layer by development.

10. A laminate comprising:
the cured film according to claim 6; and
a color filter including a chromatic colorant.

11. A solid-state imaging element comprising:
the cured film according to claim 6.

12. An image display device comprising:
the cured film according to claim 6.

13. An infrared sensor comprising:
the cured film according to claim 6.

14. A near-infrared absorbing photosensitive composition comprising:
a compound represented by Formula (SQ3);
a polymerizable compound;
a photopolymerization initiator; and
a solvent,

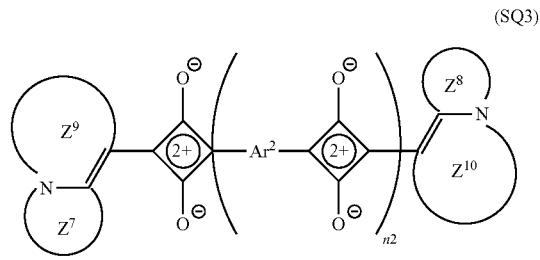

(SQ3)

in Formula (SQ3), a ring $Z^7$ and a ring $Z^8$ each independently represent a polycyclic aromatic ring having a 5-membered or 6-membered nitrogen-containing heterocyclic ring, which may have one or a plurality of substituents, a ring $Z^9$ and a ring $Z^{10}$ each independently represent a 4-membered to 9-membered nitrogen-containing heterocyclic ring, which may have one or a plurality of substituents, in a case where the ring $Z^7$ to the ring $Z^{10}$ have a plurality of substituents, the plurality of substituents may be the same or different from each other, Ar² represents a group represented by any one of Formulae (Ar-1) to (Ar-4), and
n2 represents an integer of 0 to 2,
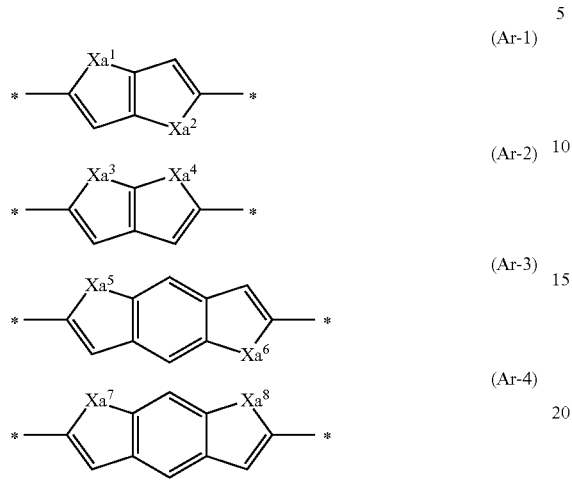
in the formulae, $Xa^1$ to $Xa^8$ each independently represent a sulfur atom, an oxygen atom, or $NRX^a$, in which $Rx^a$ represents a hydrogen atom or a substituent, and * represents a bonding hand.
* * * * *